(12) United States Patent
Kaneda et al.

(10) Patent No.: US 11,793,009 B2
(45) Date of Patent: *Oct. 17, 2023

(54) IMAGING DEVICE AND SOLID-STATE IMAGE SENSOR

(71) Applicant: SONY SEMICONDUCTOR SOLUTIONS CORPORATION, Kanagawa (JP)

(72) Inventors: Yukio Kaneda, Kanagawa (JP); Fumihiko Koga, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/979,904

(22) Filed: Nov. 3, 2022

(65) Prior Publication Data

US 2023/0068319 A1 Mar. 2, 2023

Related U.S. Application Data

(63) Continuation of application No. 17/252,774, filed as application No. PCT/JP2019/022702 on Jun. 7, 2019, now Pat. No. 11,563,058.

(30) Foreign Application Priority Data

Jul. 3, 2018 (JP) .................................. 2018-126650

(51) Int. Cl.
*H10K 39/32* (2023.01)
*H04N 23/84* (2023.01)
(Continued)

(52) U.S. Cl.
CPC ............. *H10K 39/32* (2023.02); *H04N 23/84* (2023.01); *H04N 25/00* (2023.01); *H04N 25/79* (2023.01);
(Continued)

(58) Field of Classification Search
CPC ........ H04N 23/84; H04N 25/00; H04N 25/40; H04N 25/79; H04N 25/70; H04N 25/76; H01L 27/14647
See application file for complete search history.

(56) References Cited

U.S. PATENT DOCUMENTS 11,563,058 B2* 1/2023 Kaneda .................. H04N 25/76
2012/0086095 A1 4/2012 Nishiyama et al.
(Continued)

FOREIGN PATENT DOCUMENTS

JP 2016-127264 7/2016
JP 2017-055085 3/2017
(Continued)

OTHER PUBLICATIONS

International Search Report and Written Opinion for International (PCT) Patent Application No. PCT/JP2019/022702, dated Aug. 13, 2019, 9 pages.
(Continued)

*Primary Examiner* — Kelly L Jerabek
(74) *Attorney, Agent, or Firm* — SHERIDAN ROSS P.C.

(57) ABSTRACT

An imaging device includes a first electrode, a charge accumulating electrode arranged with a space from the first electrode, an isolation electrode arranged with a space from the first electrode and the charge accumulating electrode and surrounding the charge accumulating electrode, a photoelectric conversion layer formed in contact with the first electrode and above the charge accumulating electrode with an insulating layer interposed therebetween, and a second electrode formed on the photoelectric conversion layer. The isolation electrode includes a first isolation electrode and a second isolation electrode arranged with a space from the first isolation electrode, and the first isolation electrode is positioned between the first electrode and the second isolation electrode.

18 Claims, 61 Drawing Sheets

(51) Int. Cl.
*H04N 25/00* (2023.01)
*H04N 25/79* (2023.01)
*H10K 30/81* (2023.01)
*H01L 27/146* (2006.01)
*H10K 19/00* (2023.01)

(52) U.S. Cl.
CPC ........ *H10K 30/81* (2023.02); *H01L 27/14647* (2013.01); *H10K 19/201* (2023.02)

(56) References Cited

U.S. PATENT DOCUMENTS

| | | |
|---|---|---|
| 2015/0097219 A1 | 4/2015 | Kato et al. |
| 2016/0014364 A1 | 1/2016 | Tashiro et al. |
| 2016/0037098 A1 | 2/2016 | Lee et al. |
| 2017/0162617 A1 | 6/2017 | Takahashi et al. |
| 2018/0076252 A1 | 3/2018 | Togashi et al. |
| 2018/0342558 A1 | 11/2018 | Hirata et al. |
| 2019/0312071 A1 | 10/2019 | Yamasaki et al. |
| 2021/0257415 A1 | 8/2021 | Kaneda et al. |

FOREIGN PATENT DOCUMENTS

| | | |
|---|---|---|
| JP | 2017-108101 | 6/2017 |
| JP | 2017-157816 | 9/2017 |
| JP | 2018-085402 | 5/2018 |
| TW | 201801297 A | 1/2018 |
| TW | 201834227 A | 9/2018 |
| WO | WO 2010/116974 | 10/2010 |

OTHER PUBLICATIONS

Notice of Allowance for U.S. Appl. No. 17/252,774, dated Aug. 4, 2022, 10 pages.

\* cited by examiner

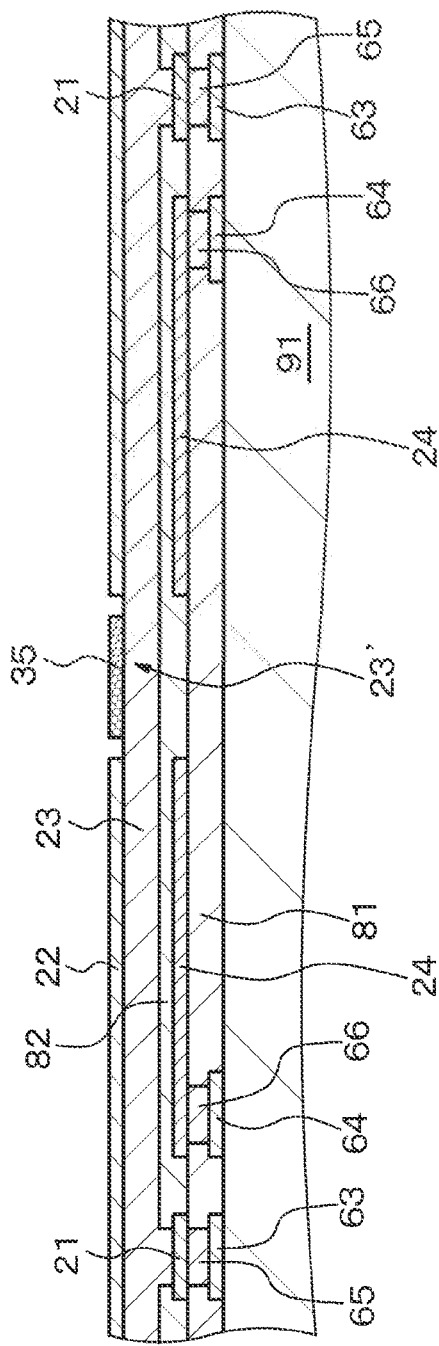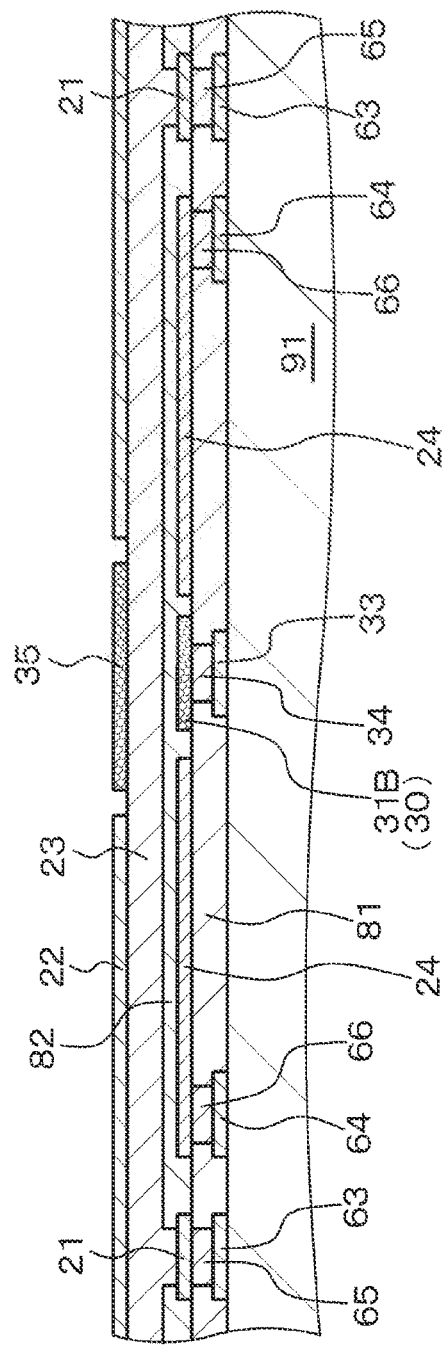
FIG. 16A
FIG. 16B

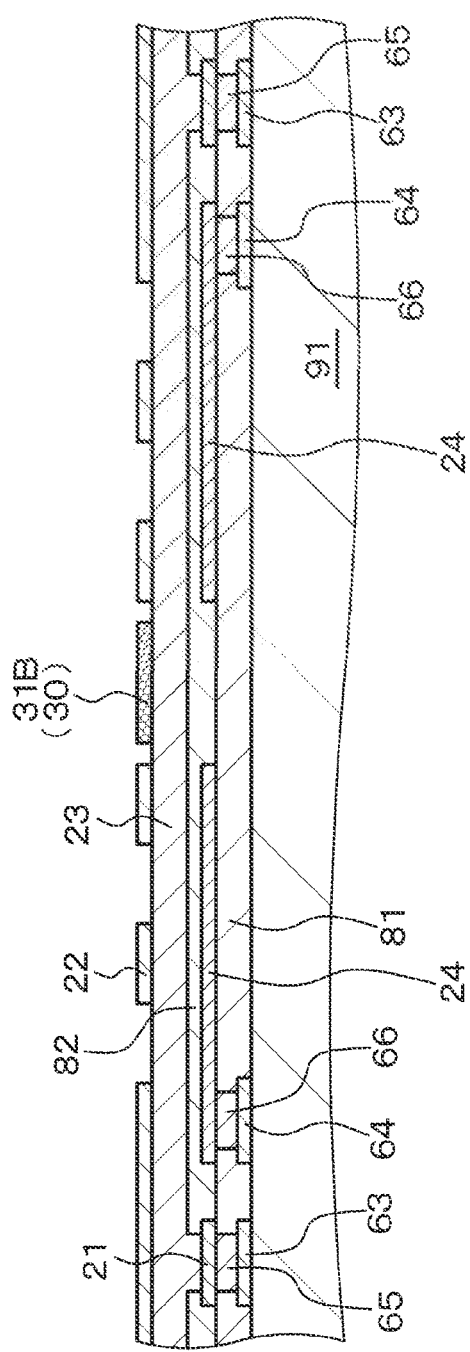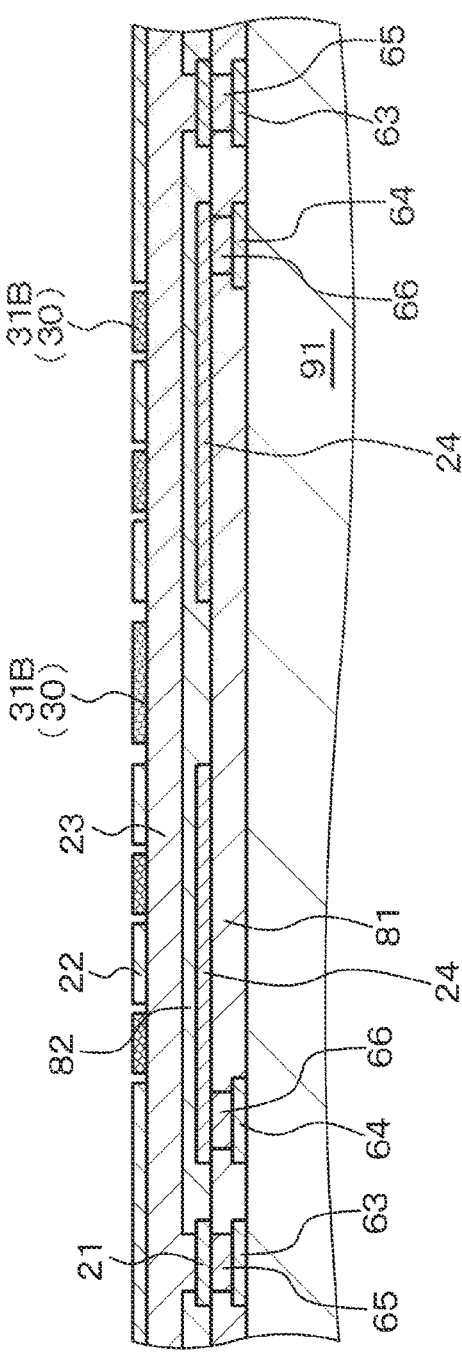

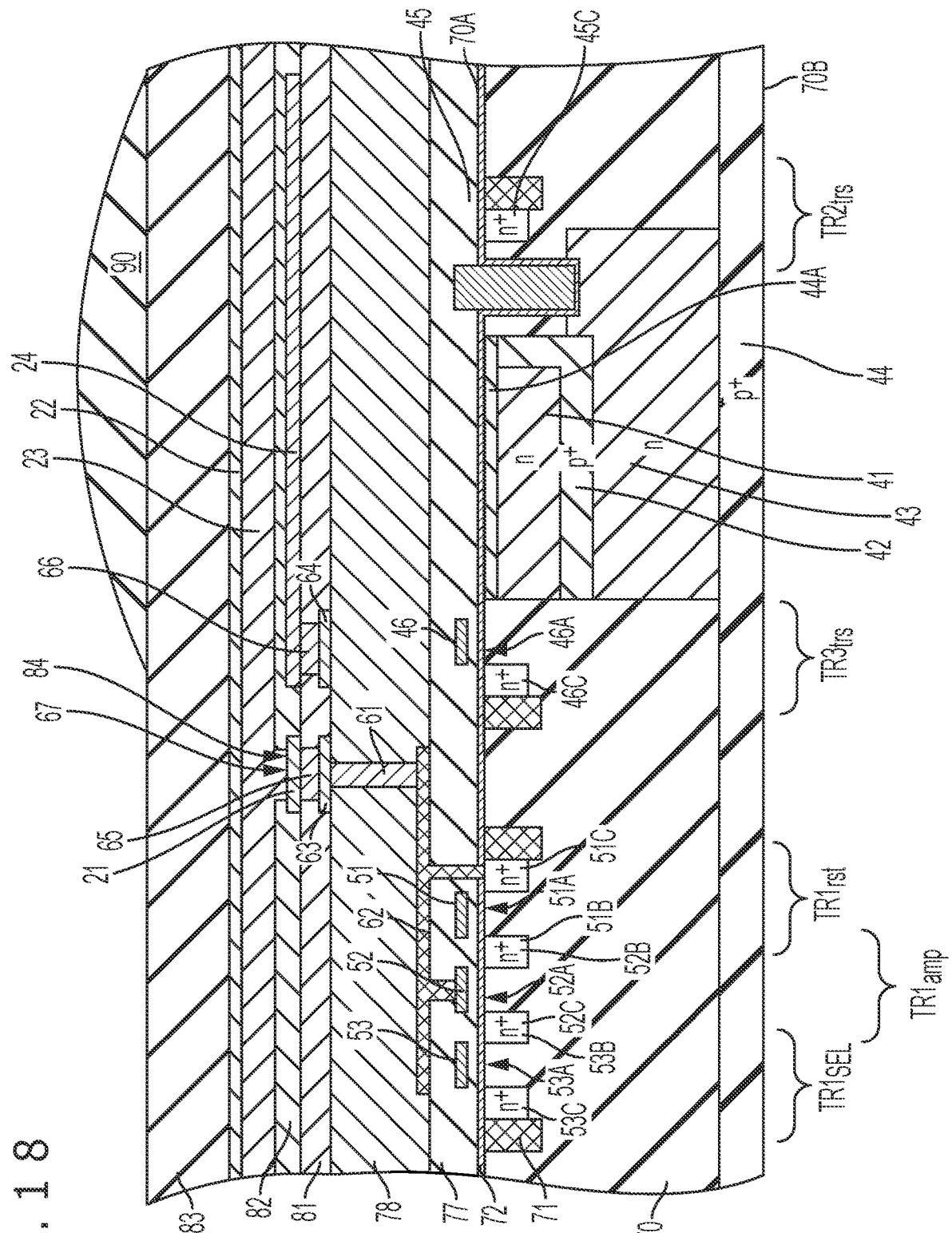

CHARGE ACCUMULATING ELECTRODE SIDE

IMAGING DEVICE AND SOLID-STATE IMAGE SENSOR

CROSS REFERENCE TO RELATED APPLICATIONS

This application is a continuation of U.S. patent application Ser. No. 17/252,774, filed Dec. 16, 2020, which is a national stage application under 35 U.S.C. 371 and claims the benefit of PCT Application No. PCT/JP2019/022702, having an international filing date of Jun. 7, 2019, which designated the United States, which PCT application claimed the benefit of Japanese Patent Application No. 2018-126650, filed Jul. 3, 2018, the entire disclosures of each of which are incorporated herein by reference.

TECHNICAL FIELD

The present disclosure relates to an imaging device and a solid-state image sensor that includes the imaging device.

BACKGROUND ART

An imaging device in which an organic semiconductor material is used for a photoelectric conversion layer can perform photoelectric conversion of a specific color (wavelength band). Further, since the imaging device has such a characteristic as just described, in the case where it is used as an imaging device in a solid-state image sensor, it is possible to obtain a structure (stacked type imaging device) in which a sub pixel includes a combination of an on-chip color filter (OCCF) and an imaging device and such sub pixels are stacked, which cannot be implemented by a conventional solid-state image sensor in which sub pixels are arrayed two-dimensionally (for example, refer to Japanese Patent Laid-open No. 2017-157816). Further, since a demosaic process is not required, there is an advantage that a false color does not appear. It is to be noted that, in the following description, an imaging device that includes a photoelectric conversion portion provided on or above a semiconductor substrate is sometimes referred to as a "first type imaging device" for the convenience of description, and the photoelectric conversion portion configuring the first type imaging device is sometimes referred to as a "first type photoelectric conversion portion" for the convenience of description. Further, an imaging device provided in a semiconductor substrate is sometimes referred to as a "second type imaging device" for the convenience of description, and a photoelectric conversion portion configuring the second type imaging device is sometimes referred to as a "second type photoelectric conversion portion" for the convenience of description.

An example of a structure of a stacked type imaging device (stacked type solid-state image sensor) disclosed in Japanese Patent Laid-open No. 2017-157816 is depicted in FIG. 57. In the example depicted in FIG. 57, a third photoelectric conversion portion 43 and a second photoelectric conversion portion 41 that are second type photoelectric conversion portions configuring a third imaging device 15 and a second imaging device 13 that are second type imaging devices are formed in a stacked state in a semiconductor substrate 70. Further, a first photoelectric conversion portion 11' that is a first type photoelectric conversion portion is arranged above the semiconductor substrate 70 (particularly, above the second imaging device 13). Here, the first photoelectric conversion portion 11' includes a first electrode 21, a photoelectric conversion layer 23 configured from an organic material, and a second electrode 22 and configures a first imaging device 11 that is a first type imaging device. Further, a charge accumulating electrode 24 is provided with a space from the first electrode 21, and a photoelectric conversion layer 23 is positioned above the charge accumulating electrode 24 with an insulating layer 82 interposed therebetween. In the second photoelectric conversion portion 41 and the third photoelectric conversion portion 43, for example, blue light and red light are each photoelectrically converted depending upon the difference in absorption coefficient. Further, in the first photoelectric conversion portion 11', for example, green light is photoelectrically converted.

Charge generated by photoelectric conversion by the second photoelectric conversion portion 41 and the third photoelectric conversion portion 43 is once accumulated into the second photoelectric conversion portion 41 and the third photoelectric conversion portion 43 and is then transferred to a second floating diffusion layer (Floating Diffusion) $FD_2$ and a third floating diffusion layer $FD_3$ by a vertical transistor (whose gate portion 45 is depicted) and a transfer transistor (whose gate portion 46 is depicted), whereafter it is outputted to an external reading out circuit (not depicted). Also the transistors and the floating diffusion layers $FD_2$ and $FD_3$ are formed on the semiconductor substrate 70.

Upon charge accumulation, charge generated by photoelectric conversion in the first photoelectric conversion portion 11' is attracted by the charge accumulating electrode 24 and is accumulated into the photoelectric conversion layer 23. Upon charge transfer, the charge accumulated in the photoelectric conversion layer 23 is accumulated into a first floating diffusion layer $FD_1$ formed on the semiconductor substrate 70, through the first electrode 21, a contact hole portion 61, and a wiring layer 62. Further, the first photoelectric conversion portion 11' is connected also to a gate portion 52 of an amplification transistor for converting a charge amount into a voltage, through the contact hole portion 61 and the wiring layer 62. In addition, the first floating diffusion layer $FD_1$ configures part of a reset transistor (whose gate portion 51 is depicted). It is to be noted that reference numerals 63, 64, 65, 66, 71, 72, 76, 81, 83, 90 and so forth are described in connection with a working example 1.

CITATION LIST

Patent Literature

[PTL 1]
Japanese Patent Laid-open No. 2017-157816

SUMMARY

Technical Problem

Incidentally, it cannot be considered that there is no such possibility that, in such a first imaging device 11 as described above, charge accumulated in the photoelectric conversion layer 23 moves, during operation of the first imaging device 11, to an adjacent first imaging device 11. Further, it cannot be considered that there is no such possibility that charge accumulated in the photoelectric conversion layer 23 is not transferred smoothly to the first electrode 21. Then, if such a phenomenon as just described occurs, then, this gives rise to characteristic degradation of the solid-state image sensor.

Accordingly, it is an object of the present disclosure to provide an imaging device configured and structured such that, during operation of the imaging device, movement of charge between imaging devices adjacent to each other can be reduced with certainty and charge accumulated in a photoelectric conversion layer is transferred smoothly to a first electrode and a solid-state image sensor that includes such an imaging device as just described.

Solution to Problem

In order to attain the object described above, an imaging device of the present disclosure includes
  a first electrode,
  a charge accumulating electrode arranged with a space from the first electrode,
  an isolation electrode arranged with a space from the first electrode and the charge accumulating electrode and surrounding the charge accumulating electrode,
  a photoelectric conversion layer formed in contact with the first electrode and above the charge accumulating electrode with an insulating layer interposed therebetween, and
  a second electrode formed on the photoelectric conversion layer, in which
  the isolation electrode includes a first isolation electrode and a second isolation electrode arranged with a space from the first isolation electrode, and
  the first isolation electrode is positioned between the first electrode and the second isolation electrode.

A solid-state image sensor according to a first form of the present disclosure for achieving the object described above, includes
  a plurality of imaging device blocks each including P×Q (where P≥2 and Q≥1) imaging devices such that P imaging devices are arranged in a first direction and Q imaging device is arranged in a second direction different from the first direction, in which
  each imaging device includes
    a first electrode,
    a charge accumulating electrode arranged with a space from the first electrode,
    an isolation electrode arranged with a space from the first electrode and the charge accumulating electrode and surrounding the charge accumulating electrode,
    a photoelectric conversion layer formed in contact with the first electrode and above the charge accumulating electrode with an insulating layer interposed therebetween, and
    a second electrode formed on the photoelectric conversion layer,
  the isolation electrode includes a first isolation electrode, a second isolation electrode, and a third isolation electrode,
  the first isolation electrode is arranged adjacent to but with a space from the first electrode between imaging devices placed side by side at least along the second direction in the imaging device block,
  the second isolation electrode is arranged between imaging devices in the imaging device block, and
  the third isolation electrode is arranged between imaging device blocks.

A solid-state image sensor according to a second form of the present disclosure for achieving the object described above includes a stacked type imaging device that includes at least one imaging device of the present disclosure.

BRIEF DESCRIPTION OF DRAWINGS

FIGS. 16A and 16B are schematic partial sectional views of an imaging device (two juxtaposed imaging devices) of a working example 3 and a modification of the working example 3.

FIGS. 17A and 17B are schematic partial sectional views of a different modification of the imaging device (two juxtaposed imaging devices) of the working example 3.

FIG. 18 is a schematic partial sectional view of an imaging device and a stacked type imaging device of a working example 4.

DESCRIPTION OF EMBODIMENTS

Figure 1:
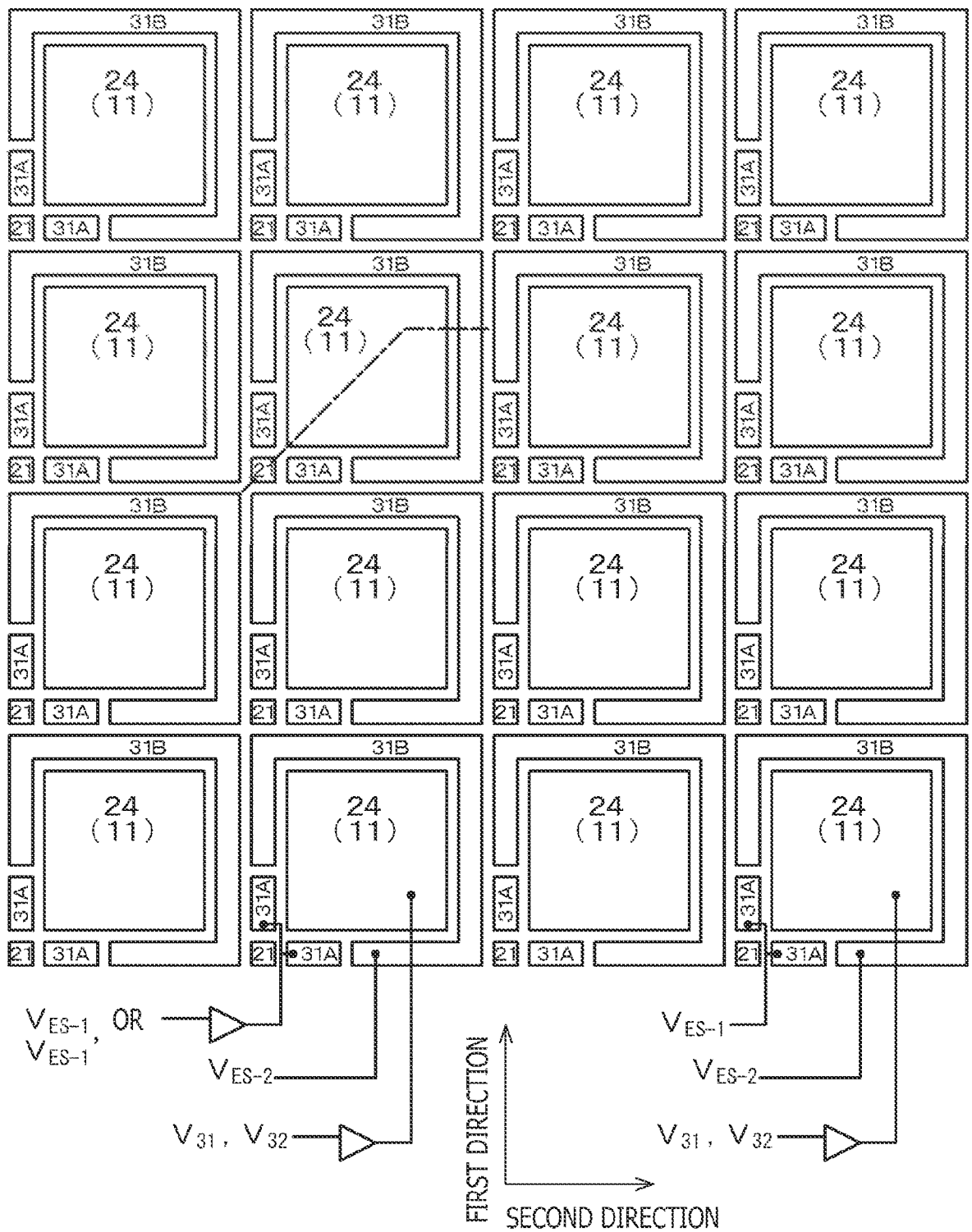
FIG. 1 is a view schematically depicting an arrangement state of a charge accumulating electrode, a first isolation electrode, a second isolation electrode, and a first electrode in a solid-state image sensor of a working example 1.

In the following, while the present disclosure is described on the basis of working examples with reference to the drawings, the present disclosure is not limited to the working examples, and various numerical values and materials in the working examples are exemplary. It is to be noted that the description is given in the following order.
1. Description Relating to Whole of Imaging Device of Present Disclosure and Solid-State Image Sensor according to First Form and Second Form of Present Disclosure
2. Working Example 1 (Imaging Device of Present Disclosure and Solid-State Image Sensor According to Second Form of Present Disclosure)
3. Working Example 2 (Solid-State Image Sensor According to First Form of Present Disclosure)
4. Working Example 3 (Modification of Working Example 1 and Working Example 2)
5. Working Example 4 (Modification of Working Example 1 to Working Example 3)
6. Working Example 5 (Modification of Working Example 1 to Working Example 4)
7. Working Example 6 (Modification of Working Example 1 to Working Example 5, Imaging Device including Transfer Controlling Electrode)
8. Working Example 7 (Modification of Working Example 1 to Working Example 6, Imaging Device of Present Disclosure Including Plurality of Charge Accumulating Electrode Segments)
9. Working Example 8 (Modification of Working Example 1 to Working Example 6, Imaging Device of First Configuration and Sixth Configuration)
10. Working Example 9 (Imaging Device of Second Configuration and Sixth Configuration of Present Disclosure)
11. Working Example 10 (Imaging Device of Third Configuration)
12. Working Example 11 (Imaging Device of Fourth Configuration)
13. Working Example 12 (Imaging Device of Fifth Configuration)
14. Working Example 13 (Imaging Device of Sixth Configuration)
15. Others <Description Relating to Whole of Imaging Device of Present Disclosure and Solid-State Image Sensor According to First Form and Second Form of Present Disclosure>

The solid-state image sensor according to the second form of the present disclosure can be formed such that at least one lower imaging device is provided below an imaging device and that the wavelength of light received by the imaging device and the wavelength of light received by the lower imaging device are made different from each other. Further, in this case, the solid-state image sensor can be formed such that two lower imaging devices are stacked.

The imaging device of the present disclosure or the imaging device of the present disclosure that is included in the solid-state image sensor according to the second form of the present disclosure including a preferred form described above can be formed such that the first isolation electrode has potential of a fixed value $V_{ES\text{-}1}$ and the second isolation electrode also has potential of another fixed value $V_{ES\text{-}2}$, or can be formed such that the first isolation electrode has potential that changes from a fixed value $V_{ES\text{-}1}$ (in particular, changes to a value $V_{ES\text{-}1}'$) and the second isolation electrode has potential of a fixed value $V_{ES\text{-}2}$. In those forms, the imaging device can be formed such that, where charge to be accumulated is electrons, $V_{ES\text{-}1} > V_{ES\text{-}2}$ is satisfied, but where positive holes to be accumulated are electrons, $V_{ES\text{-}1} < V_{ES\text{-}2}$ is satisfied, or can be formed such that $V_{ES\text{-}2} = V_{ES\text{-}1}$ is satisfied.

The solid-state image sensor according to the first form of the present disclosure can be formed such that the third isolation electrode is shared by imaging device blocks adjacent to each other.

Further, the solid-state image sensor according to the first form of the present disclosure including the preferred form described above can be configured such that
  the first isolation electrode is arranged adjacent to but with a space from the first electrode between imaging devices placed side by side along the second direction in the imaging device block, and
  the second isolation electrode is arranged between imaging devices placed side by side along the first direction and is arranged with a space from the first isolation electrode between imaging devices placed side by side along the second direction. Further, in this case, the solid-state image sensor can be configured such that the second isolation electrode and the third isolation electrode are connected to each other.

Alternatively, the solid-state image sensor according to the first form of the present disclosure including the preferred forms described above can be configured such that
  the first isolation electrode is arranged adjacent to but with a space from the first electrode between imaging devices placed side by side along the second direction in the imaging device block and is further arranged adjacent to but with a space from the first electrode between imaging devices placed side by side along the first direction, and
  the second isolation electrode is arranged with a space from the first isolation electrode between imaging devices placed side by side along the second direction and is further arranged with a space from the first isolation electrode between imaging devices placed side by side along the first direction. Further, in this instance, the solid-state image sensor can be configured such that the second isolation electrode and the third isolation electrode are connected to each other.

Further, the solid-state image sensor according to the first form of the present disclosure including the preferred forms and configurations described above can be configured such that the first isolation electrode has potential of a fixed value $V_{ES-1}$ and the second isolation electrode and the third isolation electrode also have potential of a fixed value $V_{ES-2}$, or can be configured such that the first isolation electrode has potential that changes from a fixed value $V_{ES-1}$ (in particular, changes to a value $V_{ES-1}'$) and the second isolation electrode and the third isolation electrode have potential of a fixed value $V_{ES-2}$ Further, in those forms, the solid-state image sensor can be formed such that, where charge to be accumulated is electrons, $V_{ES-1} > V_{ES-2}$ is satisfied, but where positive holes to be accumulated are electrons, $V_{ES-1} < V_{ES-2}$ is satisfied, or can be formed such that $V_{ES-2} = V_{ES-1}$ is satisfied.

Further, the solid-state image sensor according to the first form of the present disclosure including the preferred forms and configurations described above can be formed such that the first electrode is shared by P×Q imaging devices that configure an imaging device block. Further, the solid-state image sensor can be formed such that each of the imaging device blocks includes a control portion, the control portion includes at least a floating diffusion layer and an amplification transistor, and the shared first electrode is connected to the control portion.

In such a manner, in the solid-state image sensor according to the first form of the present disclosure, since the first electrode is shared by the P×Q imaging devices that configure one imaging device block, the configuration and structure in a pixel region in which a plurality of imaging devices are arrayed can be simplified and refined. Then, one floating diffusion layer is provided for one imaging device block including the P×Q imaging devices. Here, the P×Q imaging devices provided for the one floating diffusion layer may include a plurality of imaging devices of the first type hereinafter described or may include at least one imaging device of the first type and one or two or more imaging devices of a second type hereinafter described.

Further, though not restrictive, the solid-state image sensor according to the first form of the present disclosure including the preferred forms and configurations described above, P=2 and Q=2 are applicable.

Further, the solid-state image sensor according to the first form of the present disclosure including the preferred forms and configurations described above can be formed such that it includes a stacked type imaging device including at least one imaging device of the present disclosure. Further, the solid-state image sensor according to the first form of the present disclosure having such a form as just described can be formed such that a lower imaging device block of at least one layer is provided below a plurality of imaging device blocks, the lower imaging device block includes a plurality of imaging devices (particularly, P×Q imaging devices including P imaging device along a first direction and Q imaging devices along a second direction), and the wavelength of light to be received by the imaging device configuring the imaging device block and the wavelength of light to be received by the imaging device configuring the lower imaging device block are different from each other. Further, the solid-state image sensor according to the first form of the present disclosure including such a preferred form as just described can be formed such that the lower imaging device block is provided in two layers. Further, the solid-state image sensor according to the first form of the present disclosure including the preferred forms described above can be formed such that a plurality of (particularly, P×Q) imaging devices configuring the lower imaging device block include a shared floating diffusion layer.

The solid-state image sensor according to the first form of the present disclosure may adopt, in the case where the first electrode is shared by four imaging devices that configure the imaging device block, a reading out method by which charge accumulated in the four imaging devices is read out individually by a total of four times or may adopt another reading out method by which charge accumulated in the four imaging devices is read out simultaneously by a total of one time, under the control of the isolation electrodes. The former method is sometimes referred to as a "first mode reading out method" for the convenience of description, and the latter method is sometimes referred to as a "second mode reading out method" for the convenience of description. By the first mode reading out method, refinement of an image to be obtained by the solid-state image sensor can be achieved. By the second mode reading out method, signals obtained by the four imaging devices are added in order to achieve increase of the sensitivity. Switching between the first mode reading out method and the second mode reading out method can be achieved by providing suitable switching means in the solid-state image sensor. In the first mode reading out method, it is possible for P×Q imaging devices to be shared by one floating diffusion layer, by suitably controlling the timing of a charge transfer period, and P×Q imaging devices configuring the imaging device block are connected to one driving circuit. However, control of the charge accumulating electrode is performed for each imaging device.

The imaging device of the present disclosure or the imaging device of the present disclosure configuring the solid-state image sensors according to the first and second forms of the present disclosure including the preferred forms described above (hereinafter, such imaging devices are sometimes collectively referred to as an "imaging device or the like of the present disclosure") can be formed such that the first isolation electrode, the second isolation electrode, and the third isolation electrode are provided in a region opposed to a region of the photoelectric conversion layer with an insulating layer interposed therebetween. It is to be noted that the isolation electrodes are sometimes referred to as a "lower first isolation electrode," a "lower second isolation electrode," and a "lower third isolation electrode," respectively, for the convenience of description and they are sometimes collectively referred to as a "lower isolation electrode." Alternatively, the imaging device or the like of the present disclosure can be formed such that the first isolation electrode, the second isolation electrode, and the third isolation electrode are provided with a space from the second electrode on the photoelectric conversion layer. It is to be noted that the isolation electrodes are sometimes referred to as an "upper first isolation electrode," an "upper second isolation electrode," and an "upper third isolation electrode," respectively, for the convenience of description and they are sometimes collectively referred to as an "upper isolation electrode."

Although, in the imaging device or the like of the present disclosure, the isolation electrode is arranged with a space from the first electrode and the charge accumulating electrode and surrounds the charge accumulating electrode and the first isolation electrode is positioned between the first electrode and the second isolation electrode, in the case of the upper isolation electrode, an orthogonal projection image of the isolation electrode is positioned with a space from orthogonal projection images of the first electrode and the charge accumulating electrode and surrounds an orthogonal projection image of the charge accumulating electrode while an orthogonal projection image of the first isolation electrode is positioned between an orthogonal projection image of the first electrode and an orthogonal projection image of the second isolation electrode. In some cases, part of the orthogonal projection image of the second isolation electrode and part of the orthogonal projection image of the charge accumulating electrode may overlap with each other. Alternatively, the orthogonal projection image of the first isolation electrode is positioned adjacent to but with a space from the orthogonal projection image of the first electrode between imaging devices arranged at least along the second direction in the imaging device block, and the second isolation electrode is arranged between imaging devices in the imaging device block while the third isolation electrode is arranged between imaging device blocks.

Reference signs representing potential to be applied to the various electrodes in the following description are indicated in a table 1 below.

TABLE 1

| | Charge accumulation period | Charge transfer period |
|---|---|---|
| First electrode | $V_{11}$ | $V_{12}$ |
| Second electrode | $V_{21}$ | $V_{22}$ |
| Charge accumulation electrode | $V_{31}$ | $V_{32}$ |
| First isolation electrode | | |
| Case - 1 | $V_{ES-1}$ | $V_{ES-1}$ |
| Case - 2 | $V_{ES-1}$ | $V_{ES-1'}$ |
| Second isolation electrode | $V_{ES-2}$ | $V_{ES-2}$ |
| Third isolation electrode | $V_{ES-3}$ | $V_{ES-3}$ |
| Transfer controlling electrode | $V_{41}$ | $V_{42}$ |
| Charge discharging electrode | $V_{51}$ | $V_{52}$ |

The imaging device or the like of the present disclosure including the preferred forms and configurations described above can be formed such that it further includes a semiconductor substrate and the photoelectric conversion portion is arranged above the semiconductor substrate. It is to be noted that the first electrode, the charge accumulating electrode, the second electrode, the various isolation electrodes, and the various electrodes are connected to a driving circuit hereinafter described.

Further, the imaging device or the like of the present disclosure including the preferred forms and configurations described above can be formed such that the size of the charge accumulating electrode is greater than that of the first electrode. Where the area of the charge accumulating electrode is $s_1'$ and the area of the first electrode is $s_1$, though not restrictive, preferably $$4 \leq s_1'/s_1$$

is satisfied.

The second electrode positioned on the light incidence side may be made common to a plurality of imaging devices except for a case in which an upper isolation electrode is formed. In other words, the second electrodes can be formed as what is generally called a solid electrode. The photoelectric conversion layer can be made common to a plurality of imaging devices. In particular, the imaging device or the like of the present disclosure can be formed such that one photoelectric conversion layer is formed in a plurality of imaging devices.

Further, the imaging device or the like of the present disclosure including the various preferred forms and configurations described above can be formed such that the first electrode extends in an opening provided in an insulating layer and is connected to the photoelectric conversion layer.

Alternatively, the imaging device or the like of the present disclosure can be formed such that the photoelectric conversion layer extends in an opening provided in an insulating layer and is connected to the first electrode, and, in this case, the imaging device or the like of the present disclosure can be formed such that an edge portion of a top face of the first electrode is covered with the insulating layer,
the first electrode is exposed on a bottom face of the opening, and
where a face of the insulating layer contacting with the top face of the first electrode is a first face and another face of the insulating layer contacting with a portion of the photoelectric conversion layer opposed to the charge accumulating electrode is a second face, a side face of the opening has an inclination that expands from the first face toward the second face. Further, the imaging device or the like of the present disclosure can be formed such that the side face of the opening having the inclination expanding from the first face toward the second face is positioned on the charge accumulating electrode side. It is to be noted that this form includes a form in which some other layer is formed between the photoelectric conversion layer and the first electrode (for example, a form in which a material layer suitable for charge accumulation is formed between the photoelectric conversion layer and the first electrode).

Further, the imaging device or the like of the present disclosure including the preferred forms and configurations described above can be configured such that it further includes a control portion provided on a semiconductor substrate and including a driving circuit,
the first electrode and the charge accumulating electrode are connected to the driving circuit,
during a charge accumulation period, from the driving circuit, potential $V_{11}$ is applied to the first electrode, potential $V_{31}$ is applied to the charge accumulating electrode, and charge is accumulated into the photoelectric conversion layer,
during a charge transfer period, from the driving circuit, potential $V_{12}$ is applied to the first electrode, potential $V_{32}$ is applied to the charge accumulating electrode, and charge accumulated in the photoelectric conversion layer is read out into the control portion via the first electrode. However, in the case where the potential of the first electrode is higher than the potential of the second electrode, $$V_{31} \geq V_{11} \text{ and } V_{32} < V_{12}$$

are satisfied, but in the case where the potential of the first electrode is lower than the potential of the second electrode, $$V_{31} \leq V_{11} \text{ and } V_{32} > V_{12}$$

are satisfied.

Further, the imaging device or the like of the present disclosure including the preferred forms and configurations described above can be formed such that it further includes a transfer controlling electrode (charge transfer electrode) arranged with a space from the first electrode and the charge accumulating electrode between the first electrode and the charge accumulating electrode and arranged opposed to the photoelectric conversion layer with an insulating layer interposed therebetween. It is to be noted that such an imaging device or the like of the present disclosure of such a form as just described is sometimes referred to as an "imaging device or the like of the present disclosure including a transfer controlling electrode" for the convenience of description. Further, in the imaging device or the like of the present disclosure including the transfer controlling electrode, when the potential to be applied to the transfer controlling electrode during a charge accumulation period is $V_{41}$, in the case where the potential of the first electrode is higher than the potential of the second electrode, it is preferred that $V_{41} \leq V_{11}$ and $V_{41} < V_{31}$ be satisfied. Further, when the potential to be applied to the transfer controlling electrode during a charge transfer period is $V_{42}$, in the case where the potential of the first electrode is higher than the potential of the second electrode, it is preferred that $V_{32} \leq V_{42} \leq V_{12}$ be satisfied.

Further, the imaging device or the like of the present disclosure including the preferred forms and configurations described above can be formed such that it includes a charge discharging electrode connected to the photoelectric conversion layer and arranged with a space from the first electrode and the charge accumulating electrode. It is to be noted that the imaging device or the like of the present disclosure of such a form as just described is referred to as an "imaging device or the like of the present disclosure including the charge discharging electrode" for the convenience of description. Further, the imaging device or the like of the present disclosure including the charge discharging electrode can be formed such that the charge discharging electrode is arranged so as to surround the first electrode and the charge accumulating electrode (that is, in the form of a picture frame). The charge discharging electrode can be shared by (made common to) a plurality of imaging devices. In the case where the charge discharging electrode is provided, it is preferred that the various isolation electrodes include an upper isolation electrode. Then, in this case, the imaging device or the like can be formed such that the photoelectric conversion layer extends in a second opening provided in the insulating layer and is connected to the charge discharging electrode, an edge portion of a top face of the charge discharging electrode is covered with the insulating layer, the charge discharging electrode is exposed on a bottom face of the second opening, and when a face of the insulating layer contacting with the top face of the charge discharging electrode is a third face and another face of the insulating layer contacting with a portion of the photoelectric conversion layer opposed to the charge accumulating electrode is a second face, a side face of the second opening has an inclination that expands from the third face toward the second face.

Further, the imaging device or the like of the present disclosure including the charge discharging electrode can be configured such that it further includes a control portion provided on the semiconductor substrate and having a driving circuit, the first electrode, the charge accumulating electrode, and the charge discharging electrode are connected to the driving circuit, during a charge accumulation period, from the driving circuit, potential $V_{11}$ is applied to the first electrode, potential $V_{31}$ is applied to the charge accumulating electrode, and potential $V_{51}$ is applied to the charge discharging electrode, and charge is accumulated into the photoelectric conversion layer, and during a charge transfer period, from the driving circuit, potential $V_{12}$ is supplied to the first electrode; potential $V_{32}$ is supplied to the charge accumulating electrode; and potential $V_{52}$ is applied to the charge discharging electrode, and the charge accumulated in the photoelectric conversion layer is read out to the control portion through the first electrode. However, in the case where the potential of the first electrode is higher than the potential of the second electrode, $$V_{51} > V_{11} \text{ and } V_{52} < V_{12}$$

are satisfied, but where the potential of the first electrode is lower than the potential of the second electrode, $$V_{51} < V_{11} \text{ and } V_{52} > V_{12}$$

are satisfied.

Further, the imaging device or the like of the present disclosure including the preferred forms and configurations described above can be configured such that the charge accumulating electrode includes a plurality of charge accumulating electrode segments. It is to be noted that the imaging device or the like of the present disclosure of such a form as just described is sometimes referred to as an "imaging device or the like of the present disclosure including a plurality of charge accumulating electrode segments" for the convenience of description. The number of charge accumulating electrode segments may be two or more. Further, the imaging device or the like of the present disclosure including a plurality of charge accumulating electrode segments can be formed such that, in the case where different potential is applied to each of the N charge accumulating electrode segments, in the case where the potential of the first electrode is higher than the potential of the second electrode, the potential to be applied to the charge accumulating electrode segment positioned nearest to the first electrode (first photoelectric conversion portion segment) during a charge transfer period is higher than the potential to be applied to the charge accumulating electrode segment positioned remotest from the first electrode (Nth photoelectric conversion portion segment), and in the case where the potential of the first electrode is lower than the potential of the second electrode, the potential to be applied to the charge accumulating electrode segment positioned nearest to the first electrode (first photoelectric conversion portion segment) during a charge transfer period is lower than the potential to be applied to the charge accumulating electrode segment position remotest from the first electrode (Nth photoelectric conversion portion segment).

Further, the imaging device or the like of the present disclosure including the preferred forms and configurations described above can be formed such that at least a floating diffusion layer and an amplification transistor that configure a control portion are provided on a semiconductor substrate, and the first electrode is connected to the floating diffusion layer and a gate portion of the amplification transistor. Further, in this case, the imaging device or the like of the present disclosure including the preferred forms and configurations described above is formed such that a reset transistor and a selection transistor that configure the control portion are further provided on the semiconductor substrate, the floating diffusion layer is connected to one of source/drain regions of the reset transistor, and one of source/drain regions of the amplification transistor is connected to one of source/drain regions of the selection transistor, and the other one of the source/drain regions of the selection transistor is connected to a signal line.

Alternatively, as a modification of the imaging device or the like of the present disclosure including the preferred forms and configurations described above, imaging devices of a first configuration to a sixth configuration to be described below can be listed. In particular, in the imaging devices of the first configuration to the sixth configuration in the imaging device or the like of the present disclosure including the preferred forms and configurations described above, the photoelectric conversion portion includes N (where N≥2) photoelectric conversion portion segments, the photoelectric conversion layer includes N photoelectric conversion layer segments, the insulating layer includes N insulating layer segments, in the imaging devices of the first configuration to the third configuration, the charge accumulating electrode includes N charge accumulating electrode segments, in the imaging devices of the fourth configuration and the fifth configuration, the charge accumulating electrode includes N charge accumulating electrode segments arranged with a space between each other, the nth (where n=1, 2, 3 . . . , N) photoelectric conversion portion segment includes the nth charge accumulating electrode segment, the nth insulating layer segment, and the nth photoelectric conversion layer segment, and a photoelectric conversion portion segment having a higher value of n is positioned farther away from the first electrode.

Then, in the imaging device of the first configuration, the thickness of the insulating layer segment gradually changes over a range from the first photoelectric conversion portion segment to the Nth photoelectric conversion portion segment. Meanwhile, in the imaging device of the second configuration, the thickness of the photoelectric conversion layer segment gradually changes over a range from the first photoelectric conversion portion segment to the Nth photoelectric conversion portion segment. Further, in the imaging device of the third configuration, the material configuring the insulating layer segment is different between photoelectric conversion portion segments adjacent to each other. Further, in the imaging device of the fourth configuration, the material configuring the charge accumulating electrode segment is different between photoelectric conversion portion segments adjacent to each other. Further, in the imaging device of the fifth configuration, the area of the charge accumulating electrode segment decreases gradually over a range from the first photoelectric conversion portion segment to the Nth photoelectric conversion portion segment. It is to be noted that the area may decrease continuously or may decrease stepwise.

Alternatively, in the imaging device of the sixth configuration in the imaging device or the like of the present disclosure including the preferred forms and configurations described above, when the stacking direction of the charge accumulating electrode, the insulating layer, and the photoelectric conversion layer is a Z direction and the direction away from the first electrode is an X direction, the cross sectional area of the stacked portion when the stacked portion at which the charge accumulating electrode, the insulating layer, and the photoelectric conversion layer are stacked is cut along a YZ virtual plane changes depending upon the distance from the first electrode. It is to be noted that the change of the cross sectional area may be a continuous change or may be a stepwise change.

In the imaging devices of the first configuration and the second configuration, the N photoelectric conversion layer segments are provided continuously while the N insulating layer segments are also provided continuously and the N charge accumulating electrode segments are also provided successively. In the imaging devices of the third configuration to the fifth configuration, the N photoelectric conversion layer segments are provided continuously. Further, in the imaging devices of the fourth configuration and the fifth configuration, while the N insulating layer segments are provided continuously, in the imaging device of the third configuration, the N insulating layer segments are provided individually corresponding to the photoelectric conversion portion segments. Further, in the imaging devices of the fourth configuration and the fifth configuration, and in some cases, in the imaging device of the third configuration, the N charge accumulating electrode segments are provided individually corresponding to the photoelectric conversion portion segments. In the imaging devices of the first configuration to the sixth configurations, the same potential is applied to all of the charge accumulating electrode segments. Alternatively, in the imaging devices of the fourth configuration and the fifth configuration, and in some cases, in the imaging device of the third configuration, different potential may be applied to each of the N charge accumulating electrode segments.

In the imaging devices of the first configuration to the sixth configuration and the solid-state image sensors according to the first form and the second form of the present disclosure to which such imaging devices are applied, the thickness of the insulating layer segment is defined; the thickness of the photoelectric conversion layer segment is defined; the material configuring the insulating layer segment is different; the material configuring the charge accumulating electrode segment is different; the area of the charge accumulating electrode segment is defined; or the cross sectional area of the stacked portion is defined. Therefore, a kind of charge transfer gradient is formed such that charge generated by photoelectric conversion can be transferred to the first electrode more easily and with certainty. Then, as a result, occurrence of an after-image and occurrence of remaining of charge transfer can be prevented.

As a modification of the solid-state image sensor according to the first form of the present disclosure, a solid-state image sensor which includes a plurality of imaging devices of the first configuration to the sixth configuration can be applied, and, as a modification of the solid-state image sensor according to the second form of the present disclosure, a solid-state image sensor which includes a plurality of stacked type imaging devices each including at least one of the imaging devices of the first configuration to the sixth configuration described above can be implemented.

Although, in the imaging devices of the first configuration to the fifth configuration, a photoelectric conversion portion segment having a higher value of n is positioned away from the first electrode, whether or not the photoelectric conversion portion segment is positioned away from the first electrode is determined with reference to the X direction. Further, although, in the imaging device of the sixth configuration, the direction away from the first electrode is determined as the X direction, the "X direction" is defined in the following manner. In particular, a pixel region in which a plurality of imaging devices or stacked type imaging devices are arrayed includes a plurality of pixels that are arrayed in a two-dimensional array, i.e., arrayed regularly in the X direction and the Y direction. In the case where the planar shape of a pixel is a rectangle, the direction in which a side of the rectangle nearest to the first electrode extends is defined as a Y direction, and a direction orthogonal to the Y direction is defined as an X direction. Alternatively, in the case where the planar shape of a pixel is to have any shape, a general direction in which a line segment or a curved line nearest to the first electrode is included is defined as a Y direction, and a direction orthogonal to the Y direction is defined as an X direction.

In the following, the imaging devices of the first configuration to the sixth configuration are described in regard to a case in which the potential of the first electrode is higher than the potential of the second electrode. However, in the case where the potential of the first electrode is lower than the potential of the second electrode, it is sufficient if the potential is reversed between high and low levels.

In the imaging device of the first configuration, the thickness of the insulating layer segment gradually changes over a range from the first photoelectric conversion portion segment to the Nth photoelectric conversion portion segment; the thickness of the insulating layer segment may gradually increase or gradually decrease. By this, a kind of charge transfer gradient is formed.

In the case where the charge to be accumulated is electrons, it is sufficient to adopt a configuration in which the thickness of the insulating layer segment gradually increases, but in the case where the charge to be accumulated is positive holes, it is sufficient to adopt a configuration in which the thickness of the insulating layer segment gradually increases. In addition, in those cases, if such a state as $|V_{31}| \geq |V_{11}|$ is entered during a charge accumulation period, then, the nth photoelectric conversion portion segment can accumulate a greater amount of charge than the (n+1)th photoelectric conversion portion segment, and a stronger electric field is applied. Therefore, a flow of charge from the first photoelectric conversion portion segment to the first electrode can be prevented with certainty. Then, if such a state as $|V_{32}| < |V_{12}|$ is entered during a charge transfer period, then, a flow of charge from the first photoelectric conversion portion segment to the first electrode and a flow of charge from the (n+1)th photoelectric conversion portion segment to the nth photoelectric conversion portion segment can be assured with certainty.

In the imaging device of the second configuration, the thickness of the photoelectric conversion layer segment gradually changes over a range from the first photoelectric conversion portion segment to the Nth photoelectric conversion portion segment; the thickness of the photoelectric conversion layer segment may gradually increase or gradually decrease. By this, a kind of charge transfer gradient is formed.

In the case where the charge to be accumulated is electrons, it is sufficient to adopt a configuration in which the thickness of the photoelectric conversion layer segment gradually increases, but in the case where the charge to be accumulated is positive holes, it is sufficient to adopt a configuration that the thickness of the photoelectric conversion layer segment gradually increases. Further, in the case where the thickness of the photoelectric conversion layer segment gradually increases, if such a state as $V_{31} \geq V_{11}$ is entered during a charge accumulation period, or in the case where the thickness of the photoelectric conversion layer segment gradually degreases, if such a state as $V_{31} \leq V_{11}$ is entered during a charge accumulation period, then, to the nth photoelectric conversion portion segment, a stronger electric field than that to the (n+1)th photoelectric conversion portion segment is applied, and a flow of charge from the first photoelectric conversion portion segment to the first electrode can be prevented with certainty. Then, during a charge transfer period, in the case where the thickness of the photoelectric conversion layer segment gradually increases, if such a state as $V_{32} < V_{12}$ is entered, or in the case where the thickness of the photoelectric conversion layer segment gradually decreases, if such a state as $V_{32} > V_{12}$ is entered, then, a flow of charge from the first photoelectric conversion portion segment to the first electrode and a flow of charge from the (n+1)th photoelectric conversion portion segment to the nth photoelectric conversion portion segment can be assured with certainty.

In the imaging device of the third configuration, the material configuring the insulating layer segment is different between adjacent photoelectric conversion portion segments, and by this, a kind of charge transfer gradient is formed. However, preferably, the value of the relative permittivity of the material configuring the insulating layer segments gradually decreases over a range from the first photoelectric conversion portion segment to the Nth photoelectric conversion portion segment. Further, if, by adopting such a configuration as just described, such a state as $V_{31} \geq V_{11}$ is entered during a charge accumulation period, then, the nth photoelectric conversion portion segment can accumulate a greater amount of charge than the (n+1)th photoelectric conversion portion segment. Then, if such a state as $V_{32} < V_{12}$ is entered during a charge transfer period, then, a flow of charge from the first photoelectric conversion portion segment to the first electrode and a flow of charge from the (n+1)th photoelectric conversion portion segment to the nth photoelectric conversion portion segment can be assured with certainty.

In the imaging device of the fourth configuration, the material configuring the charge accumulating electrode segment is different between adjacent photoelectric conversion portion segments, and by this, a kind of charge transfer gradient is formed. However, preferably, the value of the work function of the material configuring the insulating layer segment gradually increases over a range from the first photoelectric conversion portion segment to the Nth photoelectric conversion portion segment. Further, by adopting such a configuration as just described, a potential gradient advantageous to signal charge transfer can be formed without relying upon the positive/negative of the voltage (potential).

In the imaging device of the fifth configuration, the area of the charge accumulating electrode segment gradually decreases over a range from the first photoelectric conversion portion segment to the Nth photoelectric conversion portion segment. Since a kind of charge transfer gradient is formed by this, if such a state of $V_{31} \geq V_{11}$ is entered during a charge accumulation period, then, the nth photoelectric conversion portion segment can accumulate a greater amount of charge than the (n+1)th photoelectric conversion portion segment. Then, if such a state as $V_{32} < V_{12}$ is entered during a charge transfer period, then, a flow of charge from the first photoelectric conversion portion segment to the first electrode and a flow of charge from the (n+1)th photoelectric conversion portion segment to the nth photoelectric conversion portion segment can be assured with certainty.

In the imaging device of the sixth configuration, the sectional area of the stacked portion changes depending upon the distance from the first electrode, and by this, a kind of charge transfer gradient is formed. In particular, if a configuration in which the thickness of the cross section of the stacked portion is fixed and the width of the sectional area of the stacked portion decreases as the distance from the first electrode increases is adopted, then, similarly as in the description of the imaging device of the fifth configuration, if such a state as $V_{31} \geq V_{11}$ is entered during a charge accumulation period, then, a region nearer to the first electrode can accumulate a greater amount of charge than a remoter region. Accordingly, if such a state as $V_{32}<V_{12}$ is entered during a charge transfer period, then, a flow of charge from the region nearer to the first electrode to the first electrode and a flow of charge from the remoter region to the nearer region can be assured with certainty. On the other hand, if a configuration in which the width of the cross section of the stacked portion is fixed and the thickness of the cross section of the stacked portion, more particularly, the thickness of the insulating layer segment, gradually increases is adopted, then, similarly as in the description of the imaging device of the first configuration, if such a state as $V_{31} \geq V_{11}$ is entered during a charge accumulation period, the region nearer to the first electrode can accumulate a greater amount of charge than the remoter region and a stronger electric field is applied, by which a flow of charge from the region nearer to the first electrode to the first electrode can be prevented with certainty. Then, if such a state as $V_{32}<V_{12}$ is entered during a charge transfer period, then, a flow of charge from the region nearer to the first electrode to the first electrode and a flow of charge from the remoter region to the nearer region can be assured with certainty. Further, if a configuration in which the thickness of the photoelectric conversion layer segment gradually increases is adopted, then, similarly as in the description of the imaging device of the second configuration, if such a state as $V_{31} \geq V_{11}$ is entered during a charge accumulation period, then, a stronger electric filed is applied to the region nearer to the first electrode than to the remoter region and a flow of charge from the region nearer to the first electrode to the first electrode can be prevented with certainty. Then, if such a state as $V_{32}<V_{12}$ is entered during a charge transfer period, then, a flow of charge from the region nearer to the first electrode to the first electrode and a flow of charge from the remoter region to the nearer region can be assured with certainty.

Further, the imaging device or the like of the present disclosure including the preferred forms and configurations described above can be formed such that light is incident from the second electrode side and a shading layer is formed on the light incidence side rather near to the second electrode. Alternatively, the imaging device or the like of the present disclosure can be formed such that light is incident from the second electrode side but light is not incident to the first electrode (in some cases, to the first electrode and the transfer controlling electrode). Further, in this case, the imaging device or the like of the present disclosure can be formed such that a shading layer is formed above the first electrode (in some cases, above the first electrode and the transfer controlling electrode) and on the light incidence side rather near to the second electrode or can be formed such that an on-chip microlens is provided above the charge accumulating electrode and the second electrode such that light incident to the on-chip microlens is focused on the charge accumulating electrode. Here, the shading layer may be arranged above a light incidence side face of the second electrode or on the light incident side face of the second electrode. In some cases, the shading layer may be formed on the second electrode. As the material for configuring the shading layer, chromium (Cr), copper (Cu), aluminum (Al), tungsten (W), and a resin that does not pass light (for example, a polyimide resin) can be exemplified.

As the imaging device or the like of the present disclosure, particularly, an imaging device (referred to as a "blue light imaging device of the first type" for the convenience of description) that has sensitivity to blue light and that includes a photoelectric conversion layer (referred to as a "blue light photoelectric conversion layer of the first type" for the convenience of description) that absorbs blue light (light of 425 to 495 nm), an imaging device (referred to as a "green light imaging device of the first type" for the convenience of description) that has sensitivity to green light and that includes a photoelectric conversion layer (referred to as "green light photoelectric conversion layer of the first type" for the convenience of description) that absorbs green light (light of 495 to 570 nm), and an imaging device (referred to as a "red light imaging device of the first type" for the convenience of description) that has sensitivity to red light and that includes a photoelectric conversion layer (referred to as a "red light photoelectric conversion layer of the first type" for the convenience of description) that absorbs red light (light of 620 to 750 nm) can be exemplified. On the other hand, a conventional imaging device that does not include a charge accumulating electrode and has sensitivity to blue light is referred to as a "blue light imaging device of the second type" for the convenience of description; a conventional imaging device that does not include a charge accumulating electrode and has sensitivity to green light is referred to as a "green light imaging device of the second type" for the convenience of description; and a conventional imaging device that does not include a charge accumulating electrode and has sensitivity to red light is referred to as a "red light imaging device of the second type" for the convenience of description. Further, a photoelectric conversion layer configuring a blue light imaging device of the second type is referred to as a "blue light photoelectric conversion layer of the second type" for the convenience of description; a photoelectric conversion layer configuring a green light imaging device of the second type is referred to as a "green light photoelectric conversion layer of the second type" for the convenience of description; and a photoelectric conversion layer configuring a red light imaging device of the second type is referred to as a "red light photoelectric conversion layer of the second type" for the convenience of description.

Although the stacked type imaging device of the present disclosure includes at least one imaging device or the like (photoelectric conversion device) of the present disclosure, particularly, for example, a stacked type imaging device configured and structured as follows can be exemplified:

[A] a stacked type imaging device configured and structured such that a blue light photoelectric conversion portion of the first type, a green light photoelectric conversion portion of the first type, and a red light photoelectric conversion portion of the first type are stacked in the vertical direction, and
control portions of the blue light imaging device of the first type, the green light imaging device of the first type, and the red light imaging device of the first type are each provided on a semiconductor substrate;

[B] a stacked type imaging device configured and structured such that the blue light photoelectric conversion portion of the first type and the green light photoelectric conversion portion of the first type are stacked in the vertical direction,
a red light photoelectric conversion portion of the second type is arranged below the two layers of the photoelectric conversion portions of the first type, and
control portions of the blue light imaging device of the first type, the green light imaging device of the first type, and the red light imaging device of the second type are each provided on a semiconductor substrate;

[C] a stacked type imaging device configured and structured such that a blue light photoelectric conversion portion of the second type and the red light photoelectric conversion portion of the second type are arranged below the green light photoelectric conversion portion of the first type, and control portions of the green light imaging device of the first type, the blue light imaging device of the second type, and the red light imaging device of the second type are each provided on a semiconductor substrate; and

[D] a stacked type imaging device configured and structured such that a green light photoelectric conversion portion of the second type and the red light photoelectric conversion portion of the second type are arranged below the blue light photoelectric conversion portion of the first type, and control portions of the blue light imaging device of the first type, the green light imaging device of the second type, and the red light imaging device of the second type are each provided on a semiconductor substrate. It is to be noted that the order of arrangement of the photoelectric conversion portions of the imaging devices in the vertical direction is preferably the order of the blue light photoelectric conversion portion, the green light photoelectric conversion portion, and the red light photoelectric conversion portion from the light incidence direction or the order of the green light photoelectric conversion portion, the blue light photoelectric conversion portion, and the red light photoelectric conversion portion from the light incidence direction. This is because light of a shorter wavelength is absorbed at higher efficiency on the incidence surface side. Since red light has the longest wavelength among the three colors, preferably, the red light photoelectric conversion portion is positioned in the lowermost layer as viewed from the light incidence face. One pixel is configured from a stacked structure of the imaging devices. Further, the red light photoelectric conversion portion of the first type may be provided. Here, preferably, the photoelectric conversion layer of the red light photoelectric conversion portion of the first type is configured, for example, from an organic material and is placed in the lowermost layer of the stacked structure of the imaging devices of the first type but higher than the imaging devices of the second type. Alternatively, the photoelectric conversion layer of the red light photoelectric conversion portion of the second type may be provided below the photoelectric conversion portions of the first type.

In the imaging devices of the first type, for example, the first electrode is formed on an interlayer insulating layer provided on the semiconductor substrate. The imaging device formed on the semiconductor substrate may be formed as that of the back-illuminated type or as that of the front-illuminated type.

In the case where the photoelectric conversion layer is configured from an organic material, the photoelectric conversion layer can be formed in any of four forms including:

(1) a form in which it is configured from a p-type organic semiconductor;
(2) a form in which it is configured from an n-type organic semiconductor;
(3) a form in which it is configured from a stacked structure of a p-type organic semiconductor layer/an n-type organic semiconductor layer; it is configured from a stacked structure of a p-type organic semiconductor layer/a mixed layer (bulk hetero structure) of a p-type organic semiconductor and an n-type organic semiconductor/an n-type organic semiconductor layer; it is configured from a stacked structure of a p-type organic semiconductor layer/a mixed layer (bulk hetero structure) of a p-type organic semiconductor and an n-type organic semiconductor; or it is configured from a stacked structure of an n-type organic semiconductor layer/a mixed layer (bulk hetero structure) of a p-type organic semiconductor and an n-type organic semiconductor; and
(4) a form in which it is configured from a mixture (bulk hetero structure) of a p-type organic semiconductor and n-type organic semiconductor. It is to be noted that a configuration in which the layering order is changed optionally can be applied.

As the p-type organic semiconductor, naphthalene derivatives, anthracene derivatives, phenanthrene derivatives, pyrene derivatives, perylene derivatives, tetracene derivatives, pentacene derivatives, quinacridone derivatives, thiophene derivatives, thienothiophene derivatives, benzothiophene derivatives, benzothienobenzothiophene derivatives, triallylamine derivatives, carbazole derivatives, perylene derivatives, picene derivatives, chrysene derivatives, fluoranthene derivatives, phthalocyanine derivatives, subphthalocyanine derivatives, subporphyrazine derivatives, metal complexes with a heterocyclic compound as a ligand, polythiophene derivatives, polybenzothiadiazole derivatives, polyfluorene derivatives and so forth are applicable. As the n-type organic semiconductor, fullerenes and fullerenes derivatives <for example, fullerenes such as C60, C70, and C74 (higher fullerenes), encapsulating fullerenes and so forth), or fullerenes derivatives (for example, fullerene fluorides, PCBM fullerene compounds, fullerene multimers and so forth)>, organic semiconductors whose HOMO and LUMO are greater (deeper) than those of p-type organic semiconductors, transparent inorganic metal oxides and so forth are applicable. As the n-type organic semiconductor, particularly, heterocyclic compounds containing nitrogen atoms, oxygen atoms or sulfur atoms such as organic molecules that have, at a molecular skeleton thereof, pyridine derivatives, pyrazine derivatives, pyrimidine derivatives, triazine derivatives, quinoline derivatives, quinoxaline derivatives, isoquinoline derivatives, acridine derivatives, phenazine derivatives, phenanthroline derivatives, tetrazole derivatives, pyrazole derivatives, imidazole derivatives, thiazole derivatives, oxazole derivatives, imidazole derivatives, benzimidazole derivatives, benzotriazole derivatives, benzoxazole derivatives, benzoxazole derivatives, carbazole derivatives, benzofuran derivatives, dibenzofuran derivatives, subporphyrazine derivatives, polyphenylene vinylene derivatives, polybenzothiadiazole derivatives, polyfluorene derivatives and so forth, organometallic complexes, and subphthalocyanine derivatives, for example, are applicable. As a group or the like included in the fullerene derivatives, halogen atoms; linear, branched or cyclic alkyl groups or phenyl groups; groups having a linear or condensed-ring aromatic compound; groups having a halide; partial fluoroalkyl groups; perfluoroalkyl groups; cyril alkyl groups; cyril alkoxy groups; arylsilyl groups; aryl sulfanyl groups; alkyl sulfanyl groups; aryl sulfonyl groups; alkyl sulfonyl groups; aryl sulfide groups; alkyl sulfide groups; amino groups; alkyl amino groups; aryl amino groups; hydroxy groups; alcoxy groups; acyl amino groups; acyloxy groups; carbonyl groups; carboxy groups; carboxamide groups; carboalcoxy groups; acyl groups; sulfonil groups; cyano groups; nitro groups; groups having a chalcogenide; phosphine groups; phosphon groups; and derivatives of them are applicable. Though not restrictive, the thickness of the photoelectric conversion layer configured from an organic material (sometimes referred to as an "organic photoelectric conversion layer") can be exemplified to be, for example, $1 \times 10^{-8}$ to $5 \times 10^{-7}$ m, preferably, $2.5 \times 10^{-8}$ to $3 \times 10^{-7}$ m, more preferably, $2.5 \times 10^{-8}$ to $2 \times 10^{-7}$ m, most preferably, $1 \times 10^{-7}$ to $1.8 \times 10^{-7}$ M. It is to be noted that, although organic semiconductors are frequently classified into the p type and the n type, the p type signifies that positive holes are transported readily, and the n type signifies that electrons are transported readily; the interpretation that the organic semiconductor has positive holes or electrons as multiple carriers of thermal excitation like inorganic semiconductors is not restrictive.

Meanwhile, as a material for configuring an organic photoelectric conversion layer for photoelectrically converting green light, a rhodamine dye, a melacianin pigment, a quinacridone derivative, a subphthalocyanine pigment (subphthalocyanine derivative) and so forth are applicable, and as a material for configuring an organic photoelectric conversion layer for photoelectrically converting blue light, for example, a coumarin acid pigment, tris-8-hydrixi quinoli aluminum (Alq3), a melacianin pigment and so forth are applicable. Further, as a material for configuring an organic photoelectric conversion layer for photoelectrically converting red light, for example, a phthalocyanine pigment and a subphthalocyanine pigment (subphthalocyanine derivative) are applicable.

Alternatively, as an inorganic material for configuring a photoelectric conversion layer, crystalline silicon, amorphous silicon, microcrystalline silicon, crystalline selenium, amorphous selenium, and CIGS (CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, and AgInSe$_2$, which are calcopalite compounds, GaAs, InP, AlGaAs, InGaP, AlGaInP, and InGaAsP, which are III-V group compounds, or further, such compound semiconductors as CdSe, CdS, In$_2$Se$_3$, In$_2$S$_3$, Bi$_2$Se$_3$, Bi$_2$S$_3$, ZnSe, ZnS, PbSe, and PbS are applicable. In addition, it is also possible to use quantum dots formed from those materials for the photoelectric conversion layer.

Alternatively, the photoelectric conversion layer can be formed in a stacked structure of a lower layer semiconductor layer and an upper layer photoelectric conversion layer. By providing the lower layer semiconductor layer in such a manner, for example, it is possible to prevent recombination upon charge accumulation. Further, the charge transfer efficiency of charge accumulated in the photoelectric conversion layer with respect to the first electrode can be increased. Further, it is possible to temporarily hold charge generated in the photoelectric conversion layer and control the transfer timing and so forth. Further, generation of dark current can be suppressed. It is sufficient if the material for configuring the upper layer photoelectric conversion layer is selected suitably from the various materials that configure the photoelectric conversion layer described hereinabove. Meanwhile, as the material for configuring the lower layer semiconductor layer, it is preferable to use a material that has a high value of the band gap energy (for example, a value of the band gap energy of 3.0 eV or more) and also has a mobility higher than that of the material for configuring the photoelectric conversion layer. In particular, oxide semiconductor materials; transition metal dichalcogenide; silicon carbide; diamond; graphene; carbon nanotube; and organic semiconductor materials such as condensed polycyclic hydride compounds or condensed hydrocyclic compounds can be exemplified, and more particularly, as the oxide semiconductor material, indium oxide, gallium oxide, zinc oxide, tin oxide, materials containing at least one of the oxides, materials with a dopant added to the materials, specifically, for example, IGZO, ITZO, IWZO, IWO, ZTO, ITO-SiO$_x$ materials, GZO, IGO, ZnSnO$_3$, AlZnO, GaZnO, and InZnO are applicable. Further, materials containing CuI, InSbO$_4$, ZnMgO, CuInO$_2$, MgIn$_2$O$_4$, CdO or the like are applicable. However, those materials are not restrictive. Alternatively, as a material for configuring the lower layer semiconductor layer, in the case where charge to be accumulated is electrons, a material having ionization potential higher than the ionization potential of the material that configures the photoelectric conversion layer is applicable, and in the case where charge to be accumulated is positive holes, a material having electron affinity lower than the electron affinity of the material that configures the photoelectric conversion layer is applicable. Alternatively, the impurity concentration of the material that configures the lower layer semiconductor layer is preferably $1 \times 10^{18}$ cm$^{-3}$ or less. The lower layer semiconductor layer may have a single layer configuration or may have a multilayer configuration. Further, the material that configures the lower layer semiconductor layer positioned above the charge accumulating electrode and the material that configures the lower layer semiconductor layer positioned above the first electrode may be made different from each other.

A single plate type color solid-state image sensor can be configured from the solid-state image sensors according to the first form and the second form of the present disclosure.

In the solid-state image sensor according to the first form and the second form of the present disclosure including a stacked type imaging device, different from a solid-state image sensor that includes imaging devices of a Bayer array (i.e., spectroscopy of blue, green, and red is not performed using a color filter), one pixel is configured by stacking imaging devices having sensitivity to light of a plurality of different wavelengths in an incidence direction of light in the same pixel, and thus, improvement of the sensitivity and improvement of the pixel density per unit volume can be achieved. Further, since organic materials have a high absorption coefficient, the film thickness of the organic photoelectric conversion layer can be reduced in comparison with a conventional Si type photoelectric conversion layer, and leak of light from an adjacent pixel or limitation to the incidence angle of light is moderated. Further, although a conventional Si type imaging device suffers from false color because it generates a color signal by performing an interpolation process among pixels of three colors, in the solid-state image sensor according to the second form of the present disclosure that includes the stacked type imaging device, appearance of false color can be reduced. Further, since the organic photoelectric conversion layer itself functions also as a color filter, even if a color filter is not arranged, color separation can be performed.

On the other hand, in the solid-state image sensor according to the first form of the present disclosure that includes not the stacked type imaging device but the imaging device, by using a color filter, a requirement for a spectroscopic characteristic of blue, green, and red can be moderated, and high mass productivity is achieved. As the array of imaging devices in the solid-state image sensor according to the first form of the present disclosure, in addition to a Bayer array, an interline array, a G stripe RB checkered array, a G stripe RB complete checkered array, a checkered complementary color array, a stripe array, an oblique stripe array, a primary color difference array, a field color difference sequential array, a frame color difference sequential array, a MOS type array, an improved MOS type array, a frame interleave array, and a field interleave array are applicable. Here, one pixel (or subpixel) can be configured from a single imaging device.

A pixel region in which a plurality of imaging devices or the like of the present disclosure or a plurality of stacked type imaging devices in the present disclosure are arrayed includes a plurality of pixels arrayed regularly in a two-dimensional array. The pixel region usually includes an effective pixel region in which light is actually received and signal charge generated by photoelectric conversion is amplified and read out to a driving circuit and a black reference pixel region for outputting optical black that becomes a reference for the black level. The black reference pixel region is usually arranged on an outer peripheral portion of the effective pixel region.

In the imaging device or the like of the present disclosure including the preferred forms and configurations described above, light is applied and photoelectric conversion occurs in the photoelectric conversion layer, whereupon carrier separation into positive holes (holes) and electrons is performed. Then, the electrode from which the positive holes are extracted is determined as an anode, and the electrode from which the electrons are extracted is determined as a cathode. Not only a form in which the first electrode configures the anode and the second electrode configures the cathode but also a form in which conversely the first electrode configures the cathode and the second electrode configures the anode are available.

In the case where a stacked type imaging device is configured, it can be configured such that the first electrode, the charge accumulating electrode, the various isolation electrodes, the transfer controlling electrode, the charge discharging electrode, and the second electrode are formed from a transparent conductive material. It is to be noted that the first electrode, the charge accumulating electrode, the various isolation electrodes, the transfer controlling electrode, and the charge discharging electrode are sometimes collectively referred to as "first electrode and so forth." Alternatively, in the case where the imaging device or the like of the present disclosure is arranged on a plane, for example, like a Bayer array, the stacked type imaging device can be configured such that the second electrode is formed from a transparent conductive material and the first electrode, the charge accumulating electrode and so forth are formed from a metal material. In this case, the stacked type imaging device can be configured particularly such that the second electrode positioned on the light incidence side is formed from a transparent conductive material and the first electrode and so forth are formed, for example, from Al-ND (alloy of aluminum and neodymium) or ASC (alloy of aluminum, samarium, and copper). It is to be noted that an electrode made of a transparent conductive material is sometimes referred to as a "transparent electrode." Here, the band gap energy of the transparent conductive material is 2.5 eV or more, preferably 3.1 eV or more. As the transparent conductive material configuring the transparent electrode, a metal oxide having conductivity is applicable. In particular, indium oxide, indium tin oxide (ITO, Indium Tin Oxide, including $In_2O_3$ doped with Sn, crystalline ITO, and amorphous ITO), indium zinc oxide (IZO, Indium Zinc Oxide) where indium is added as a dopant to zinc oxide, indium gallium oxide (IGO) where indium is added as a dopant to gallium oxide, indium gallium zinc oxide (IGZO, In—$GaZnO_4$) where indium and gallium are added as a dopant to zinc oxide, indium tin zinc oxide (ITZO) where indium and tin are added as a dopant to zinc oxide, IFO (F-doped $In_2O_3$), tin oxide ($SnO_2$), ATO (Sb-doped $SnO_2$), FTO (F-doped $SnO_2$), zinc oxide (including ZnO doped with a different element), aluminum zinc oxide (AZO) where aluminum is added as a dopant to zinc oxide, gallium zinc oxide (GZO) where gallium is added as a dopant to zinc oxide, titanium oxide ($TiO_2$), niobium titanium oxide (TNO) where niobium is added as a dopant to titanium oxide, antimony oxide, spinel type oxide, and an oxide having a $YbFe_2O_4$ structure are applicable. Alternatively, a transparent electrode having, as a mother layer, gallium oxide, titanium oxide, niobium oxide, nickel oxide or the like is applicable. As the thickness of the transparent electrode, $2 \times 10^{-8}$ to $2 \times 10^{-7}$ m, preferably $3 \times 10^{-8}$ to $1 \times 10^{-7}$ m, is applicable. In the case where transparency is required for the first electrode, it is preferable that the other electrodes are also configured from a transparent conductive material from the point of view of simplification of the manufacturing process.

Alternatively, in the case where transparency is not required, a conductive material for configuring an anode having a function as an electrode for extracting positive holes is preferably configured from a conductive material having a high work function (for example, $\varphi=4.5$ to 5.5 eV). In particular, gold (Au), silver (Ag), chromium (Cr), nickel (Ni), palladium (Pd), platinum (Pt), iron (Fe), iridium (Ir), germanium (Ge), osmium (Os), rhenium (Re), and tellurium (Te) can be exemplified. On the other hand, a conductive material for configuring a cathode having a function as an electrode for extracting electrons is preferably configured from a conductive material having a low work function (for example, $\varphi=3.5$ to 4.5 eV). In particular, alkali metals (for example, Li, Na, K and so forth) and fluorides or oxides of the same, alkaline earth metals (for example, Mg, Ca and so forth) and fluorides or oxides of the same, aluminum (Al), zinc (Zn), tin (Sn), thallium (Tl), sodium-potassium alloys, aluminum-lithium alloys, magnesium-silver alloys, rare earth metals such as indium and ytterbium, or alloys of them are applicable. Alternatively, as a material for configuring an anode or a cathode, conductive materials such as metals including platinum (Pt), gold (Au), palladium (Pd), chromium (Cr), nickel (Ni), aluminum (Al), silver (Ag), tantalum (Ta), tungsten (W), copper (Cu), titanium (T), indium (In), tin (Sn), iron (Fe), cobalt (Co), molybdenum (Mo), or alloys containing such metal elements, conductive particles configured from those metals, conductive particles of alloys containing those metals, polycrystalline silicon containing impurities, carbon-based materials, oxide semiconductors, carbon nanotubes, and graphene are applicable, and a stacked structure of layers including these elements is also applicable. Further, as a material for configuring an anode or a cathode, such organic materials (conductive polymers) as poly(3,4-ethylenedioxythiophene)/polystyrene sulfonic acid [PEDOT/PSS] are applicable. Further, such conductive materials may be used as an electrode by mixing it into a binder (polymer) to form paste or ink and hardening the paste or ink.

As a film formation method of the first electrode and so forth and the second electrode (anode and cathode), a dry method or a wet method can be used. As the dry method, a physical vapor deposition method (PVD method) and a chemical vapor deposition method (CVD method) are applicable. As a film formation method in which the principle of the PVD method is used, a vapor deposition method that uses resistor heating or high frequency heating, an EB (electron beam) deposition method, various sputtering methods (magnetron sputtering method, RF-DC combined bias sputtering method, ECR sputtering method, opposed target sputtering method, and high frequency sputtering method), an ion plating method, a laser ablation method, a molecular beam epitaxy method, and a laser transfer method are applicable. Meanwhile, as the CVD method, a plasma CVD method, a thermal CVD method, an organic metal (MO) CVD method, and an optical CVD method are applicable. On the other hand, as the wet type method, such methods as an electroplating method or an electroless plating method, a spin coating method, an ink jet method, a spray coating method, a stamp method, a micro contact print method, a flexo printing method, an offset printing method, a gravure printing method, and a dip method are applicable. As the patterning method, chemical etching such as shadow mask, laser transfer, or photolithography, physical etching by ultraviolet rays or a laser and so forth are applicable. As a flattening technology for the first electrode and so forth or the second electrode, a laser flattening method, a reflow method, a CMP (Chemical Mechanical Polishing) method and so forth can be used.

As a material for configuring insulating layers, various interlayer insulating layers, and insulating films, not only inorganic insulating materials exemplified by silicon oxide materials; silicon nitride ($SiN_Y$); and metal oxide high dielectric insulating materials such as aluminum oxide ($Al_2O_3$), but also polymethylmethacrylate (PMMA); polyvinyl phenol (PVP); polyvinyl alcohol (PVA); polyimide; polycarbonate (PC), polyethylene terephthalate (PET); polystyrene; silanol derivatives (silane coupling agents) such as N-2 (amino ethyl) 3-aminopropyltrimethoxysillane (AEAPTMS), 3-mercaptpropyltrimethoxysilane (MPTMS), or octadecyltrichlorosilane (OTS); novolac type phenolic resins; fluorine resins; and organic insulating materials (organic polymers) exemplified by linear hydrocarbons having functional groups that can be attached to the control electrode at one end thereof such as octadecane thiol or dodecyl isocyanate are applicable, and also combinations of them can be used. It is to be noted that, as the silicon oxide materials, silicon oxide ($SiO_X$), BPSG, PSG, BSG, AsSG, PbSG, silicon oxynitride (SiON), SOG (spin-on-glass), and low dielectric materials (for example, polyallyl ether, cycloperfluorocarbon polymer, and benzocyclobutene, cyclic fluororesin, polytetrafluoroethylene, aryl fluoride ether, polyimide fluoride, amorphous carbon, and organic SOG) can be exemplified.

The configuration and structure of the floating diffusion layer, the amplification transistor, the reset transistor, and the selection transistor that configure the control portion can be made similar to the configuration and structure of a conventional floating diffusion layer, amplification transistor, reset transistor, and selection transistor. Also, the driving circuit can have a well-known configuration and structure.

Although the first electrode is connected to the floating diffusion layer and the gate portion of the amplification transistor, it is sufficient if a contact hole portion for the connection between the first electrode and the floating diffusion layer and gate portion of the amplification transistor is formed. As the material for configuring the contact hole portion, polysilicon doped with an impurity, high melting point metals and metal silicide of tungsten, Ti, Pt, Pd, Cu, TiW, TiN, TiNW, $WSi_2$, $MoSi_2$ and so forth, and stacked structures (for example, Ti/TiN/W) of layers made of such materials can be exemplified.

A first carrier blocking layer may be provided between the organic photoelectric conversion layer and the first electrode, and a second carrier blocking layer may be provided between the organic photoelectric conversion layer and the second electrode. Further, a first charge injection layer may be provided between the first carrier blocking layer and the first electrode, and a second charge injection layer may be provided between the second carrier blocking layer and the second electrode. For example, as the material for configuring the charge injection layer, alkali metals such as lithium (Li), sodium (Na), or potassium (K) and their fluorides and oxides and alkaline earth metals such as magnesium (Mg) or calcium (Ca) and their fluorides and oxides are, for example, applicable.

As the film formation method of the various organic layers, a dry film formation method and a wet film formation method are applicable. As the dry film formation method, a vacuum deposition method that uses resistor heating, high frequency heating, or electron beam heating, a flash deposition method, a plasma deposition method, an EB deposition method, various sputtering methods (2-pole sputtering method, a DC sputtering method, a DC magnetron sputtering, a high frequency sputtering method, a magnetron sputtering method, an RF-DC combined bias sputtering method, an ECR sputtering method, an opposed target sputtering method, a high frequency sputtering method, and an ion beam sputtering method), a DC (Direct Current) method, an RF method, a multicathode method, an activation reaction method, an electric field deposition method, various ion plating methods such as a high frequency ion plating method or a reactive ion plating method, a laser ablation method, a molecular beam epitaxy method, a laser transfer method, and a molecular beam epitaxy method (MBE method) are applicable. Meanwhile, as the CVD method, a plasma CVD method, a thermal CVD method, an MOCVD method, and an optical CVD method are applicable. On the other hand, as the wet type method, a spin coating method; an immersion method; a cast method; a microcontact printing method; a drop casting method; various printing methods such as a screen printing method, an ink jet printing method, an offset printing method, a gravure printing method, or a flexo printing method; a stamp method; a spray method; and various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, or a calendar coater method can be exemplified. It is to be noted that, in the coating method, as a solvent, non-polar or low-polar organic solvents such as toluene, chloroform, hexane, or ethanol can be exemplified. As the patterning method, chemical etching such as shadow mask, laser transfer, or photolithography, physical etching by ultraviolet rays, a laser or the like and so forth are applicable. As a flattening method for the various organic layers, a laser flattening method, a reflow method and so forth can be used.

Two or more of the imaging devices of the first configuration to the sixth configuration including the preferred forms and configurations described above can suitably be combined as desired.

In any of the imaging devices or the solid-state image sensors, an on-chip microlens or a shading layer may be provided as described above as occasion demands, and a driving circuit and wiring for driving the imaging devices are provided. As occasion demands, a shutter for controlling incidence of light to the imaging device may be arranged, or an optical cut filter may be provided according to an object of the solid-state image sensor.

For example, in the case where a solid-state image sensor is to be stacked with a reading out integrated circuit (ROIC), by placing a driving substrate on which a reading out integrated circuit and a connection portion made of copper (Co) are formed and an imaging device on which a connection portion is formed one on the other such that the connection portions contact with each other and then joining the connection portions to each other, they can be stacked, and it is also possible to join the connection portions to each other by using solder bumps or the like.

Further, a driving method for driving the solid-state image sensor according to any one of the first form and the second form of the present disclosure can be made a driving method for a solid-state image sensor that repeats the steps of discharging, while charge is accumulated into photoelectric conversion layers the charge in first electrodes all at once, in all imaging devices, and then, transferring the charge accumulated in the photoelectric conversion layers, all at once, to the first electrodes, in all imaging devices, and sequentially reading out, after completion of the transfer, the charge transferred to the first electrodes in the imaging devices.

In such a driving method for a solid-state image sensor as described above, since each imaging device is structured such that light incident from the second electrode side is not incident to the first electrode and, while charge is accumulated into the photoelectric conversion layers, the charge in the first electrodes is discharged to the outside of the system all at once, in all imaging devices, resetting of the first electrode can be performed simultaneously with certainty in all imaging devices. Further, thereafter, the charge accumulated in the photoelectric conversion layer is transferred all at once in all imaging devices, and after completion of the transfer, the charge transferred to the first electrode in each imaging device is read out sequentially. Therefore, what is generally called a global shutter function can be implemented readily.

WORKING EXAMPLE 1

Figure 8:
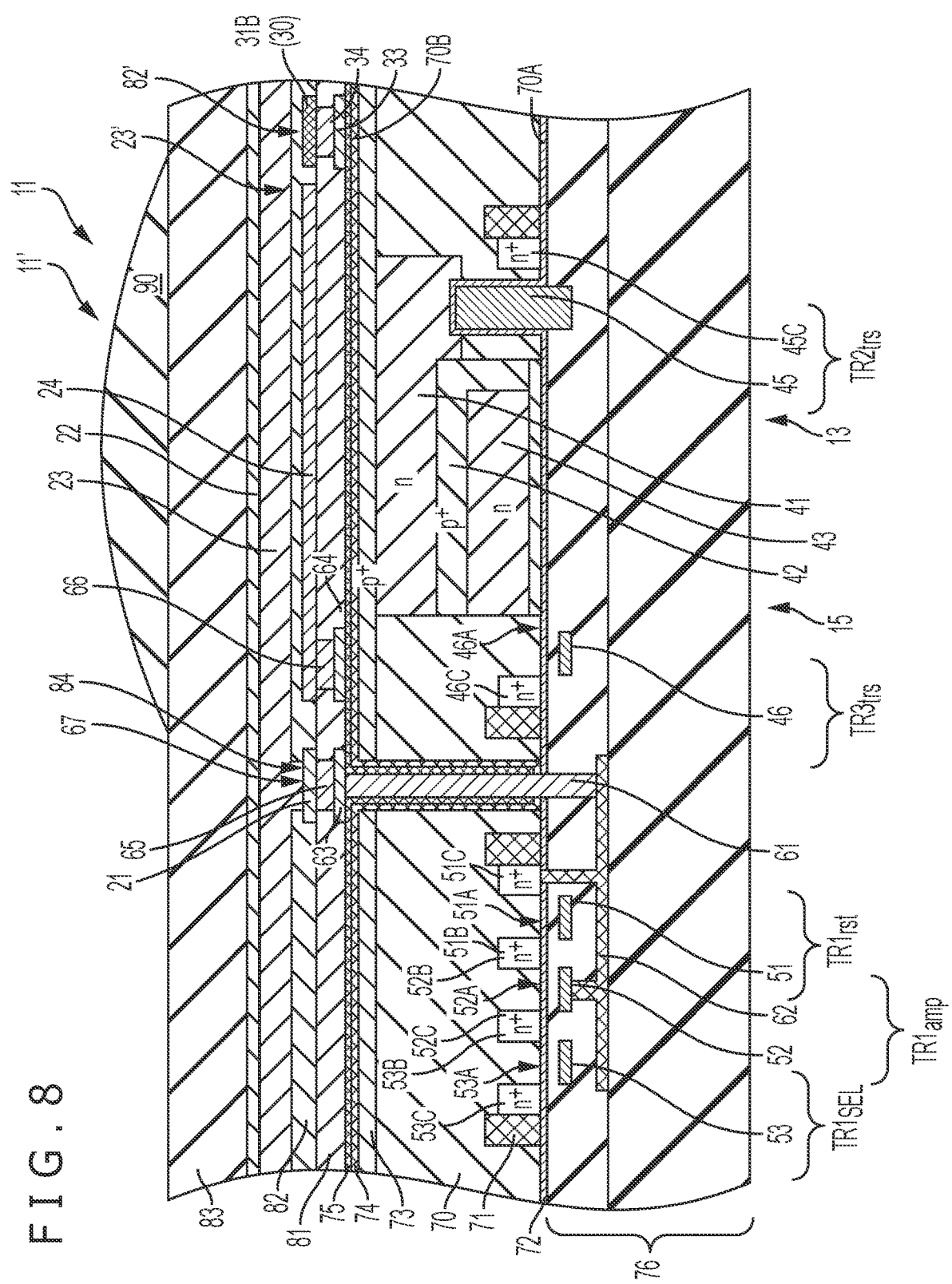
FIG. 8 is one schematic partial sectional view of the imaging device and the stacked type imaging device of the working example 1.
Figure 9:
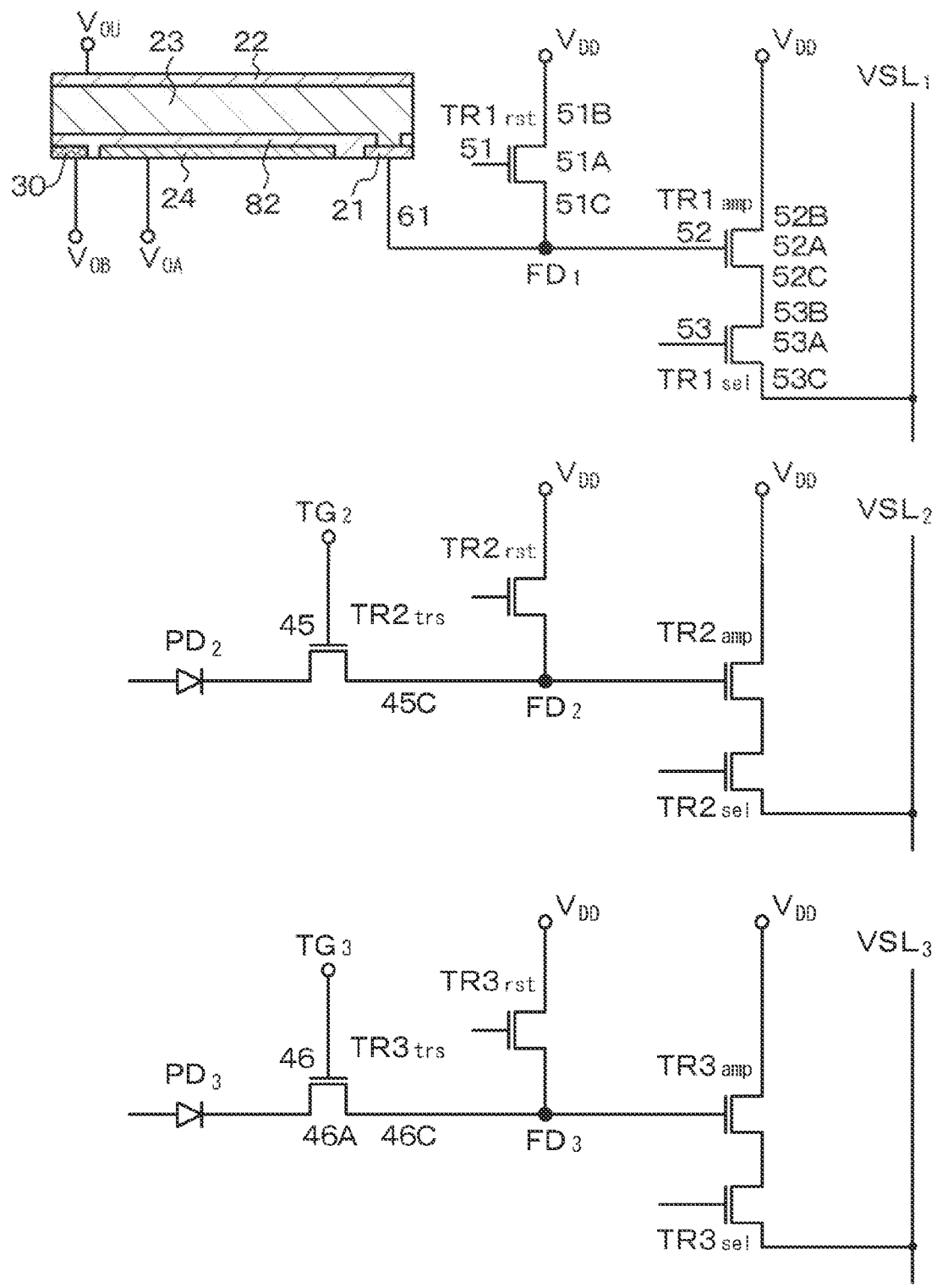
FIG. 9 is an equivalent circuit diagram of the imaging device and the stacked type imaging device of the working example 1.
Figure 10:
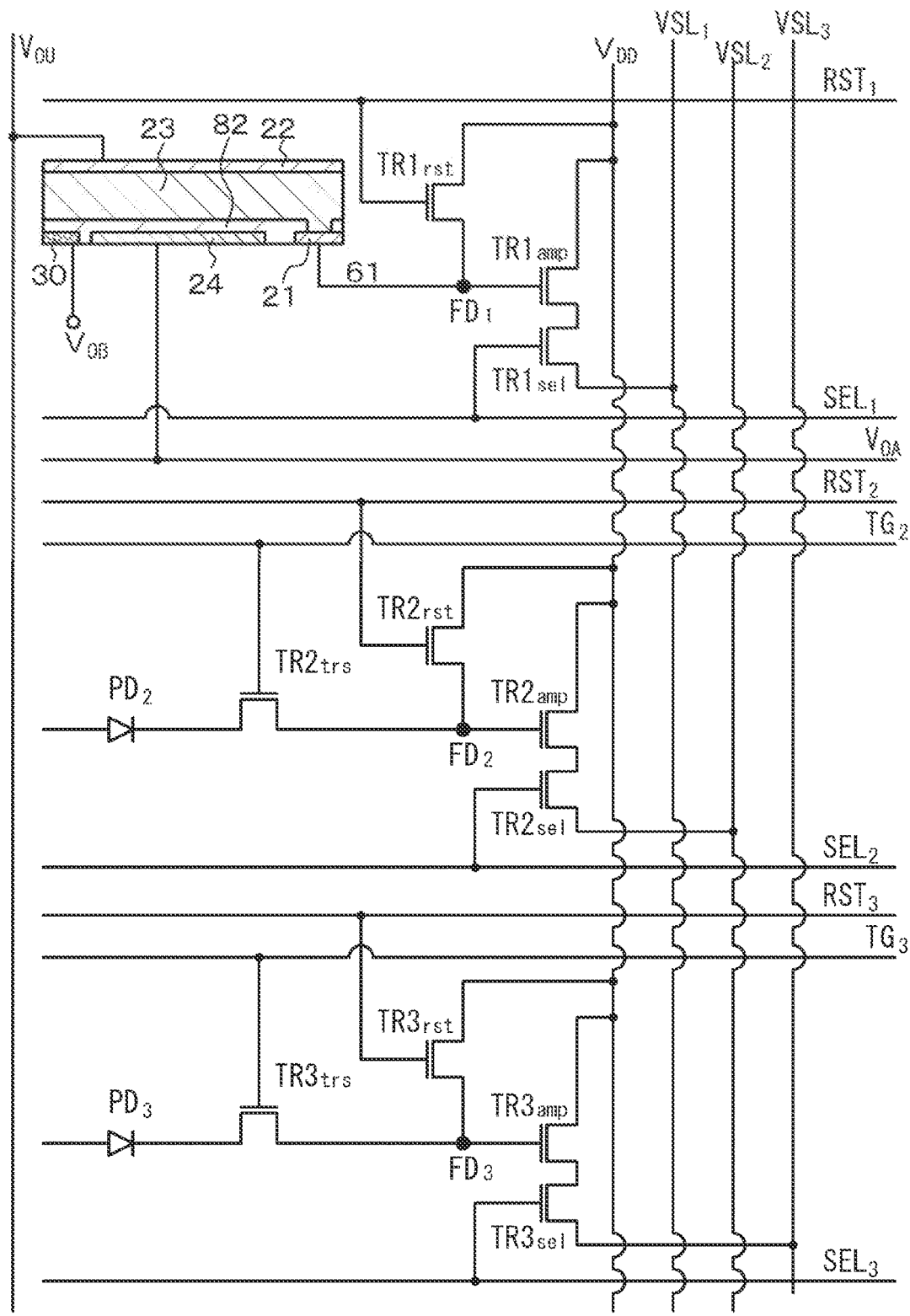
FIG. 10 is an equivalent circuit diagram of the imaging device and the stacked type imaging device of the working example 1.

The working example 1 relates to an imaging device of the present disclosure and a solid-state image sensor according to the second form of the present disclosure. An arrangement state of a charge accumulating electrode, a first isolation electrode, a second isolation electrode, and a first electrode in the solid-state image sensor of the working example 1 are schematically depicted in FIG. 1. Further, a schematic partial sectional view of the imaging device and the stacked type imaging device of the working example 1 is depicted in FIG. 8, and equivalent circuit diagrams of the imaging device and the stacked type imaging device of the working example 1 are depicted in each of FIGS. 9 and 10. It is to be noted that FIG. 8 is a schematic partial sectional view taken along a dot-dash line A-A depicted in FIG. 1.

It is to be noted that, in order to simplify the drawings, various imaging device components positioned below an interlayer insulating layer hereinafter described are sometimes collectively denoted by reference numeral 91 for the convenience of illustration. Further, in FIG. 1, a driving circuit (where a value $V_{ES-1}$ is fixed) is added to one imaging device, and another driving circuit (where the value $V_{ES-1}$ changes to another value $V_{ES-1}'$) is added to a different one imaging device.

The imaging device (photoelectric conversion device) 11 of the working example 1 includes a first electrode 21, a charge accumulating electrode 24 arranged with a space from the first electrode 21, an isolation electrode 30 arranged with a space from the first electrode 21 and the charge accumulating electrode 24 and surrounding the charge accumulating electrode 24, a photoelectric conversion layer 23 formed in contact with the first electrode 21 and above the charge accumulating electrode 24 with an insulating layer 82 interposed therebetween, and a second electrode 22 formed on the photoelectric conversion layer 23, in which the isolation electrode 30 includes a first isolation electrode 31A and a second isolation electrode 31B arranged with a space from the first isolation electrode 31A, and the first isolation electrode 31A is positioned between the first electrode 21 and the second isolation electrode 31B.

Further, the solid-state image sensor of the working example 1 includes a stacked type imaging device including at least one imaging device 11 of the working example 1. In particular, at least one lower imaging device 13 or 15 is provided below the imaging device 11 of the working example 1, and the wavelength of light that is received by the imaging device 11 and the wavelength of light that is received by the lower imaging device 13 or 15 are different from each other. In this case, two lower imaging devices 13 and 15 are stacked.

The second electrode 22 positioned on the light incidence side is made common to a plurality of imaging devices 11 except the imaging device of the working example 3 hereinafter described. In particular, the second electrode 22 is what is generally called a solid electrode. The photoelectric conversion layer 23 is made common to the plurality of imaging devices 11. In other words, a single photoelectric conversion layer 23 is formed for the plurality of imaging devices 11.

The stacked type imaging device of the working example 1 includes at least one of the imaging device 11 of the working example 1 or an imaging device of the working example 3 hereinafter described (in particular, in the working example 1, the stacked type imaging device includes one imaging device 11 of the working example 1 or one imaging device 11 of the working example 3 hereinafter described).

The first isolation electrode 31A and the second isolation electrode 31B are provided in a region that is opposed to a region of the photoelectric conversion layer 23 positioned between adjacent ones of the imaging devices 11 with an insulating layer 82 interposed therebetween. In particular, the first isolation electrode 31A and the second isolation electrode 31B are a lower first isolation electrode and a lower second isolation electrode, respectively. Although the first isolation electrode 31A and the second isolation electrode 31B are formed in a level same as that of the first electrode 21 or the charge accumulating electrode 24, they may be formed in different levels.

The stacked type imaging device of the working example 1 further includes a control portion provided on a semiconductor substrate and including a driving circuit, and the first electrode 21, the second electrode 22, the charge accumulating electrode 24, the first isolation electrode 31A, and the second isolation electrode 31B are connected to the driving circuit. Wiring connected to the second isolation electrode 31B is made common suitably to a plurality of imaging devices such that, for the plurality of imaging devices, the second isolation electrode 31B is controlled simultaneously. Alternatively, the second isolation electrode 31B is suitably made common to a plurality of imaging devices such that, for the plurality of imaging devices, the second isolation electrode 31B is controlled simultaneously. On the other hand, the first isolation electrodes 31A are controlled separately from each other in the imaging devices.

For example, the first electrode 21 is brought to positive potential while the second electrode 22 is brought to negative potential such that electrons generated by photoelectric conversion by the photoelectric conversion layer 23 are read out into a first floating diffusion layer $FD_1$. This similarly applies to other working examples. It is to be noted that, in a form in which the first electrode 21 is brought to negative potential while the second electrode 22 is brought to positive potential such that positive holes generated on the basis of photoelectric conversion by the photoelectric conversion layer 23 are read out into the first floating diffusion layer $FD_1$, it is sufficient if the high potential and the low potential described below are reversed.

Then, during operation of the imaging device 11, that is, during a charge accumulation period, a reset operation period, and a charge transfer period, the potential of the first isolation electrode 31A has a fixed value $V_{ES-1}$, and the potential of the second isolation electrode 31B also has a fixed value $V_{ES-2}$ Alternatively, the potential of the first isolation electrode 31A changes from the fixed value $V_{ES-1}$ to another value $V_{ES-1}'$ while the potential of the second isolation electrode 31B has the fixed value $V_{ES-2}$. In particular, during a charge accumulation period and a reset operation period, the potential of the first isolation electrode 31A has the fixed value $V_{ES-1}$, and during a charge transfer period, the potential of the first isolation electrode 31A has the value $V_{ES-1}'$ [$EV_{ES-1}'>V_{ES-1}$, or $(V_{32}-V_{ES-1}')<(V_{31}-V_{ES-1})$]). On the other hand, during a charge accumulation period, a reset operation period, and a charge transfer period, the potential of the second isolation electrode 31B has the fixed value $V_{ES-2}$ Further, in those cases, $V_{ES-1}>V_{ES-2}$ is satisfied, or else, $V_{ES-2}=V_{ES-1}$ is satisfied.

It is to be noted that it is possible to obtain each potential to be applied to various electrodes from a single power supply, by controlling the voltage using a resistor or the like, and even in a case where a device (for example, an operational amplifier) that controls the level of appropriate potential is used, it is possible to obtain each potential to be applied to various electrodes from a single power supply.

Further, the imaging device 11 of the working example 1 further includes a control portion provided on a semiconductor substrate 70 and including a driving circuit, in which
the first electrode 21 and the charge accumulating electrode 24 are connected to the driving circuit,
during a charge accumulation period, from the driving circuit, potential $V_{11}$ is applied to the first electrode 21, potential $V_{31}$ is applied to the charge accumulating electrode 24, and charge is accumulated into the photoelectric conversion layer 23,
during a charge transfer period, from the driving circuit, potential $V_{12}$ is applied to the first electrode 21, potential $V_{32}$ is applied to the charge accumulating electrode 24, and charge accumulated in the photoelectric conversion layer 23 is read out into the control portion via the first electrode 21. However, since the potential of the first electrode 21 is set higher than the potential of the second electrode 22, $$V_{31} \geq V_{11} \text{ and } V_{32} < V_{12}$$

are satisfied.

In the following, operation of the solid-state image sensor of the working example 1 is described with reference to FIGS. 2A, 2B, 3A, 3B, 4A, 4B, 5A, 5B, 5C, 6A, and 6B; the reading out method is a first mode reading out method. It is to be noted that, in the figures specified above, the potential is indicated by a height in the vertical direction, and as the height decreases, the potential becomes higher.

<Charge Accumulation Period>

Figure 2A:
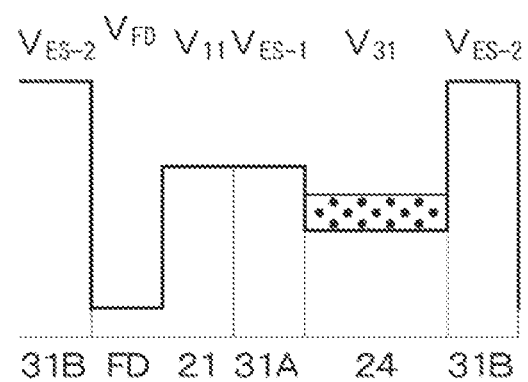
FIGS. 2A and 2B are views schematically depicting potential of each electrode in the imaging device of the working example 1.
Figure 5A:
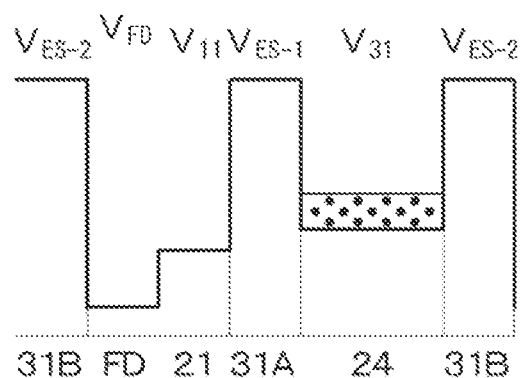
FIGS. 5A, 5B, and 5C are views schematically depicting potential of each electrode in the imaging device of the working example 1.

In particular, during a charge accumulation period, from the driving circuit, the potential $V_{11}$ is applied to the first electrode 21; the potential $V_{31}$ is applied to the charge accumulating electrode 24; the potential $V_{ES-1}$ is applied to the first isolation electrode 31A; and the potential $V_{ES-2}$ is applied to the second isolation electrode 31B. Further, the potential $V_{21}$ is applied to the second electrode 22. Thus, charge (electrons, schematically depicted by black points) is accumulated into the photoelectric conversion layer 23. An accumulation state of charge immediately before an end of a charge accumulation period is schematically depicted in FIG. 2A or 5A. Electrons generated by photoelectric conversion are attracted to the charge accumulating electrode 24 and stay in a region of the photoelectric conversion layer 23 opposed to the charge accumulating electrode 24. In other words, charge is accumulated into the photoelectric conversion layer 23. Since $V_{31}>V_{11}$ holds, electrons generated in the inside of the photoelectric conversion layer 23 do not move toward the first electrode 21. Further, since the potential $V_{31}$ of the charge accumulating electrode 24 is higher than the potential $V_{ES-1}$ of the first isolation electrode 31A and the potential $V_{ES-2}$ of the second isolation electrode 31B, electrons generated in the inside of the photoelectric conversion layer 23 do not move toward the first isolation electrode 31A and the second isolation electrode 31B either. In other words, a flow of charge generated by photoelectric conversion into an adjacent imaging device 11 can be reduced. As the time of photoelectric conversion elapses, the potential in the region of the photoelectric conversion layer 23 opposed to the charge accumulating electrode 24 has an increasingly negative side value. At a later stage of the charge accumulation period, reset operation is performed. Consequently, the potential of the first floating diffusion layer $FD_1$ is reset, and the potential ($V_{FD}$) of the first floating diffusion layer $FD_1$ becomes the potential $V_{DD}$ of the power supply.

Here, in the example depicted in FIG. 2A, $V_{ES-1}>V_{ES-2}$ is satisfied, and in the example depicted in FIG. 5A, $V_{ES-1}=V_{ES-2}$ is satisfied.

<Charge Transfer Period>

After completion of the reset operation, a charge transfer period is started. During the charge transfer period, from the driving circuit, potential $V_{12}$ is applied to the first electrode 21; the potential $V_{32}$ is applied to the charge accumulating electrode 24; the potential $V_{ES-1}$ or the potential $V_{ES-1}'$ is applied to the first isolation electrode 31A; and the potential $V_{ES-2}$ is applied to the second isolation electrode 31B. Further, potential $V_{22}$ is applied to the second electrode 22. Thus, charge accumulated in the photoelectric conversion layer 23 of the imaging device 11 is read out. An accumulation state of charge immediately before an end of the charge transfer period is schematically depicted in FIGS. 2B, 3A, 3B, 4A, 4B, 5B, 5B, 6A, and 6B. In particular, electrons staying in the region of the photoelectric conversion layer 23 opposed to the charge accumulating electrode 24 are read out to the first electrode 21 and further to the first floating diffusion layer $FD_1$. In other words, the charge accumulated in the photoelectric conversion layer 23 is read out to the control portion. Since the potential of the first isolation electrode 31A is lower than the potential of the first electrode 21 but higher than the potential of the charge accumulating electrode 24, electrons generated in the inside of the photoelectric conversion layer 23 flow to the first electrode 21 but do not move toward the second isolation electrode 31B. In other words, a flow of charge generated by photoelectric conversion into an adjacent imaging device 11 can be reduced.

Figure 2B:
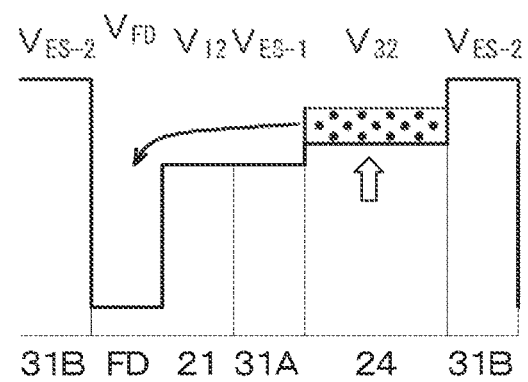
Figure 3A:
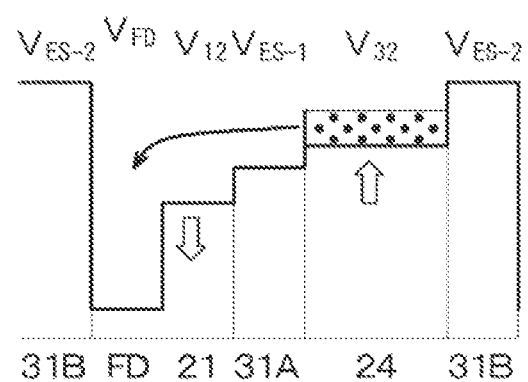
FIGS. 3A and 3B are views schematically depicting potential of each electrode in the imaging device of the working example 1.
Figure 3B:
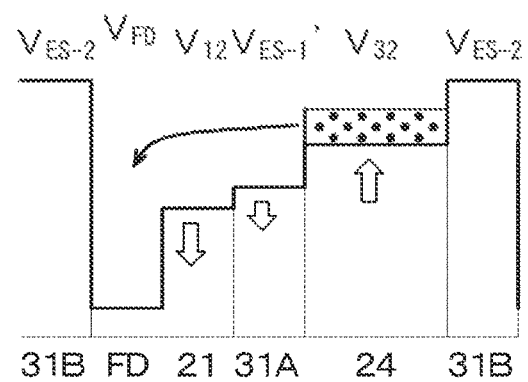
Figure 4A:
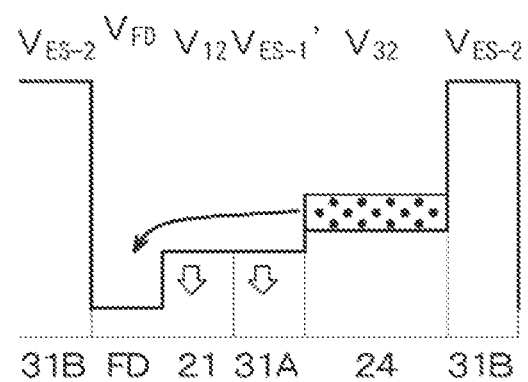
FIGS. 4A and 4B are views schematically depicting potential of each electrode in the imaging device of the working example 1.
Figure 4B:
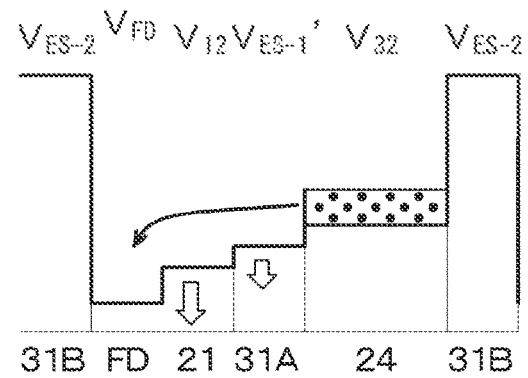

Here, in the example depicted in FIG. 2B, $$V_{FD} > V_{12} = V_{ES\text{-}1} > V_{32} > V_{ES\text{-}2} \text{ and } V_{31} > V_{32}$$

are satisfied. Moreover, in the example depicted in FIG. 3A, $$V_{FD} > V_{12} > V_{ES\text{-}1} > V_{32} > V_{ES\text{-}2} \text{ and } V_{31} > V_{32}$$

are satisfied. Further, in the example depicted in FIG. 3B, $$V_{FD} > V_{12} > V_{ES\text{-}1}' > V_{32} > V_{ES\text{-}2}, V_{ES\text{-}1}' > V_{ES\text{-}1}, \text{ and } V_{31} > V_{32}$$

are satisfied. Further, in the example depicted in FIG. 4A, $$V_{FD} > V_{12} = V_{ES\text{-}1}' > V_{32}(=V_{31}) > V_{ES\text{-}2} \text{ and } V_{ES\text{-}1}' > V_{ES\text{-}1}$$

are satisfied. Further, in the example depicted in FIG. 4B, $$V_{FD} > V_{12} > V_{ES\text{-}1}' > V_{32} > V_{ES\text{-}2}, V_{ES\text{-}1}' > V_{ES\text{-}1}, \text{ and } V_{31} > V_{32}$$

are satisfied.

Figure 5B:
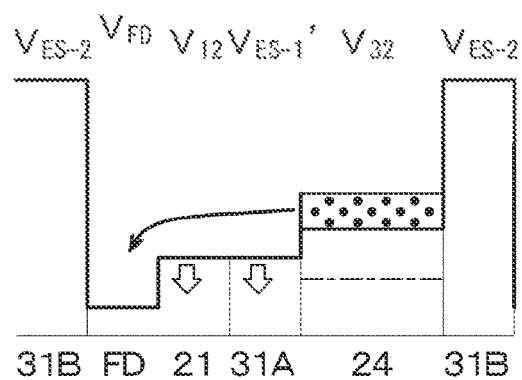
Figure 5C:
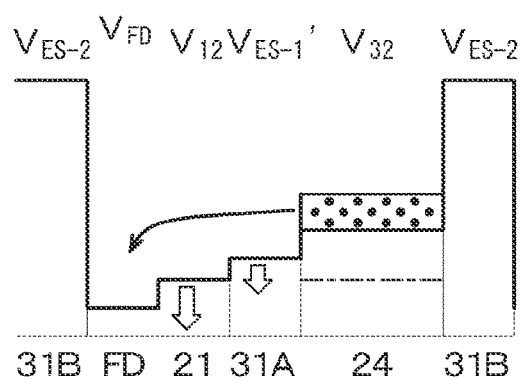
Figure 6A:
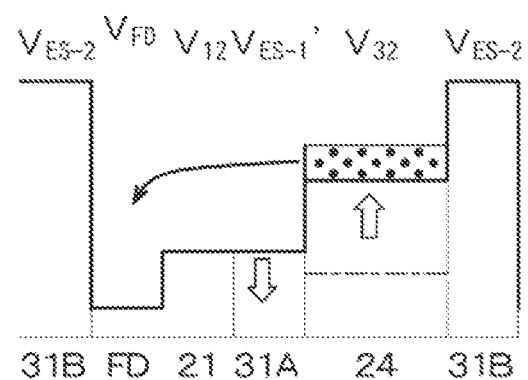
FIGS. 6A and 6B are views schematically depicting potential of each electrode in the imaging device of the working example 1.
Figure 6B:
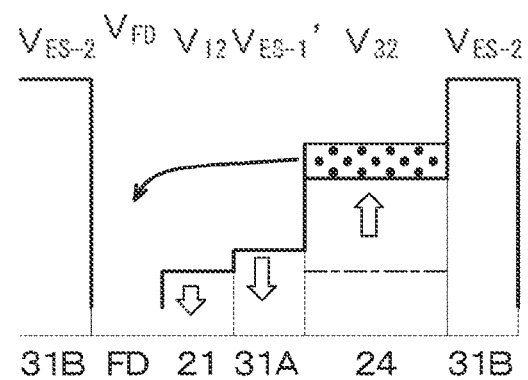

In the meantime, in the example depicted in FIG. 5B, $$V_{FD} > V_{12} = V_{ES\text{-}1}' > V_{32}(=V_{31}) > V_{ES\text{-}2}$$

is satisfied. Further, in the example depicted in FIG. 5C, $$V_{FD} > V_{12} > V_{ES\text{-}1}' > V_{32}(=V_{31}) > V_{ES\text{-}2}$$

is satisfied. Further, in the example depicted in FIG. 6A, $$V_{FD} > V_{12}(=V_{11}) = V_{ES\text{-}1}' > V_{32} > V_{ES\text{-}2} \text{ and } V_{31} > V_{32}$$

are satisfied. Furthermore, in the example depicted in FIG. 6B, $$V_{FD} > V_{12}(=V_{11}) > V_{ES\text{-}1}' > V_{32} > V_{ES\text{-}2} \text{ and } V_{31} > V_{32}$$

are satisfied.

Such a series of operation of charge accumulation, reset operation, and charge transfer as described above are completed with this.

Operation of an amplification transistor $TR1_{amp}$ and that of a selection transistor $TR1_{sel}$ after electrons are read into the first floating diffusion layer $FD_1$ are the same as the operation of such conventional transistors. Such a series of operation as charge accumulation, reset operation, and charge transfer of the second imaging device 13 and the third imaging device 15 is similar to such a conventional series of operation as charge accumulation, reset operation, and charge transfer. Reset noise of the first floating diffusion layer $FD_1$ can be removed by a correlated double sampling (CDS, Correlated Double Sampling) process similarly as in the past.

As described above, since, in the imaging device or the solid-state image sensor of the working example 1, the isolation electrode includes the first isolation electrode and the second isolation electrode arranged with a space from the first isolation electrode and the first isolation electrode is positioned between the first electrode and the second isolation electrode, during operation of the imaging device, movement of charge between adjacent imaging devices can be reduced with certainty under the control of the first isolation electrode and the second isolation electrode. Besides, the charge accumulated in the photoelectric conversion layer can be transferred smoothly to the first electrode. Further, improvement of the saturation charge amount in that the saturation charge amount does not decrease and a balance between reduction of remaining charge upon charge transfer and reduction of occurrence of blooming can be achieved, and quality deterioration does not occur with a captured video (image).

Figure 7A:
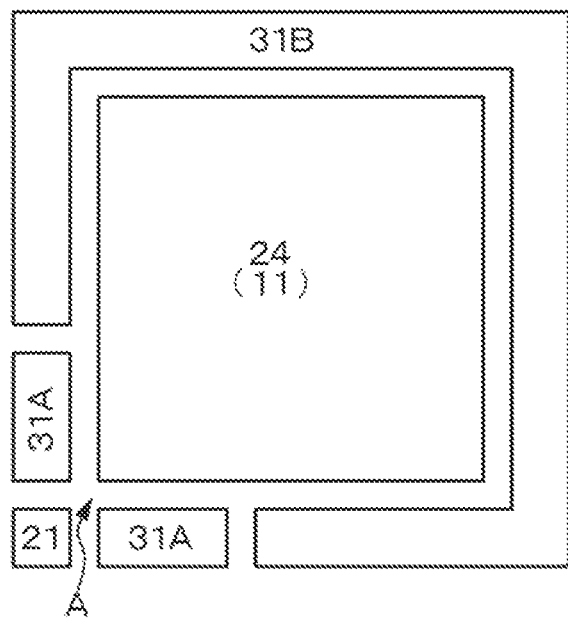
FIGS. 7A and 7B are each a view depicting part of each electrode in an enlarged scale for illustrating a positional relation of the electrodes in the imaging device of the working example 1 and a view depicting part of each electrode in an enlarged scale for illustrating a positional relation of the electrodes in an imaging device in which a first isolation electrode is not provided.
Figure 7B:
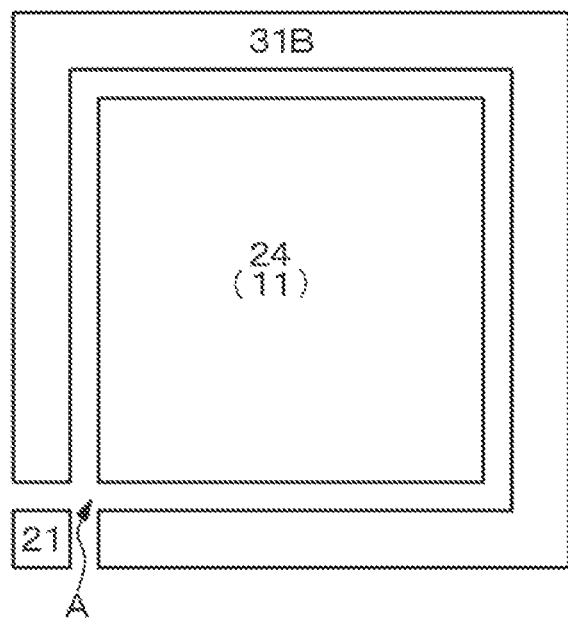

A view in which part of the electrodes is expanded for illustrating a positional relation of the electrodes in the imaging device of the working example 1 is depicted in FIG. 7A. Meanwhile, a view in which part of the electrodes is expanded for illustrating a positional relation of the electrodes in an imaging device in which the first isolation electrode 31A is not provided is depicted in FIG. 7B. In the example depicted in FIG. 7B, during a charge transfer period, $V_{12} > V_{32} > V_{ES\text{-}2}$ is satisfied. Accordingly, the change of the potential in a region sandwiched by the first electrode 21 and the charge accumulating electrode 24 (in FIGS. 7A and 7B, indicated by a "region A") is, as a result of a simulation, such that it decreases once from the charge accumulating electrode 24 toward the region A and then increases from the region A toward the first electrode 21. In other words, in the region A, a potential barrier (in the case where it is viewed from electrons, a "mountain of potential") electrons cannot get over is generated. Accordingly, there is a possibility that electrons do not move smoothly from the charge accumulating electrode 24 to the first electrode 21. On the other hand, in the example depicted in FIG. 7A, during a charge transfer period, the relation of $V_{12} > V_{ES\text{-}1} > V_{32} > V_{ES\text{-}2}$ or $V_{12} > V_{ES\text{-}1}' > V_{32} > V_{ES\text{-}2}$ is satisfied. Accordingly, as a result of a simulation, a result is obtained that the change of the potential in the region A sandwiched between the first electrode 21 and the charge accumulating electrode 24 is a change of smoothly increasing from the charge accumulating electrode 24 to the region A and to the first electrode 21. Accordingly, during operation of the imaging device, movement of charge (electrons) between adjacent imaging devices can be reduced with certainty. Besides, charge accumulated in the photoelectric conversion layer 23 can be transferred smoothly to the first electrode 21, and a captured video (image) does not suffer from quality deterioration.

Besides, in the imaging device of the working example 1 or of any of working examples 2 to 13, since the charge accumulating electrode which is arranged with a space from the first electrode and is arranged opposed to the photoelectric conversion layer with the insulating layer interposed therebetween is provided, when light is applied upon the photoelectric conversion portion and photoelectrically converted by the photoelectric conversion portion, a kind of capacitor is formed from the photoelectric conversion layer, the insulating layer, and the charge accumulating electrode, and charge can be stored into the photoelectric conversion layer. Therefore, it is possible to fully empty the charge accumulation portion and erase the charge, at the time of start of exposure. As a result, occurrence of such a phenomenon that kTC noise becomes high and random noise gets worse, giving rise to degradation of the imaging picture quality, can be reduced. Besides, since all pixels can be reset all at once, what is generally called a global shutter function can be implemented.

In the imaging device 11 of the working example 1, in a region opposed to the region 23' of the photoelectric conversion layer 23 positioned between adjacent imaging devices 11 with the insulating layer 82 interposed therebetween, the first isolation electrode 31A and the second isolation electrode 31B are formed. It is to be noted that the first isolation electrode 31A and the second isolation electrode 31B are sometimes collectively referred to as an "isolation electrode 30." In other words, an isolation electrode 30 is formed under a portion 82' of the insulating layer 82 in the region sandwiched between a charge accumulating electrode 24 and another charge accumulating electrode 24 each configuring adjacent imaging devices. The isolation electrode 30 is provided with a space from the charge accumulating electrode 24 and is provided with a space also from the first electrode 21. Alternatively, in other words, the isolation electrode 30 is provided with a space from the charge accumulating electrode 24 and is arranged opposed to the region 23' of the photoelectric conversion layer with the insulating layer 82 interposed therebetween.

An imaging device in regard to which the isolation electrode 30 as well as a connection hole 34, a pad portion 33, and wiring $V_{OB}$ hereinafter described are not depicted is referred to as an "imaging device having the basic structure of the present disclosure" for the convenience of description. FIG. 8 is a schematic partial sectional view of the imaging device having the basic structure of the present disclosure, and FIGS. 16A, 16B, 17A, 17B, 18, 19, 20, 21, 22, 23, 26, 30, 33, 34, 37, 39, 40, 42, 43, 44, 45, 46, and 47 are schematic partial sectional views of various modifications of the imaging device having the basic structure of the present disclosure depicted in FIG. 8. In the figure, illustration of the isolation electrodes and so forth is omitted.

The imaging device 11 of the working example 1 further includes a semiconductor substrate (more particularly, silicon semiconductor layer) 70, and the photoelectric conversion portion is disposed above the semiconductor substrate 70. The imaging device 11 of the working example 1 further includes a control portion that is provided on the semiconductor substrate 70 and includes a driving circuit to which the first electrode 21, the second electrode 22, the charge accumulating electrode 24, and the isolation electrode 30 are connected. Here, the light incidence face of the semiconductor substrate 70 is the upper side, and the opposite side of the semiconductor substrate 70 is the lower side. Below the semiconductor substrate 70, a wiring layer 62 including more than one wiring is provided.

On the semiconductor substrate 70, at least a floating diffusion layer $FD_1$ and an amplification transistor $TR1_{amp}$ that configure the control portion are provided, and the first electrode 21 is connected to the floating diffusion layer $FD_1$ and the gate portion of the amplification transistor $TR1_{amp}$. On the semiconductor substrate 70, a reset transistor $TR1_{rst}$ and a selection transistor $TR1_{sel}$ that configure the control portion are further provided. The floating diffusion layer $FD_1$ is connected to one of the source/drain regions of the reset transistor $TR1_{rst}$, and the other of the source/drain regions of the amplification transistor $TR1_{amp}$ is connected to the one of the source/drain regions of the selection transistor $TR1_{sel}$ while the other of the source/drain regions of the selection transistor $TR1_{sel}$ is connected to a signal line $VSL_1$. The amplification transistor $TR1_{amp}$, the reset transistor $TR1_{rst}$, and the selection transistor $TR1_{sel}$ configure the driving circuit.

In the example depicted, a state in which the floating diffusion layer $FD_1$ and so forth are provided for one imaging device 11 is illustrated, but in the working example 2 hereinafter described, the floating diffusion layer $FD_1$ and so forth are shared by four imaging devices 11.

In particular, the imaging device and the stacked type imaging device of the working example 1 are an imaging device and a stacked type imaging device of the back-illuminated type, and are structured such that stacked are three imaging devices 11, 13, and 15 including a green light imaging device (hereinafter referred to as a "first imaging device") of the working example 1 of the first type that has sensitivity to green light and includes a green light photoelectric conversion layer of the first type that absorbs green light, a conventional blue light imaging device (hereinafter referred to as a "second imaging device") of the second type that has sensitivity to blue light and includes a blue light photoelectric conversion layer that absorbs blue light, and a conventional red light imaging device (hereinafter referred to as a "third imaging device") of the second type that has sensitivity to red light and includes a red light photoelectric conversion layer of the second type that absorbs red light. Here, the red light imaging device (third imaging device) 15 and the blue light imaging device (second imaging device) 13 are provided in the semiconductor substrate 70 such that the second imaging device 13 is positioned on the light incidence side with respect to the third imaging device 15. Meanwhile, the green light imaging device (first imaging device) 11 is provided above the blue light imaging device (second imaging device) 13. One pixel is configured from a stacked structure of the first imaging device 11, the second imaging device 13, and the third imaging device 15. No color filter is provided.

In the first imaging device 11, the first electrode 21 and the charge accumulating electrode 24 are formed with a space between each other on an interlayer insulating layer 81. Further, the isolation electrode 30 is formed with a space from the charge accumulating electrode 24 on the interlayer insulating layer 81. The interlayer insulating layer 81, the charge accumulating electrode 24, and the isolation electrode 30 are covered with the insulating layer 82. The photoelectric conversion layer 23 is formed on the insulating layer 82, and the second electrode 22 is formed on the photoelectric conversion layer 23. A protective layer 83 is formed over an overall area including the second electrode 22, and an on-chip microlens 90 is provided on the protective layer 83. The first electrode 21, the charge accumulating electrode 24, the isolation electrode 30, and the second electrode 22 include, for example, a transparent electrode made of ITO (work function: approximately 4.4 eV). The photoelectric conversion layer 23 includes a layer that contains a known organic photoelectric conversion material at last having sensitivity to green light (for example, a rhodamine dye, a melacianin pigment, or an organic material such as quinacridone). In addition, the photoelectric conversion layer 23 may be configured such that it further includes a material layer suitable for charge accumulation. In other words, a material layer suitable for charge accumulation may further be formed between the photoelectric conversion layer 23 and the first electrode 21 (for example, in a connection portion 67). The interlayer insulating layer 81, the insulating layer 82, and the protective layer 83 are configured from a known insulating material (for example, $SiO_2$ or SiN). The photoelectric conversion layer 23 and the first electrode 21 are connected to each other by a connection portion 67 provided on the insulating layer 82. In the connection portion 67, the photoelectric conversion layer 23 extends. In particular, the photoelectric conversion layer 23 extends in an opening 84 provided in the insulating layer 82 and is connected to the first electrode 21.

The charge accumulating electrode 24 is connected to the driving circuit. In particular, the charge accumulating electrode 24 is connected to a vertical driving circuit 112, which configures the driving circuit, through a connection hole 66 provided in the interlayer insulating layer 81, a pad portion 64, and wiring $V_{OA}$.

Also the isolation electrode 30 is connected to the driving circuit. In particular, the isolation electrode 30 is connected to the vertical driving circuit 112, which configures the driving circuit, through the connection hole 34 provided in the interlayer insulating layer 81, the pad portion 33, and the wiring $V_{OB}$. More particularly, the isolation electrode 30 is formed in a region (region 82' of the insulating layer) that is opposed to the region 23' of the photoelectric conversion layer 23 with the insulating layer 82 interposed therebetween. In other words, the isolation electrode 30 is provided below the portion 82' of the insulating layer 82 in a region sandwiched by a charge accumulating electrode 24 and another charge accumulating electrode 24 that each configure adjacent imaging devices. The isolation electrode 30 is provided with a space from the charge accumulating electrode 24. Alternatively, in other words, the isolation electrode 30 is provided with a space from the charge accumulating electrode 24, and the isolation electrode 30 is arranged opposed to the region 23' of the photoelectric conversion layer 23 with the insulating layer 82 interposed therebetween.

The size of the charge accumulating electrode 24 is greater than that of the first electrode 21. Where the area of the charge accumulating electrode 24 is presented by $s_1'$ and the area of the first electrode 21 is represented by $s_1$, though not restrictive, it is preferable to satisfy $$4 \leq s_1'/s_1,$$

and in the imaging device of the working example 1 or any of the working examples hereinafter described, though not restrictive, for example, $$s_1'/s_1 = 8$$

is satisfied. It is to be noted that, in the working examples 7 to 10 hereinafter described, the sizes of the three photoelectric conversion portion segments $20_1$, $20_2$, and $20_3$ are made equal to each other and formed so as to have same planar shapes.

A device isolation region 71 is formed on a first face (front face) 70A side of the semiconductor substrate 70, and further, an oxide film 72 is formed on the first face 70A of the semiconductor substrate 70. Further, the reset transistor $TR1_{rst}$, the amplification transistor $TR1_{amp}$, and the selection transistor $TR1_{sel}$ that configure the control portion of the first imaging device 11 are provided on the first face side of the semiconductor substrate 70, and further, the first floating diffusion layer $FD_1$ is provided.

The reset transistor $TR1_{rst}$ includes the gate portion 51, a channel formation region 51A, and source/drain regions 51B and 51C. The gate portion 51 of the reset transistor $TR1_{rst}$ is connected to a reset line $RST_1$, and one source/drain region 51C of the reset transistor $TR1_{rst}$ serves also as the first floating diffusion layer $FD_1$, and the other source/drain region 51B is connected to the power supply $V_{DD}$.

The first electrode 21 is connected to the one source/drain region 51C (first floating diffusion layer $FD_1$) of the reset transistor $TR1_{rst}$ through a connection hole 65 provided in the interlayer insulating layer 81, a pad portion 63, a contact hole portion 61 formed in the semiconductor substrate 70 and the interlayer insulating layer 76, and the wiring layer 62 formed on the interlayer insulating layer 76.

The amplification transistor $TR1_{amp}$ includes a gate portion 52, a channel formation region 52A, and source/drain regions 52B and 52C. The gate portion 52 is connected to the first electrode 21 and the one source/drain region 51C (first floating diffusion layer $FD_1$) of the reset transistor $TR1_{rst}$ through the wiring layer 62. Meanwhile, one source/drain region 52B is connected to the power supply $V_{DD}$.

The selection transistor $TR1_{sel}$ includes a gate portion 53, a channel formation region 53A, and source/drain regions 53B and 53C. The gate portion 53 is connected to a selection line $SEL_1$. Further, one source/drain region 53B shares a region with the other source/drain region 53C configuring the amplification transistor $TR1_{amp}$, and the other source/drain region 53C is connected to the signal line (data output line) $VSL_1$ (117).

The second imaging device 13 includes, as a photoelectric conversion layer, an n-type semiconductor region 41 provided on the semiconductor substrate 70. A gate portion 45 of a transfer transistor $TR2_{trs}$ including a vertical transistor extends to the n-type semiconductor region 41 and is connected to a transfer gate line $TG_2$. Further, a second floating diffusion layer $FD_2$ is provided in a region 45C of the semiconductor substrate 70 in the proximity of the gate portion 45 of the transfer transistor $TR2_{trs}$. Charge accumulated in the n-type semiconductor region 41 is read out to the second floating diffusion layer $FD_2$ through a transfer channel formed along the gate portion 45.

In the second imaging device 13, a reset transistor $TR2_{rst}$, an amplification transistor $TR2_{amp}$, and a selection transistor $TR2_{sel}$ that configure a control portion of the second imaging device 13 are further provided on the first face side of the semiconductor substrate 70.

The reset transistor $TR2_{rst}$ includes a gate portion, a channel formation region, and source/drain regions. The gate portion of the reset transistor $TR2_{rst}$ is connected to a reset line $RST_2$, and one of the source/drain regions of the reset transistor $TR2_{rst}$ is connected to the power supply $V_{DD}$ while the other of the source/drain regions serves also as the second floating diffusion layer $FD_2$.

The amplification transistor $TR2_{amp}$ includes a gate portion, a channel formation region, and source/drain regions. The gate portion is connected to the other one of the source/drain regions (second floating diffusion layer $FD_2$) of the reset transistor $TR2_{rst}$. Meanwhile, the one of the source/drain regions of the amplification transistor $TR2_{amp}$ is connected to the power supply $V_{DD}$.

The selection transistor $TR2_{sel}$ includes a gate portion, a channel formation region, and source/drain regions. The gate portion is connected to a selection line $SEL_2$. Meanwhile, one of the source/drain regions shares a region with the other one of the source/drain regions configuring the amplification transistor $TR2_{amp}$, and the other one of the source/drain regions of the selection transistor $TR2_{sel}$ is connected to a signal line (data output line) $VSL_2$.

The third imaging device 15 includes, as a photoelectric conversion layer, an n-type semiconductor region 43 provided on the semiconductor substrate 70. A gate portion 46 of a transfer transistor $TR3_{trs}$ is connected to a transfer gate line $TG_3$. Further, a third floating diffusion layer $FD_3$ is provided in a region 46C of the semiconductor substrate 70 in the proximity of the gate portion 46 of the transfer transistor $TR3_{trs}$. Charge accumulated in the n-type semiconductor region 43 is read out to the third floating diffusion layer $FD_3$ through a transfer channel 46A formed along the gate portion 46.

In the third imaging device 15, a reset transistor $TR3_{rst}$, an amplification transistor $TR3_{amp}$, and a selection transistor $TR3_{sel}$ configuring a control portion of the third imaging device 15 are further provided on the first face side of the semiconductor substrate 70.

The reset transistor $TR3_{rst}$ includes a gate portion, a channel formation region, and source/drain regions. The gate portion of the reset transistor $TR3_{rst}$ is connected to a reset line $RST_3$, and one of the source/drain regions of the reset transistor $TR3_{rst}$ is connected to the power supply $V_{DD}$ while the other one of the source/drain region serves also as the third floating diffusion layer $FD_3$.

The amplification transistor $TR3_{amp}$ includes a gate portion, a channel formation region, and source/drain regions. The gate portion is connected to the other one of the source/drain regions (third floating diffusion layer FDA of the reset transistor $TR3_{rst}$. Meanwhile, the one of the source/drain regions of the amplification transistor $TR3_{amp}$ is connected to the power supply $V_{DD}$.

The selection transistor $TR3_{sel}$ includes a gate portion, a channel formation region, and source/drain regions. The gate portion is connected to a selection line $SEL_3$. Meanwhile, one of the source/drain regions of the selection transistor $TR3_{sel}$ shares a region with the other one of the source/drain regions configuring the amplification transistor $TR3_{amp}$, and the other one of the source/drain regions of the selection transistor $TR3_{sel}$ is connected to a signal line (data output line) $VSL_3$.

The reset lines $RST_1$, $RST_2$, and $RST_3$, the selection lines $SEL_1$, $SEL_2$, and $SEL_3$, and the transfer gate lines $TG_2$ and $TG_3$ are connected to the vertical driving circuit 112 that configures a driving circuit, and the signal lines (data output lines) $VSL_1$, $VSL_2$, and $VSL_3$ are connected to a column signal processing circuit 113 that configures a driving circuit.

A $p^+$ layer 44 is provided between the n-type semiconductor region 43 and the surface 70A of the semiconductor substrate 70 and reduces generation of dark current. Another $p^+$ layer 42 is formed between the n-type semiconductor region 41 and the n-type semiconductor region 43, and further, part of a side face of the n-type semiconductor region 43 is surrounded by the $p^+$ layer 42. A further $p^+$ layer 73 is formed on the side of the rear face 70B of the semiconductor substrate 70, and an $HfO_2$ film 74 and an insulating film 75 are formed from the $p^+$ layer 73 to a portion at which a contact hole portion 61 in the inside of the semiconductor substrate 70 is to be formed. Although wiring is formed in the interlayer insulating layer 76 over a plurality of layers, illustration of such wiring is omitted.

The $HfO_2$ film 74 is a film having negative fixed charge, and generation of dark current can be reduced by providing such a film as just described. It is to be noted that it is also possible to use, in place of an $HfO_2$ film, an aluminum oxide ($Al_2O_3$) film, a zirconium oxide ($ZrO_2$) film, a tantalum oxide ($Ta_2O_5$) film, a titanium oxide ($TiO_2$) film, a lanthanum oxide ($La_2O_3$) film, a praseodymium oxide ($Pr_2O_3$) film, a cerium oxide ($CeO_2$) film, a neodymium oxide ($Nd_2O_3$) film, a promethium oxide ($Pm_2O_3$) film, a samarium oxide ($Sm_2O_3$) film, a europium oxide ($Eu_2O_3$) film, a gadolinium oxide (($Gd_2O_3$) film, a terbium oxide ($Tb_2O_3$) film, a dysprosium oxide ($Dy_2O_3$) film, a holmium oxide ($Ho_2O_3$) film, a thulium oxide ($Tm_2O_3$) film, an ytterbium oxide ($Yb_2O_3$) film, a lutetium oxide ($Lu_2O_3$) film, an yttrium oxide ($Y_2O_3$) film, a hafnium nitride film, an aluminum nitride film, a hafnium oxynitride, and an aluminum oxynitride. As a film formation method of the films mentioned, for example, a CVD method, a PVD method, and an ALD method can be listed.

Figure 11:
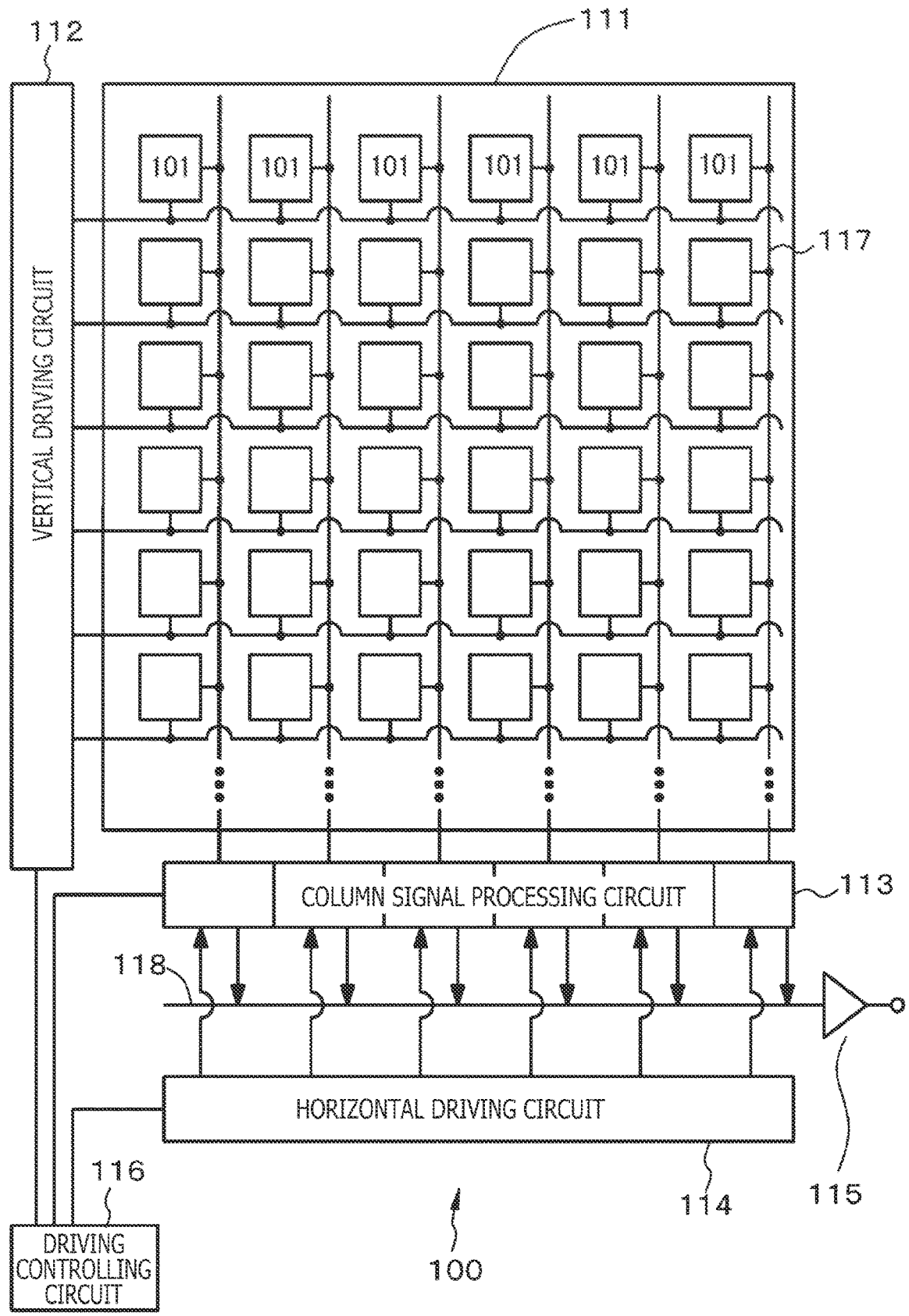
FIG. 11 is a conceptual view of the solid-state image sensor of the working example 1.

FIG. 11 depicts a conceptual diagram of the solid-state image sensor of the working example 1. The solid-state image sensor 100 of the working example 1 includes an imaging region 111 in which stacked type imaging devices 101 are arrayed in a two-dimensional array and a vertical driving circuit 112, a column signal processing circuit 113, a horizontal driving circuit 114, an outputting circuit 115, a driving controlling circuit 116 and so forth as driving circuits (peripheral circuits). Note that it is a matter of course that the circuits can include known circuits and can be configured using other circuit configurations (for example, various circuits used in a conventional CCD type solid-state image sensor or a conventional MOS type solid-state image sensor). It is to be noted that the reference numeral "101" is applied only for one row of the stacked type imaging devices 101 in FIG. 11.

The driving controlling circuit 116 generates a clock signal that serves as a reference for operation of the vertical driving circuit 112, the column signal processing circuit 113, and the horizontal driving circuit 114 and control signals for them on the basis of a vertical synchronizing signal, a horizontal synchronizing signal, and a master clock. Then, the generated clock signal and control signals are inputted to the vertical driving circuit 112, the column signal processing circuit 113, and the horizontal driving circuit 114.

The vertical driving circuit 112 includes, for example, a shift register and performs selection scanning of the stacked type imaging devices 101 of the imaging region 111 sequentially in a unit of row in the vertical direction. Then, a pixel signal (image signal) based on current (signal) generated according to a received light amount by each stacked type imaging device 101 is sent to the column signal processing circuit 113 through the signal line (data output line) 117 and a VSL.

The column signal processing circuit 113 is arranged, for example, for each column of the stacked type imaging devices 101 and performs signal processing such as noise removal and signal amplification for image signals outputted from the stacked type imaging devices 101 for one row, by using a signal from a black reference pixel (though not depicted, formed around the effective pixel region) for each imaging device. At the output stage of the column signal processing circuit 113, a horizontal selection switch (not depicted) is provided in connection to a horizontal signal line 118.

The horizontal driving circuit 114 includes, for example, a shift register and sequentially outputs a horizontal scanning pulse to sequentially select the column signal processing circuits 113 such that a signal is outputted from each of the column signal processing circuits 113 to the horizontal signal line 118.

The outputting circuit 115 performs signal processing for signals sequentially supplied from the column signal processing circuits 113 through the horizontal signal line 118 and outputs a resulting signal.

Figure 12:
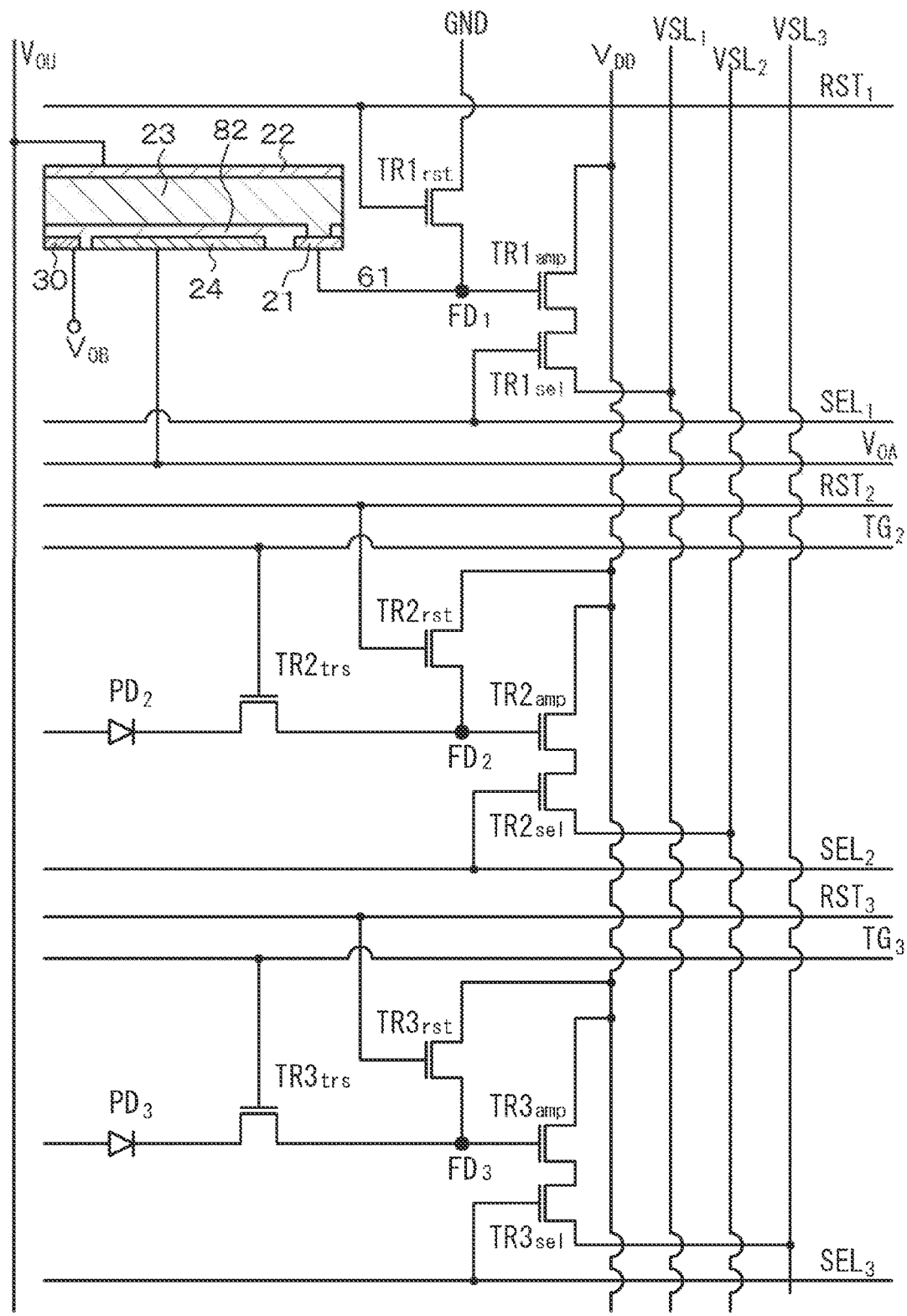
FIG. 12 is an equivalent circuit diagram of a modification of the imaging device and the stacked type imaging device of the working example 1 (modification 1 of the working example 1).

As indicated by FIG. 12 that depicts an equivalent circuit diagram of a modification (modification 1 of the working example 1) of the imaging device and the stacked type imaging device of the working example 1, the other source/drain region 51B of the reset transistor $TR1_{rst}$ may be grounded instead of being connected to the power supply $V_{DD}$.

The imaging device and the stacked type imaging device of the working example 1 can be produced, for example, by the following method. In particular, an SOI substrate is prepared first. Then, a first silicon layer is formed on the surface of the SOI substrate by an epitaxial growth method, and a $p^+$ layer 73 and an n-type semiconductor region 41 are formed on the first silicon layer. Then, a second silicon layer is formed on the first silicon layer by an epitaxial grow method, and a device isolation region 71, an oxide film 72, a $p^+$ layer 42, an n-type semiconductor region 43, and a $p^+$ layer 44 are formed on the second silicon layer. Further, various transistors and so forth that configure control portions of imaging devices are formed on the second silicon layer, and a wiring layer 62, an interlayer insulating layer 76, and various kinds of wiring are further formed on them, followed by the interlayer insulating layer 76 and a support substrate (not depicted) being pasted together. Thereafter, the SOI substrate is removed to expose the first silicon layer. It is to be noted that the surface of the second silicon layer corresponds to a surface 70A of the semiconductor substrate 70, and the surface of the first silicon layer corresponds to a rear face 70B of the semiconductor substrate 70. Further, the first silicon layer and the second silicon layer are collectively represented as the semiconductor substrate 70. Then, on the rear face 70B side of the semiconductor substrate 70, an opening for forming each contact hole portion 61 is formed, and an $HfO_2$ film 74, an insulating film 75, and a contact hole portion 61 are formed. Further, pad portions 63, 64, and 33, an interlayer insulating layer 81, connection holes 65, 66, and 34, first electrodes 21, charge accumulating electrodes 24, isolation electrodes 30, and an insulating layer 82 are formed. Then, the connection portion 67 is opened, and a photoelectric conversion layer 23, second electrodes 22, a protective layer 83, and on-chip microlenses 90 are formed. By the foregoing, the imaging device and the stacked type imaging device of the working example 1 can be obtained.

Figure 13:
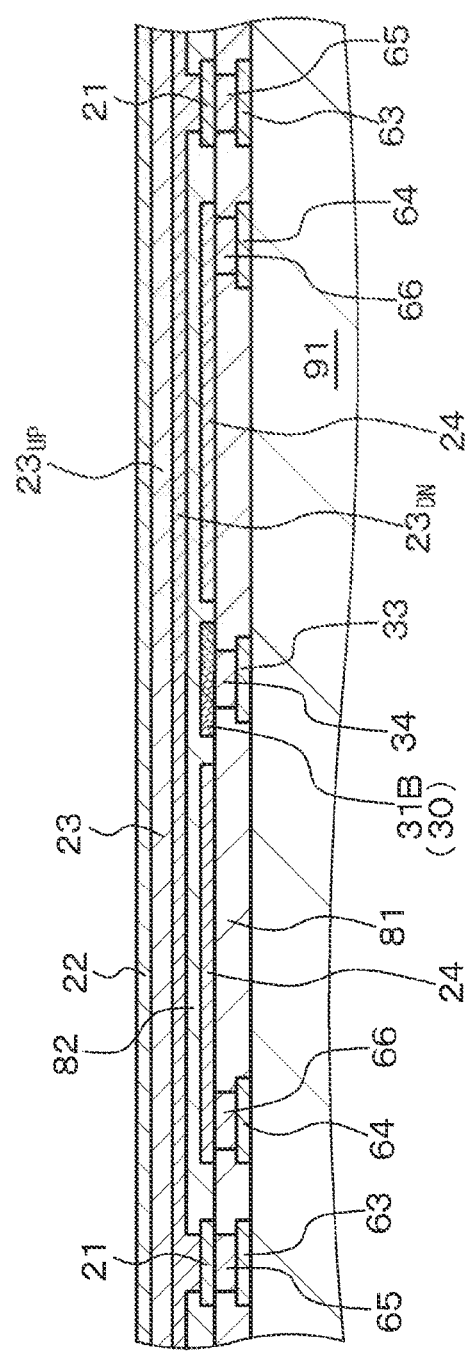
FIG. 13 is a schematic sectional view of a modification of the imaging device (two juxtaposed imaging devices are depicted) of the working example 1 (modification 2 of the working example 1).

Alternatively, although a schematic partial sectional view of a modification 2 of the working example 1) of the imaging device of the working example 1 (two imaging devices placed side by side are illustrated) is depicted in FIG. 13, the photoelectric conversion layer can be structured in a stacked structure of a lower layer semiconductor layer $23_{DN}$ and an upper layer photoelectric conversion layer $23_{UP}$. The upper layer photoelectric conversion layer $23_{UP}$ and the lower layer semiconductor layer $23_{DN}$ are made common to a plurality of imaging devices. In particular, in a plurality of imaging devices, the upper layer photoelectric conversion layer $23_{UP}$ and the lower layer semiconductor layer $23_{DN}$ each in the form of one layer are formed. By providing the lower layer semiconductor layer $23_{DN}$ in such a manner, for example, charge recombination upon charge accumulation can be prevented. Further, the charge transfer efficiency of charge accumulated in the photoelectric conversion layer 23 to the first electrode 21 can be increased. Further, charge generated in the photoelectric conversion layer 23 can be retained temporarily, and the timing and so forth of transfer of the charge can be controlled. Further, generation of dark current can be suppressed. As regards the material for configuring the upper layer photoelectric conversion layer $23_{UP}$, it is sufficient if it is suitably selected from various materials that configure the photoelectric conversion layer 23. On the other hand, as the material for configuring the lower layer semiconductor layer $23_{DN}$, it is preferable to use a material that is a high value of band gap energy (for example, a value of the band gap energy equal to or higher than 3.0 eV) and is higher in mobility than the material configuring the photoelectric conversion layer, and particularly, for example, an oxide semiconductor material such as IGZO can be listed. As an alternative, as a material for configuring the lower layer semiconductor layer $23_{DN}$, in the case where charge to be accumulated is electrons, a material having higher ionization potential than that of the material configuring the photoelectric conversion layer can be listed. Else, the impurity concentration of a material configuring the lower layer semiconductor layer is preferably equal to or lower than $1\times10^{18}$ $cm^{-3}$. It is to be noted that the configuration and the structure of the modification 2 of the working example 1 can be applied to other working examples.

WORKING EXAMPLE 2

Figure 14:
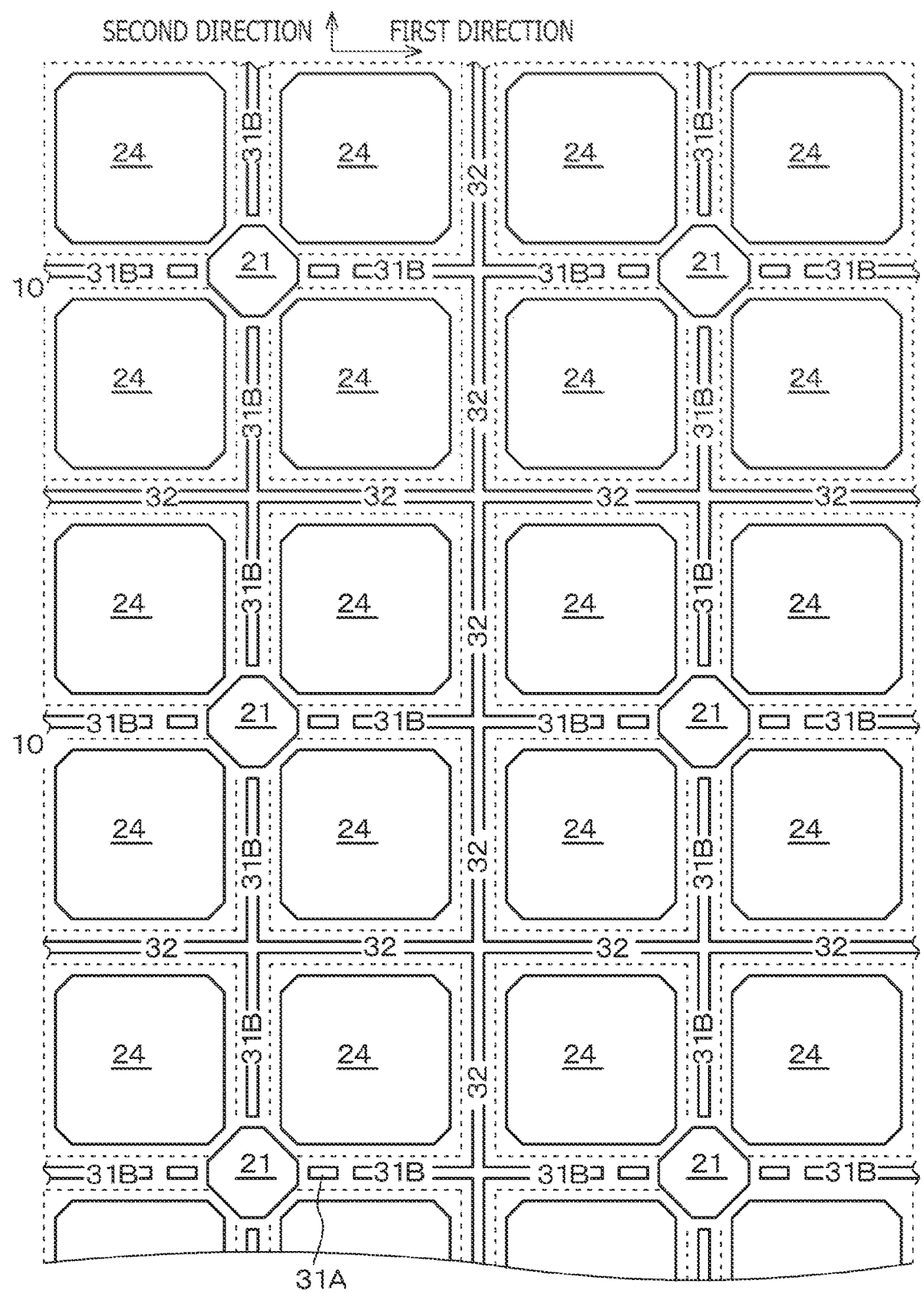
FIG. 14 is a view schematically depicting an arrangement state of a charge accumulating electrode, a first isolation electrode, a second isolation electrode, a third isolation electrode, and a first electrode in the solid-state image sensor of a working example 2.
Figure 15:
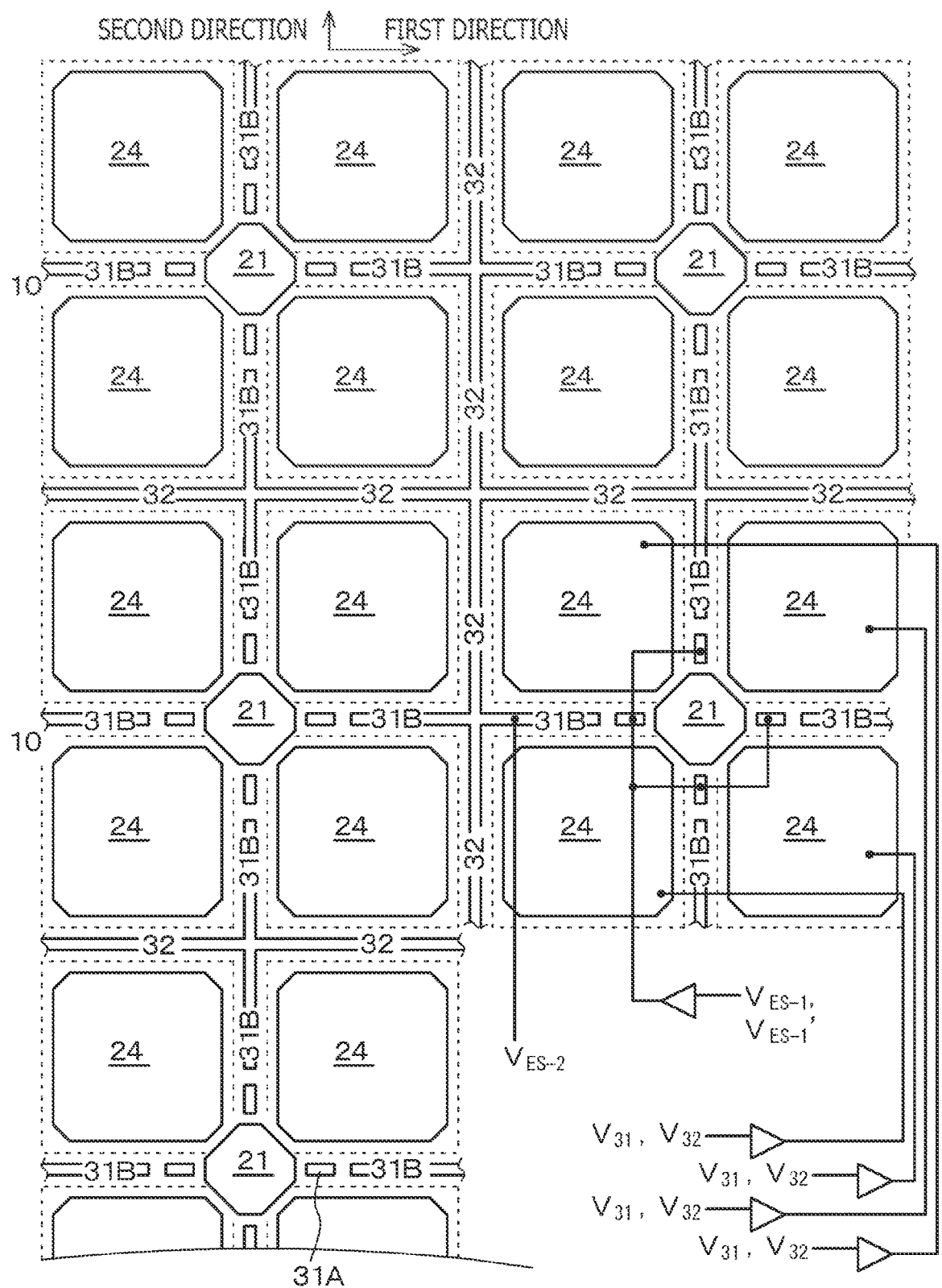
FIG. 15 is a view schematically depicting an arrangement state of a charge accumulating electrode, a first isolation electrode, a second isolation electrode, a third isolation electrode, and a first electrode in a modification of the solid-state image sensor of the working example 2.

The working example 2 relates to a solid-state image sensor according to the first form of the present disclosure. A charge accumulating electrode, a first isolation electrode, a second isolation electrode, and an arrangement state of the second isolation electrode and a first electrode in the solid-state image sensor of the working example 2 are schematically depicted in FIGS. 14 and 15. It is to be noted that a schematic partial sectional view of the imaging device and the stacked type imaging device of the working example 2 is substantially similar to that of FIG. 8, and equivalent circuit diagrams of the imaging device and the stacked type imaging device of the working example 2 are substantially similar to those of FIGS. 9 and 10. In FIG. 15, a driving circuit (where it indicates a change from the value $V_{ES-1}$ to the value $V_{ES-1}'$) is added to one imaging device block.

The solid-state image sensor of the working example 2 includes
a plurality of imaging device blocks 10 each including P×Q (where P≥2 and Q≥1, in the working example 2, P=2 and Q=2) imaging devices (photoelectric conversion devices) where P imaging devices are arranged in a first direction and Q imaging devices are arranged in a second direction different from the first direction, in which
each imaging device 11 includes
a first electrode 21,
a charge accumulating electrode 24 arranged with a space from the first electrode 21,
an isolation electrode 30 arranged with a space from the first electrode 21 and the charge accumulating electrode 24 and surrounding the charge accumulating electrode 24,
a photoelectric conversion layer 23 formed in contact with the first electrode 21 and above the charge accumulating electrode 24 with an insulating layer 82 interposed therebetween, and
a second electrode 22 formed on the photoelectric conversion layer 23,
the isolation electrode 30 includes a first isolation electrode 31A, a second isolation electrode 31B, and a third isolation electrode 32,
the first isolation electrode 31A is arranged adjacent to but with a space from the first electrode 21 between imaging devices placed side by side at least along the second direction in the imaging device block,
the second isolation electrode 31B is arranged between imaging devices in the imaging device block, and
the third isolation electrode 32 is arranged between imaging device blocks.

Further, in the solid-state image sensor of the working example 2, the third isolation electrode 32 is shared by adjacent imaging device blocks.

Further, as depicted in FIG. 14, in the solid-state image sensor of the working example 2,
the first isolation electrode 31A is arranged adjacent to but with a space from the first electrode 21 between imaging devices placed side by side along the second direction in the imaging device block, and
the second isolation electrode 31B is arranged between imaging devices placed side by side along the first direction and is arranged with a space from the first isolation electrode 31A between imaging devices placed side by side along the second direction. Further, in this case, the second isolation electrode 31B and the third isolation electrode 32 are connected to each other.

Otherwise, as depicted in FIG. 15, in a modification of the solid-state image sensor of the working example 2,
the first isolation electrode 31A is arranged adjacent to but with a space from the first electrode 21 between imaging devices placed side by side along the second direction in the imaging device block and is arranged adjacent to but with a space from the first electrode 21 between imaging devices placed side by side along the first direction, and the second isolation electrode 31B is arranged with a space from the first isolation electrode 31A between imaging devices placed side by side along the second direction and is further arranged with a space from the first isolation electrode 31A between imaging devices placed side by side along the first direction. Further, in this case, the second isolation electrode 31B and the third isolation electrode 32 are connected to each other.

The second isolation electrode 31B and the third isolation electrode 32 are suitably shared by a plurality of imaging devices, and the second isolation electrode 31B and the third isolation electrode 32 are controlled simultaneously in the plurality of imaging devices. On the other hand, the first isolation electrodes 31A are controlled separately in the imaging devices. Depending upon the driving form of the solid-state image sensor, the first isolation electrodes 31A in the imaging device block are sometimes controlled simultaneously in the plurality of imaging devices.

Also in the solid-state image sensor of the working example 2, similarly as described hereinabove in connection with the working example 1, the potential of the first isolation electrode 31A has the fixed value $V_{ES-1}$ and the potential of the second isolation electrode 31B and that of the third isolation electrode 32 also have the fixed $V_{ES-1}$, or the potential of the first isolation electrode 31A changes from the fixed value $V_{ES-1}$ (particularly, changes to the fixed value $V_{ES-1}'$ while the potential of the second isolation electrode 31B and that of the third isolation electrode 32 have the fixed value $V_{ES-2}$. Then, $|V_{ES-2}|>|V_{ES-1}|$ is satisfied, or $|V_{ES-2}|=|V_{ES-1}|$ is satisfied.

The first isolation electrode 31A, the second isolation electrode 31B, and the third isolation electrode 32 are provided in a region opposed to the region of the photoelectric conversion layer 23, which is positioned between adjacent imaging devices 11, with the insulating layer 82 interposed therebetween. In particular, the first isolation electrode 31A, the second isolation electrode 31B, and the third isolation electrode 32 are a lower first isolation electrode, a lower second isolation electrode, and a lower third isolation electrode, respectively. Although the first isolation electrode 31A, the second isolation electrode 31B, and the third isolation electrode 32 are formed in a level same as that of the first electrode 21 or the charge accumulating electrode 24, they may be formed otherwise in different levels.

Further, in the solid-state image sensor of the working example 2, the first electrode 21 is shared by P×Q imaging devices configuring an imaging device block. Then, each imaging device block includes a control portion, the control portion includes at least a floating diffusion layer and an amplification transistor, and the shared first electrode 21 is connected to the control portion. By this, the configuration and structure in the pixel region in which a plurality of imaging devices are arrayed can be simplified and refined. P×Q imaging devices provided for one floating diffusion layer may include a plurality of imaging devices of the first type or may include at least one imaging device of the first type and one or two or more imaging devices of the second type hereinafter described.

Further, the solid-state image sensor of the working example 2 includes a stacked type imaging device having at least one imaging device 11 described hereinabove in connection with the working example 1. Further, in such a solid-state image sensor of the working example 2 as just described, a lower imaging device block of at least one layer (in particular, two layers) is provided below the plurality of imaging device blocks, the lower imaging device block includes a plurality of imaging devices (in particular, P×Q imaging devices where P imaging devices are arranged along the first direction and Q imaging devices are arranged along the second direction), and the wavelength of light received by the imaging devices configuring the imaging device block and the wavelength of light received by the imaging devices that configure the lower imaging device block are different from each other. A plurality of (in particular, P×Q) imaging devices configuring the lower imaging device block include a shared floating diffusion layer. Further, movement of charge accumulated in the photoelectric conversion layer 23 between imaging devices in adjacent imaging device blocks is inhibited under the control of the third isolation electrode 32.

Since operation of the solid-state image sensor of the working example 2 can be made substantially similar to operation of the solid-state image sensor of the working example 1, although detailed description is omitted, in the case of adopting a first mode reading out method in which charge accumulated in four imaging devices is read out separately by a total of four times under the control of the isolation electrode 30, when three of the imaging devices are placed into a charge accumulation state while the remaining one imaging device is read out, each potential of the electrodes in the imaging device from which charge is to be read out is set to $V_{12}>V_{ES-1}>V_{32}>V_{ES-2}$ or $V_{12}>V_{ES-1}'>V_{32}>V_{ES-2}$ and each potential of the electrodes in the imaging devices from which charge is not to be read out is set to $V_{12}>V_{32}>V_{ES-1}>V_{ES-2}$ or $V_{12}>V_{32}>V_{ES-1}'>V_{ES-2}$. It is to be noted that, in FIGS. 5B, 5C, 6A, and 6B, the potential of the charge accumulating electrode 24 in such imaging devices from which charge is not to be read out is indicated by a dot-dash line. In this manner, charge accumulated in the imaging devices from which charge is not to be read out is inhibited from moving to the first electrode 21. After charge reading out of one imaging device is completed, one of the remaining three imaging devices is rendered operative similarly to read out charge. It is sufficient if such operation as just described is performed a total of four times.

On the other hand, in the case of adopting a second mode reading out method in which charge accumulated in four imaging devices is read out simultaneously by a total of one time, each potential of the electrodes in the four imaging devices that are in a charge accumulation state is simultaneously set to $V_{12}>V_{ES-1}>V_{32}>V_{ES-2}$ or $V_{12}>V_{ES-1}'>V_{32}>V_{ES-2}$. By this, charge accumulated in the four imaging devices can be moved to the first electrode 21 at the same timing.

In the solid-state image sensor of the working example 2, since the first isolation electrode is arranged adjacent to but with a space from the first electrode between imaging devices placed side by side at least along the second direction in the imaging device block and the second isolation electrode is arranged between imaging devices in the imaging device block while the third isolation electrode is arranged between imaging device blocks, during operation of the imaging device, movement of charge between adjacent imaging devices can be reduced with certainty under the control of the first isolation electrode, the second isolation electrode, and the third isolation electrode. Besides, charge accumulated in the photoelectric conversion layer can be transferred smoothly to the first electrode. Further, improvement of the saturation charge amount in that the saturation charge amount does not decrease and a balance between reduction of remaining charge upon charge transfer and reduction of occurrence of blooming can be achieved.

WORKING EXAMPLE 3

The working example 3 is a modification of the working examples 1 and 2. The working example 3 can be formed such that the first isolation electrode 31A and the second isolation electrode 31B or the first isolation electrode 31A, the second isolation electrode 31B, and the third isolation electrode 32 are provided with a space from the second electrode 22 on the photoelectric conversion layer 23. In other words, the isolation electrodes are upper isolation electrodes.

A schematic partial sectional view of an imaging device (two imaging devices placed side by side) of the working example 3 is depicted in FIG. 16A. In the imaging device of the working example 3, on the region 23' of the photoelectric conversion layer 23 positioned between adjacent imaging devices, an upper first isolation electrode and an upper second isolation electrode (that are collectively referred to as an "isolation electrode 35") are formed instead of forming the second electrode 22. The isolation electrode 35 is provided with a space from the second electrode 22. In other words, the second electrode 22 is provided for each imaging device, and the isolation electrode 35 is provided on part of the photoelectric conversion layer 23 with a space from the second electrode 22 such that it surrounds at least part of the second electrode 22. The isolation electrode 35 is formed at a level same as that of the second electrode 22. It is sufficient if the isolation electrode 35 has a planar shape similar to that of the isolation electrode 30, for example.

In particular, an orthogonal projection image of the isolation electrode 30 is positioned with a space from orthogonal projection images of the first electrode 21 and the charge accumulating electrode 24 and surrounds the orthogonal projection image of the charge accumulating electrode 24, and an orthogonal projection image of the first isolation electrode 31A is positioned between the orthogonal projection image of the first electrode 21 and an orthogonal projection image of the second isolation electrode 31B. In some cases, part of the orthogonal projection image of the second isolation electrode 31B and part of the orthogonal projection image of the charge accumulating electrode 24 may overlap with each other. Alternatively, the orthogonal projection image of the first isolation electrode 31A is positioned adjacent to but with a space from the orthogonal projection image of the first electrode 21 between imaging devices placed side by side at least along the second direction in the imaging device block, and the second isolation electrode 31B is arranged between imaging devices in the imaging device block while the third isolation electrode 32 is arranged between imaging device blocks.

The second electrode 22 and the isolation electrode 35 can be obtained by first forming a material layer, which is to configure the second electrode 22 and the isolation electrode 35, on the photoelectric conversion layer 23 and then patterning the material layer. The second electrode 22 and the isolation electrode 35 are connected separately to different wiring (not depicted), each of which is connected to the driving circuit. The wiring connected to the second electrode 22 is made common to a plurality of imaging devices. Also the wiring connected to the isolation electrode 35 is suitably made common to a plurality of imaging devices similarly to the isolation electrodes described hereinabove in connection with the working examples 1 and 2.

An insulating film (not depicted) is formed on the photoelectric conversion layer 23 including the second electrode 22 and the isolation electrode 35, and a contact hole (not depicted) connected to the second electrode 22 is formed in the insulating film above the second electrode 22. Further, wiring $V_{OU}$ (not depicted) connected to the contact hole is provided on the insulating film.

Also operation of the solid-state image sensor of the working example 3 can be made substantially similar to operation of the solid-state image sensor of the working example 1, and thus, detailed description of the operation is omitted. Yet, the potential to be applied to the isolation electrode 35 is set lower than the potential to be applied to the second electrode 22.

As described above, in the imaging device of the working example 3, since an isolation electrode is formed, instead of forming the second electrode, on a region of the photoelectric conversion layer positioned between adjacent imaging devices, a flow of charge generated by photoelectric conversion into an adjacent imaging device can be reduced by the isolation electrode. Therefore, a captured video (image) does not suffer from quality deterioration.

A schematic partial sectional view of a modification (modification 1) of (the two imaging devices placed side by side in) the imaging device of the working example 3 is depicted in FIG. 16B. In the modification 1, the second electrode 22 is provided for each imaging device, and the isolation electrode 35 is provided with a space from the second electrode 22 such that it surrounds at least part of the second electrode 22. Below the isolation electrode 35, part of the charge accumulating electrode 24 is present, and besides, below the isolation electrode 35 (upper isolation electrode), an isolation electrode (lower isolation electrode) 30 is provided. A region of the second electrode 22 opposed to the isolation electrode 35 is positioned on the first electrode side. The charge accumulating electrode 24 is surrounded by the isolation electrode 35.

Further, as indicated in FIG. 17A that depicts a schematic partial sectional view of the imaging device (two imaging devices placed side by side) of the working example 3, the second electrode 22 may be divided into a plurality of portions, and individually different potential may be applied to the divisional second electrodes 22. Furthermore, as depicted in FIG. 17B, an isolation electrode 35 may be provided between divided second electrodes 22.

WORKING EXAMPLE 4

The working example 4 is a modification of the working examples 1 to 3. The imaging device and the stacked type imaging device of the working example 4 whose schematic partial sectional view is depicted in FIG. 18 are an imaging device and a stacked type imaging device of the front-illuminated type and are structured such that the green light imaging device of the working example 1 of the first type (first imaging device) that has sensitivity to green light and includes a green light photoelectric conversion layer of the first type that absorbs green light, a conventional blue light imaging device of the second type (second imaging device) that has sensitivity to blue light and includes a blue light photoelectric conversion layer of the second type that absorbs blue light, and a conventional red light imaging device of the second type (third imaging device) that has sensitivity to red light and includes a red light photoelectric conversion layer of the second type that absorbs red light are stacked. Here, the red light imaging device (third imaging device) and the blue light imaging device (second imaging device) are provided in the semiconductor substrate 70 such that the second imaging device is positioned on the light incidence side with respect to the third imaging device. Further, the green light imaging device (first imaging device) is provided above the blue light imaging device (second imaging device).

On the first face 70A side of the semiconductor substrate 70, various transistors configuring a control portion are provided similarly as in the working example 1. The transistors can be configured and structured substantially similarly to the transistors described hereinabove in connection with the working example 1. Further, although, on the semiconductor substrate 70, the second imaging device and the third imaging device are provided, those imaging devices can also be configured and structured substantially similarly to the second imaging device and the third imaging device described hereinabove in connection with the working example 1.

On the first face 70A of the semiconductor substrate 70, interlayer insulating layers 77 and 78 are formed, and on the interlayer insulating layer 78, the photoelectric conversion portion (first electrode 21, photoelectric conversion layer 23, and second electrode 22) configuring the imaging device of the working example 1, the charge accumulating electrode 24 and so forth are provided.

In such a manner, since, except that the imaging device and the stacked type imaging device are of the front-illuminated type, the configuration and the structure of the imaging device and the stacked type imaging device of the working example 4 can be made similar to the configuration and the structure of the imaging devices and the stacked type imaging devices of the working examples 1 to 3, detailed description of them is omitted.

WORKING EXAMPLE 5

The working example 5 is a modification of the working examples 1 to 4.

Figure 19:
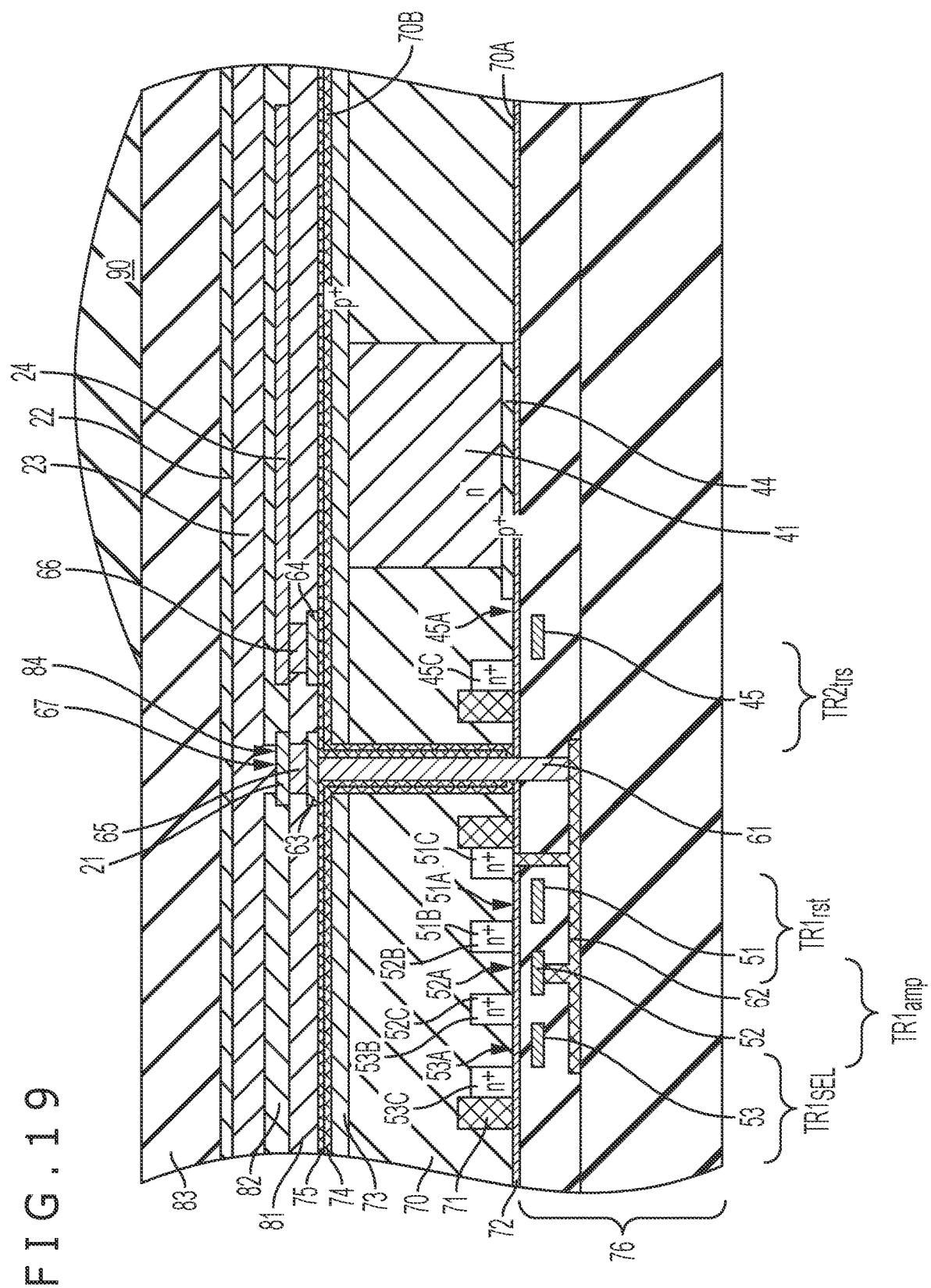
FIG. 19 is a schematic partial sectional view of an imaging device and a stacked type imaging device of a working example 5.
Figure 20:
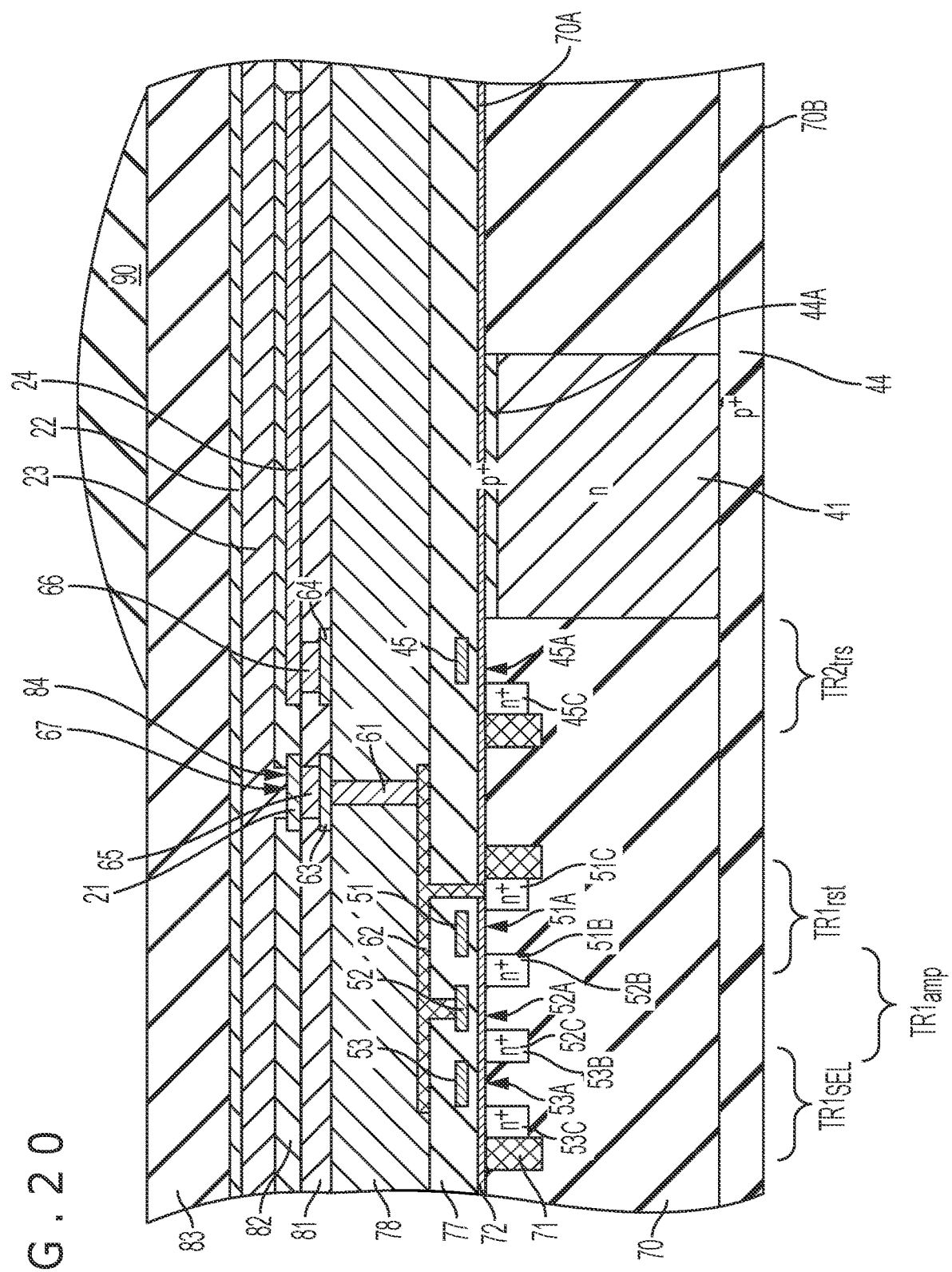
FIG. 20 is a schematic partial sectional view of a modification of the imaging device and the stacked type imaging device of the working example 5.

The imaging device and the stacked type imaging device of the working example 5 whose schematic partial sectional view is depicted in FIG. 19 are an imaging device and a stacked type imaging device of the back-illuminated type and are structured such that two imaging devices of a first imaging device of the working example 1 of the first type and a second imaging device of the second type are stacked. Further, a modification of the imaging device and the stacked type imaging device of the working example 5 whose schematic partial sectional view is depicted in FIG. 20 are an imaging device and a stacked type imaging device of the front-illuminated type and are structured such that a first imaging device of the working example 1 of the first type and a second imaging device of the second type are stacked. Here, the first imaging device absorbs light of a primary color, and the second imaging device absorbs light of a complementary color. Alternatively, the first imaging device absorbs white light, and the second imaging device absorbs infrared light.

Figure 21:
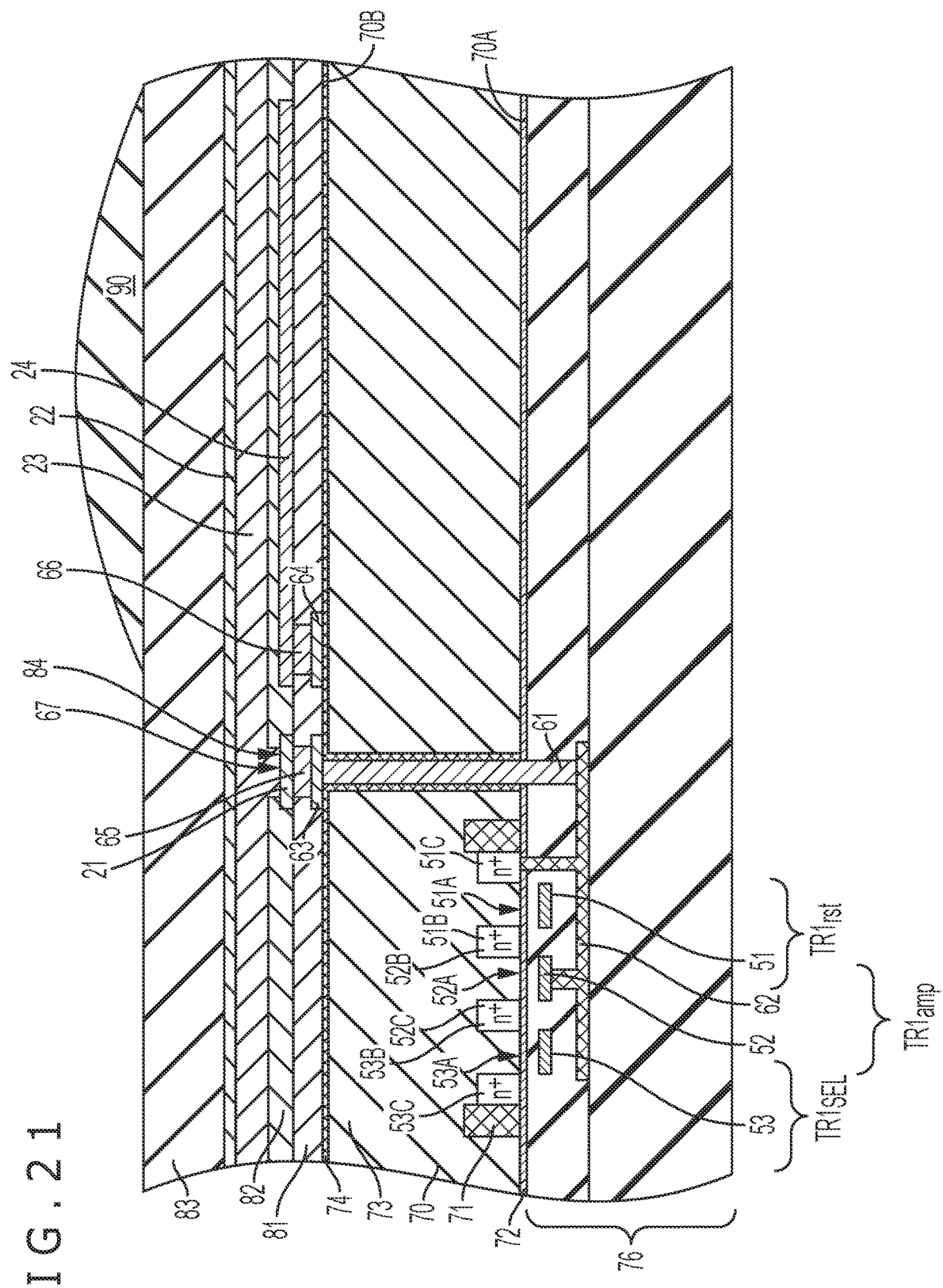
FIG. 21 is a schematic partial sectional view of another modification of the imaging device of the working example 5.
Figure 22:
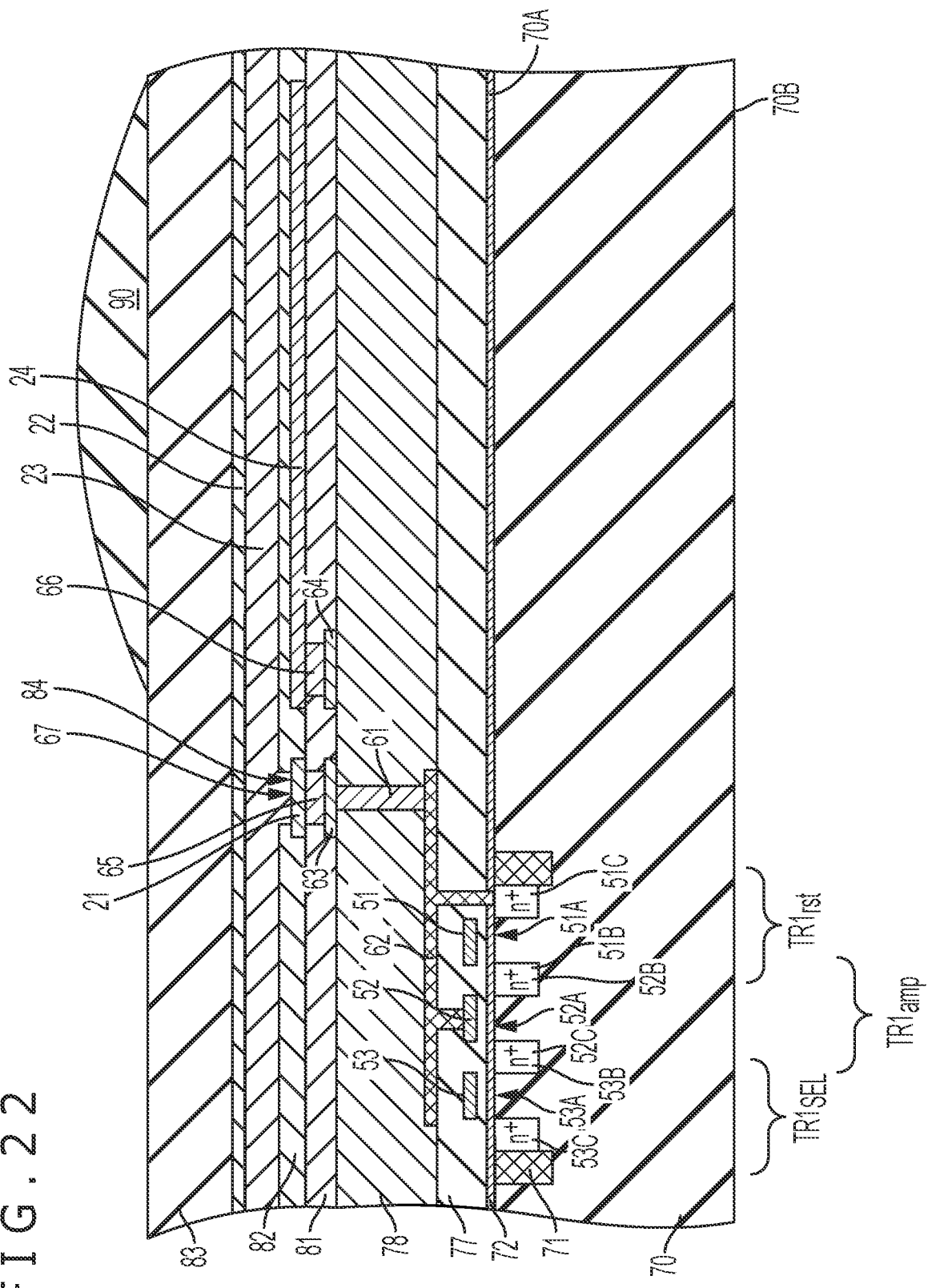
FIG. 22 is a schematic partial sectional view of a further modification of the imaging device of the working example 5.

A modification of the imaging device of the working example 5 whose schematic partial sectional view is depicted in FIG. 21 is an imaging device of the back-illuminated type and includes a first imaging device of the working example 1 of the first type. Meanwhile, a modification of the imaging device of the working example 5 whose schematic partial sectional view is depicted in FIG. 22 is an imaging device of the front-illuminated type and includes a first imaging device of the working example 1 of the first type. Here, the first imaging device includes three different imaging devices of an imaging device that absorbs red light, another imaging device that absorbs green light, and a further imaging device that absorbs blue light.

Further, a solid-state image sensor according to the first form of the present disclosure includes a plurality of such imaging devices. As arrangement of the plurality of such imaging devices, a Bayer array is applicable. On the light incidence side of each imaging device, color filters for spectral separation into blue, green, and red are arranged as occasion demands.

It is to be noted that it is also possible to use a form in which, in place of providing one imaging device of the working example 1 of the first type, two such imaging devices are stacked (that is, a form in which two photoelectric conversion portions are stacked and a control portion for the two imaging devices is provided on a semiconductor substrate) or use another form in which three such imaging devices are stacked (that is, a form in which three photoelectric conversion portions are stacked and a control portion for the three imaging devices is provided on a semiconductor substrate). Examples of the stacked structure of an imaging device of the first type and an imaging device of the second type are exemplified in the following table.

| | First type | Second type |
|---|---|---|
| Back-illuminated type and front-illuminated type | 1<br>Green<br>1<br>Primary color<br>1<br>White<br>1<br>Blue or green or red<br>2<br>Green + infrared light<br>2<br>Green + blue<br>2<br>White + infrared light<br>3<br>Green + blue + red<br>3<br>Green + blue + red<br>3<br>Blue + green + red | 2<br>Blue + red<br>1<br>Complementary color<br>1<br>Infrared rays<br>0<br><br>2<br>Blue + red<br>1<br>Red<br>0<br><br>2<br>Blue-green (emerald color) + infrared light<br>1<br>Infrared light<br>0 |

WORKING EXAMPLE 6

Figure 23:
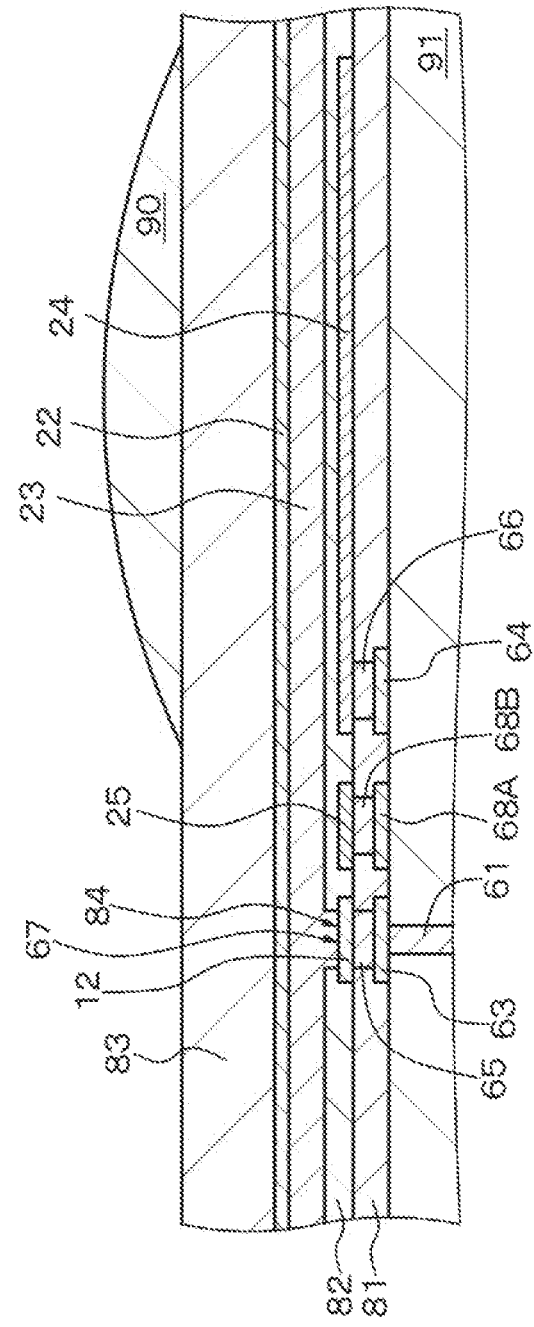
FIG. 23 is a schematic partial sectional view of an imaging device and a stacked type imaging device of a working example 6.
Figure 24:
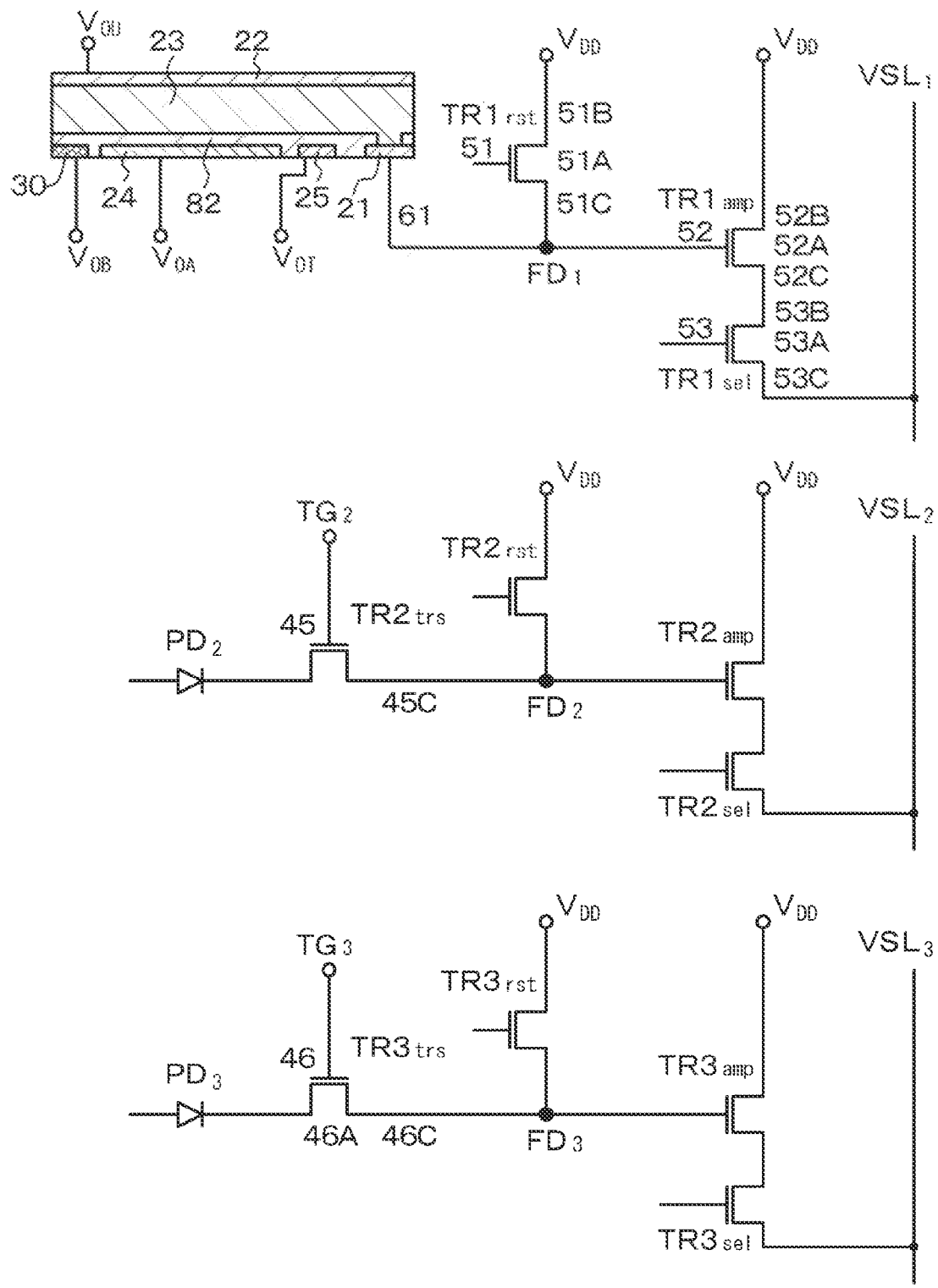
FIG. 24 is an equivalent circuit diagram of the imaging device and the stacked type imaging device of the working example 6.
Figure 25:
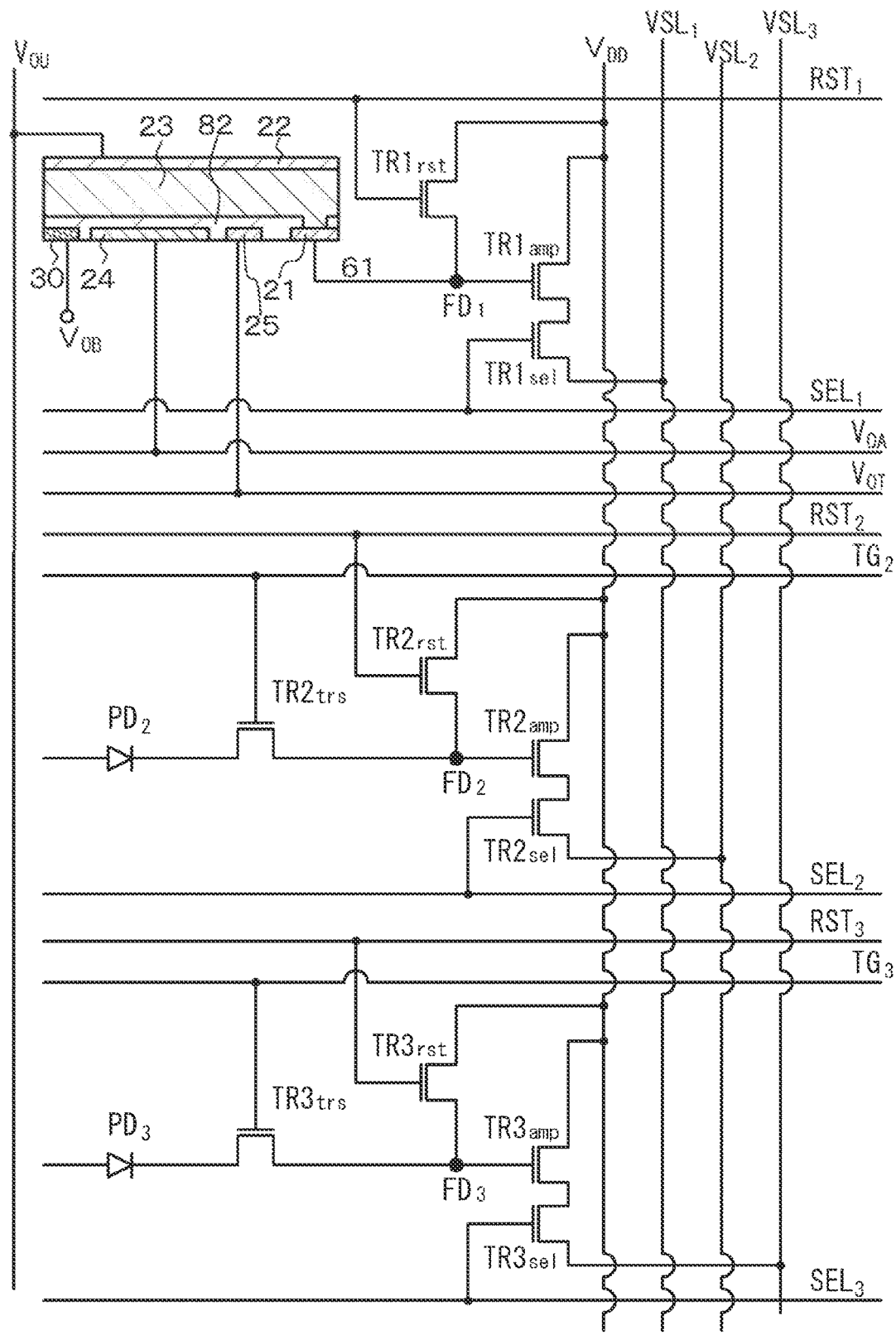
FIG. 25 is an equivalent circuit diagram of the imaging device and the stacked type imaging device of the working example 6.

The working example 6 is a modification of the working examples 1 to 5 and relates to the imaging device of the present disclosure that includes a transfer controlling electrode (charge transfer electrode). A schematic partial sectional view of part of an imaging device and a stacked type imaging device of the working example 6 is depicted in FIG. 23, and equivalent circuit diagrams of the imaging device and the stacked type imaging device of the working example 6 are depicted in each of FIGS. 24 and 25.

The imaging device and the stacked type imaging device of the working example 6 further include a transfer controlling electrode (charge transfer electrode) 25 arranged with a space from the first electrode 21 and the charge accumulating electrode 24 between the first electrode 21 and the charge accumulating electrode 24 and arranged opposed to the photoelectric conversion layer 23 with the insulating layer 82 interposed therebetween. The transfer controlling electrode 25 is connected to a pixel driving circuit configuring the driving circuit, through a connection hole 68B, a pad portion 68A, and wiring $V_{OT}$ provided in the interlayer insulating layer 81.

During a charge accumulation period, from the driving circuit, potential $V_{11}$ is supplied to the first electrode 21; potential $V_{31}$ is applied to the charge accumulating electrode 24; and potential $V_{41}$ is applied to the transfer controlling electrode 25. Photoelectric conversion occurs in the photoelectric conversion layer 23 by light incident to the photoelectric conversion layer 23. Positive holes generated by the photoelectric conversion are sent out from the second electrode 22 to the driving circuit through wiring $V_{OU}$. On the other hand, since the potential of the first electrode 21 is set higher than the potential of the second electrode 22, that is, since, for example, positive potential is applied to the first electrode 21 and negative potential is applied to the second electrode 22, $V_{31}>V_{41}$ (for example, $V_{31}>V_{11}>V_{41}$ or $V_{11}>V_{31}>V_{41}$) is satisfied. Consequently, electrons generated by the photoelectric conversion are attracted to the charge accumulating electrode 24 and stay in the region of the photoelectric conversion layer 23 opposed to the charge accumulating electrode 24. In other words, charge is accumulated into the photoelectric conversion layer 23. Since $V_{31}>V_{41}$ is satisfied, electrons generated in the inside of the photoelectric conversion layer 23 can be prevented with certainty from moving toward the first electrode 21. As time of the photoelectric conversion passes, the value of the potential in the region of the photoelectric conversion layer 23 opposed to the charge accumulating electrode 24 increases to the negative side.

At a later stage of the charge accumulation period, reset operation is performed. Consequently, the potential of the first floating diffusion layer $FD_1$ is reset and the potential of the first floating diffusion layer $FD_1$ becomes the potential $V_{DD}$ of the power supply.

After completion of the reset operation, reading out of the charge is performed. In particular, during a charge transfer period, from the driving circuit, potential $V_{12}$ is applied to the first electrode 21; potential $V_{32}$ is applied to the charge accumulating electrode 24; and potential $V_{42}$ is applied to the transfer controlling electrode 25. Here, it is assumed that $V_{32} \leq V_{42} \leq V_{12}$ is satisfied. By this, electrons staying in the region of the photoelectric conversion layer 23 opposed to the charge accumulating electrode 24 are read out with certainty to the first electrode 21 and further to the first floating diffusion layer $FD_1$. In other words, charge accumulated in the photoelectric conversion layer 23 is read out to the control portion.

With the above, the series of operation of charge accumulation, reset operation, and charge transfer is completed.

Operation of the amplification transistor $TR1_{amp}$ and that of the selection transistor $TR1_{sel}$ after electrons are read out into the first floating diffusion layer $FD_1$ are the same as the operation of conventional transistors. Further, such a series of operation as charge accumulation, reset operation, and charge transfer of the second imaging device and the third imaging device is similar to a conventional series of operation of charge transfer, reset operation, and charge transfer.

The other source/drain region 51B of the reset transistor $TR1_{rst}$ may be grounded instead of being connected to the power supply $V_{DD}$.

WORKING EXAMPLE 7

The working example 7 is a modification of the working examples 1 to 6 and relates to an imaging device of the present disclosure that includes a plurality of charge accumulating electrode segments.

Figure 26:
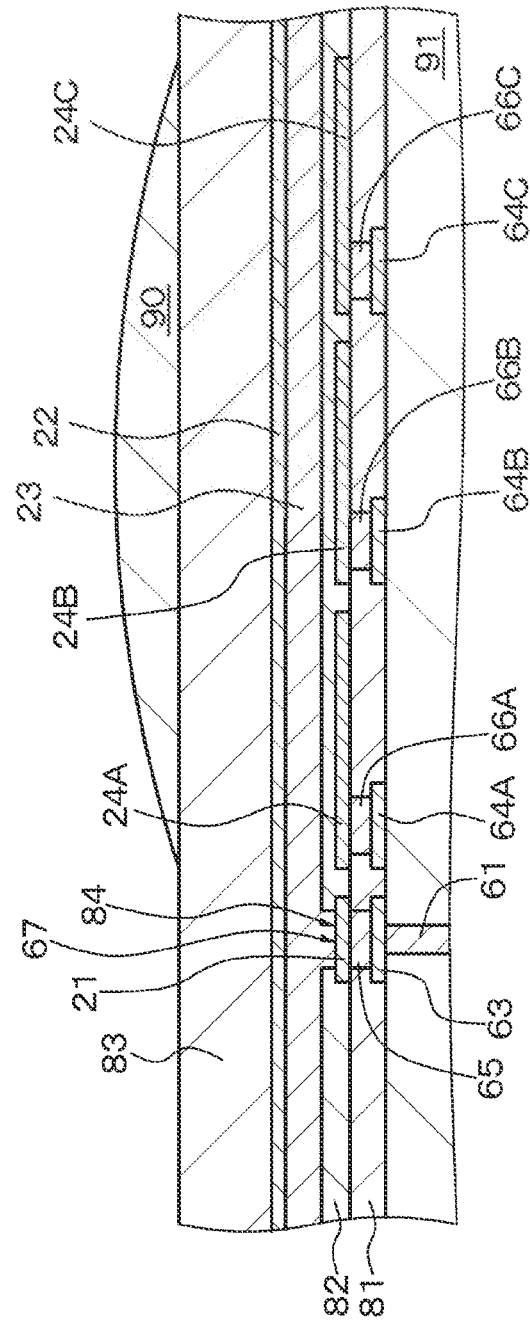
FIG. 26 is a schematic partial sectional view of an imaging device and a stacked type imaging device of a working example 7.
Figure 27:
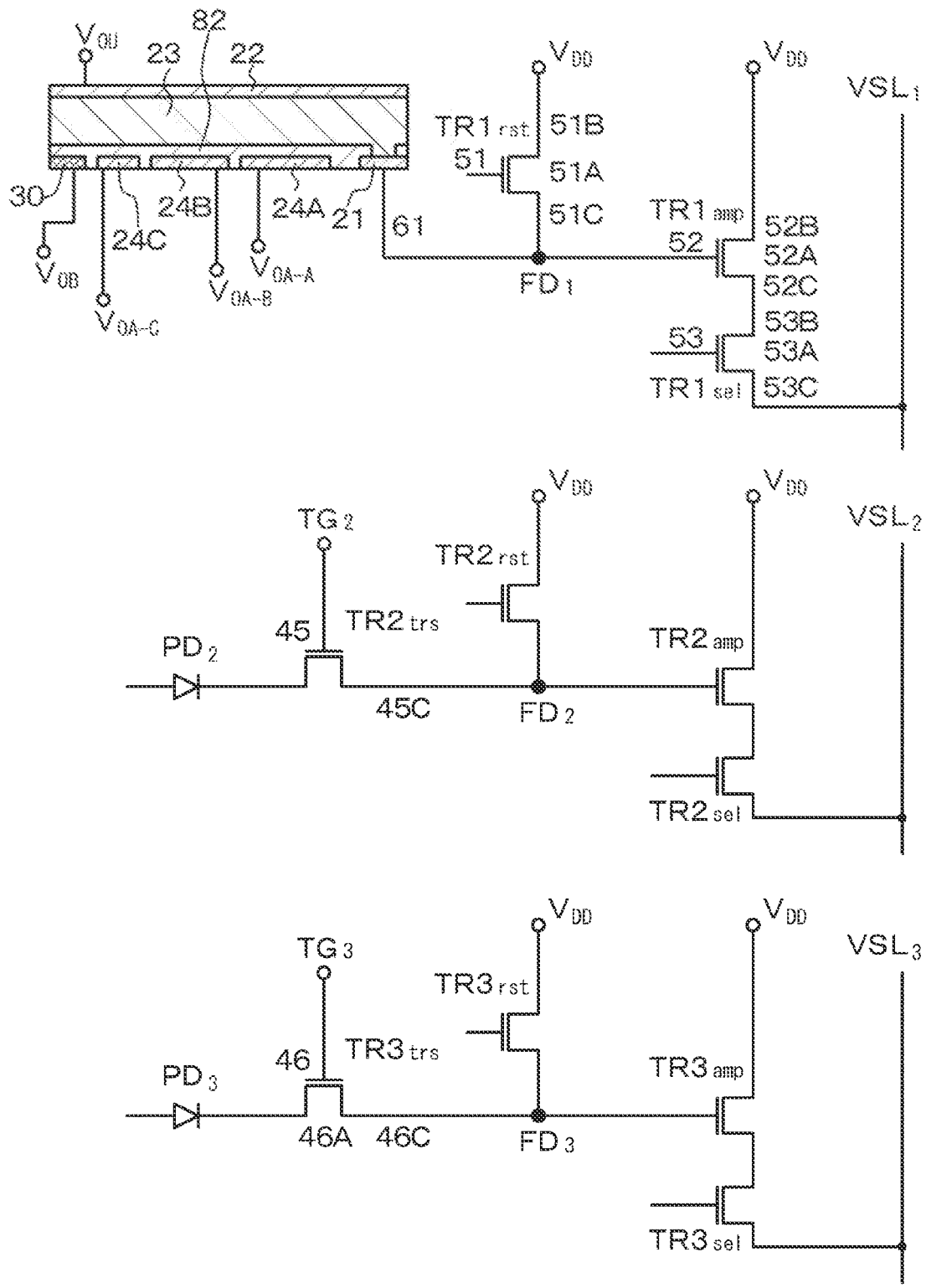
FIG. 27 is an equivalent circuit diagram of the imaging device and the stacked type imaging device of the working example 7.
Figure 28:
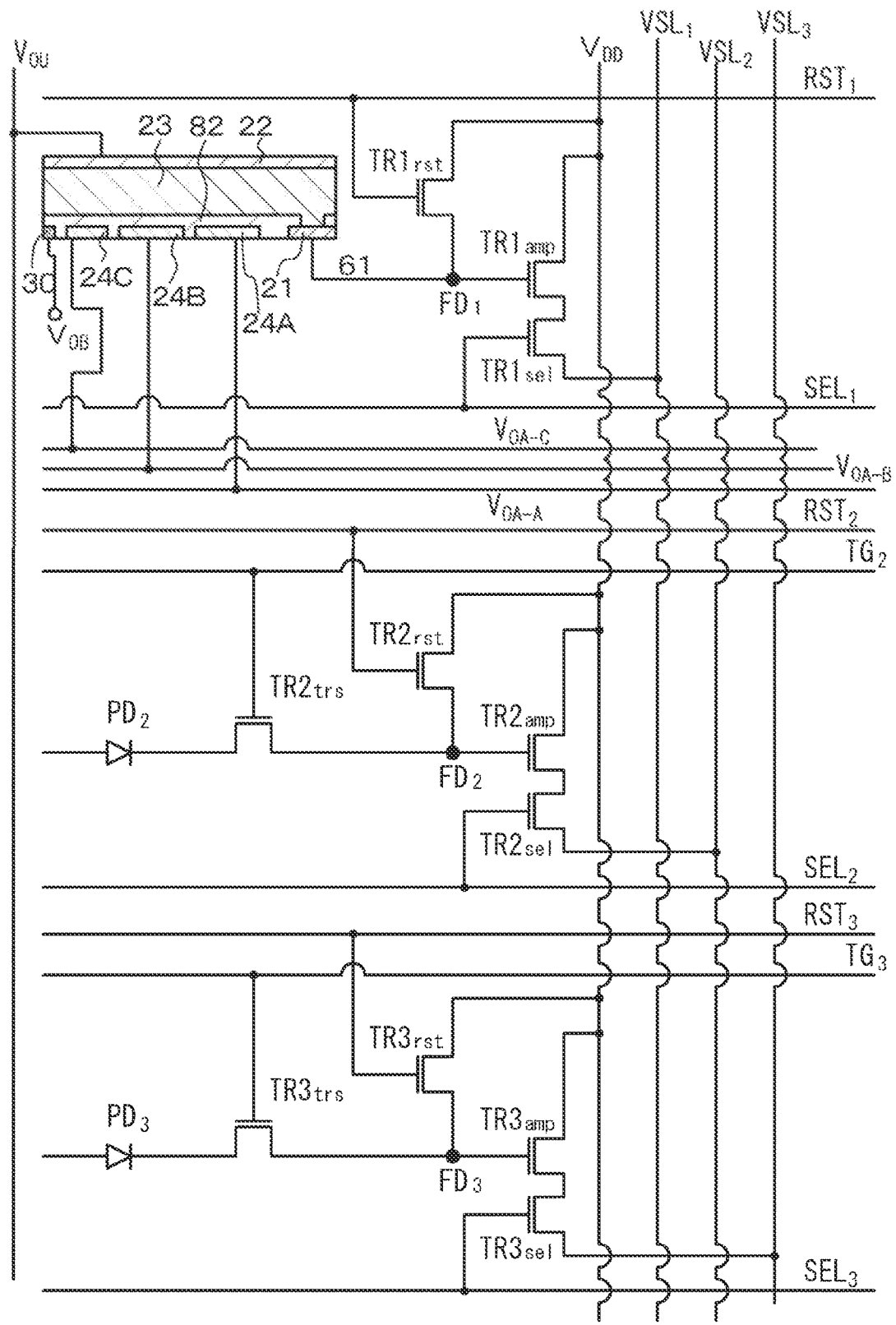
FIG. 28 is an equivalent circuit diagram of the imaging device and the stacked type imaging device of the working example 7.
Figure 29:
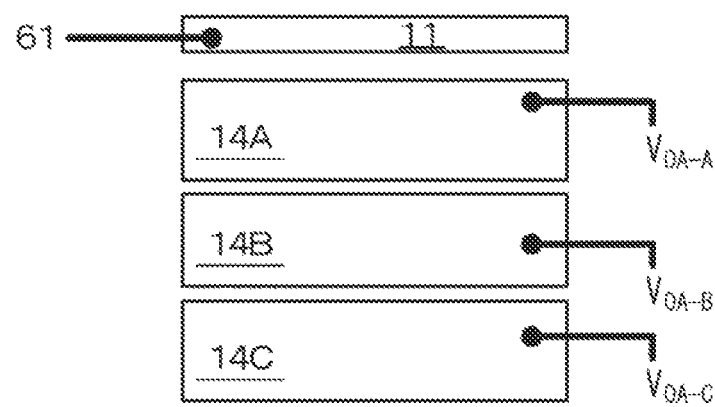
FIG. 29 is a schematic arrangement diagram of a first electrode and a charge accumulating electrode configuring the imaging device of the working example 7.

A schematic partial sectional view of part of the imaging device of the working example 7 is depicted in FIG. 26; equivalent circuit diagrams of the imaging device and the stacked type imaging device of the working example 7 are depicted in FIGS. 27 and 28; and a schematic arrangement diagram of a first electrode and a charge accumulating electrode configuring the imaging device of the working example 7 is depicted in FIG. 29.

In the working example 7, the charge accumulating electrode 24 includes a plurality of charge accumulating electrode segments 24A, 24B, and 24C. It is sufficient if the number of charge accumulating electrode segments is equal to or greater than two, and it is "three" in the working example 7. Further, although, in the imaging device and the stacked type imaging device of the working example 7, different potential is applied to each of the N charge accumulating electrodes, since the potential of the first electrode 21 is higher than the potential of the second electrode 22, that is, for example, since positive potential is applied to the first electrode 21 and negative potential is applied to the second electrode 22, during a charge transfer period, the potential applied to the charge accumulating electrode segment (first photoelectric conversion portion segment) 24A positioned nearest to the first electrode 21 is higher than the potential applied to the charge accumulating electrode segment (Nth photoelectric conversion portion segment) 24C located remotest from the first electrode 21. By providing a potential gradient to the charge accumulating electrode 24 in such a manner, electrons staying in the region of the photoelectric conversion layer 23 opposed to the charge accumulating electrode 24 are read out with a higher degree of certainty to the first electrode 21 and further to the first floating diffusion layer $FD_1$. In other words, charge accumulated in the photoelectric conversion layer 23 is read out into the control portion.

The other source/drain region 51B of the reset transistor $TR1_{rst}$ may be grounded instead of being connected to the power supply $V_{DD}$.

WORKING EXAMPLE 8

The working example 8 is a modification of the working examples 1 to 7 and relates to an imaging device of the first configuration and the sixth configuration.

Figure 30:
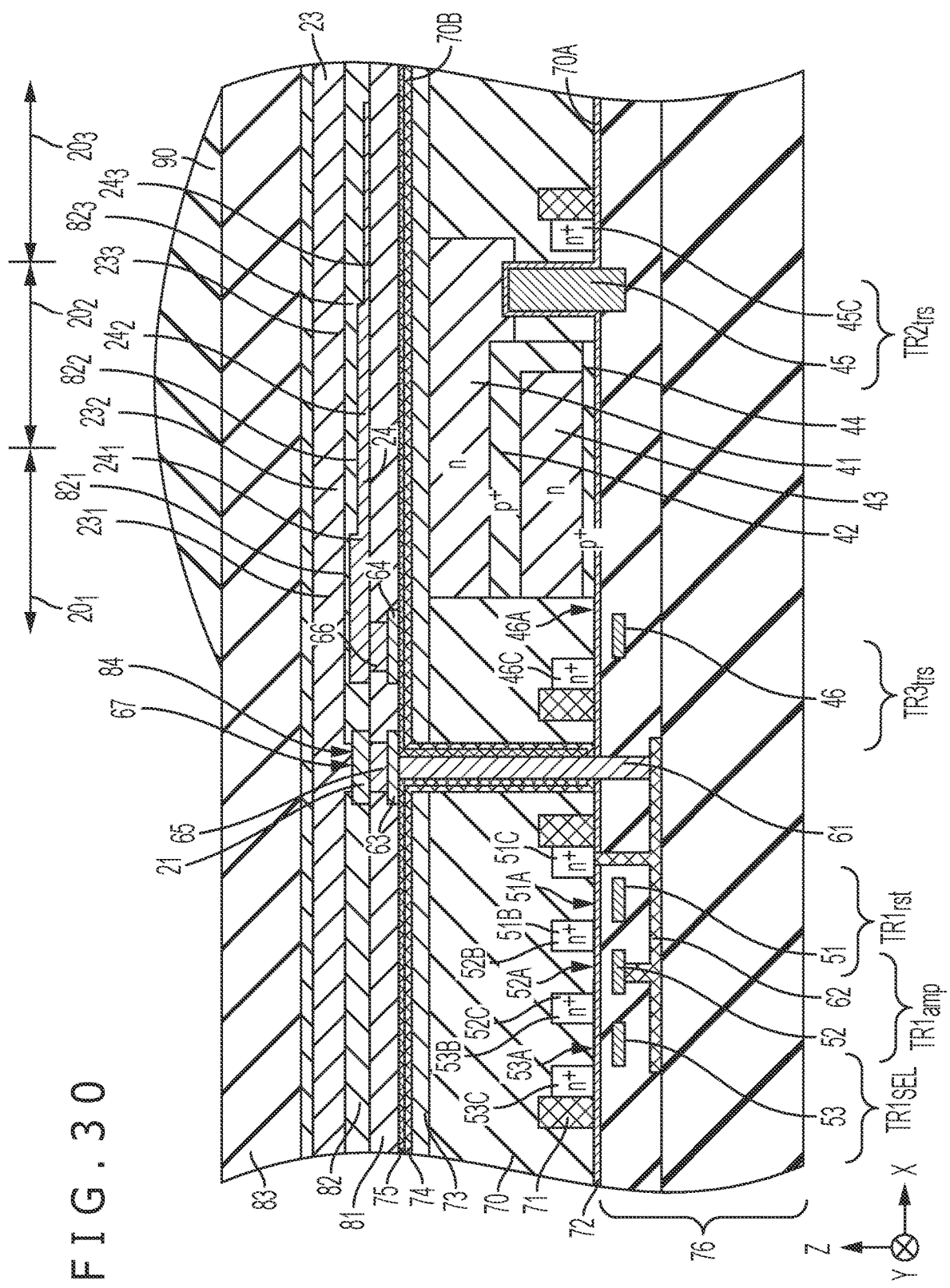
FIG. 30 is a schematic partial sectional view of an imaging device and a stacked type imaging device of a working example 8.
Figure 31:
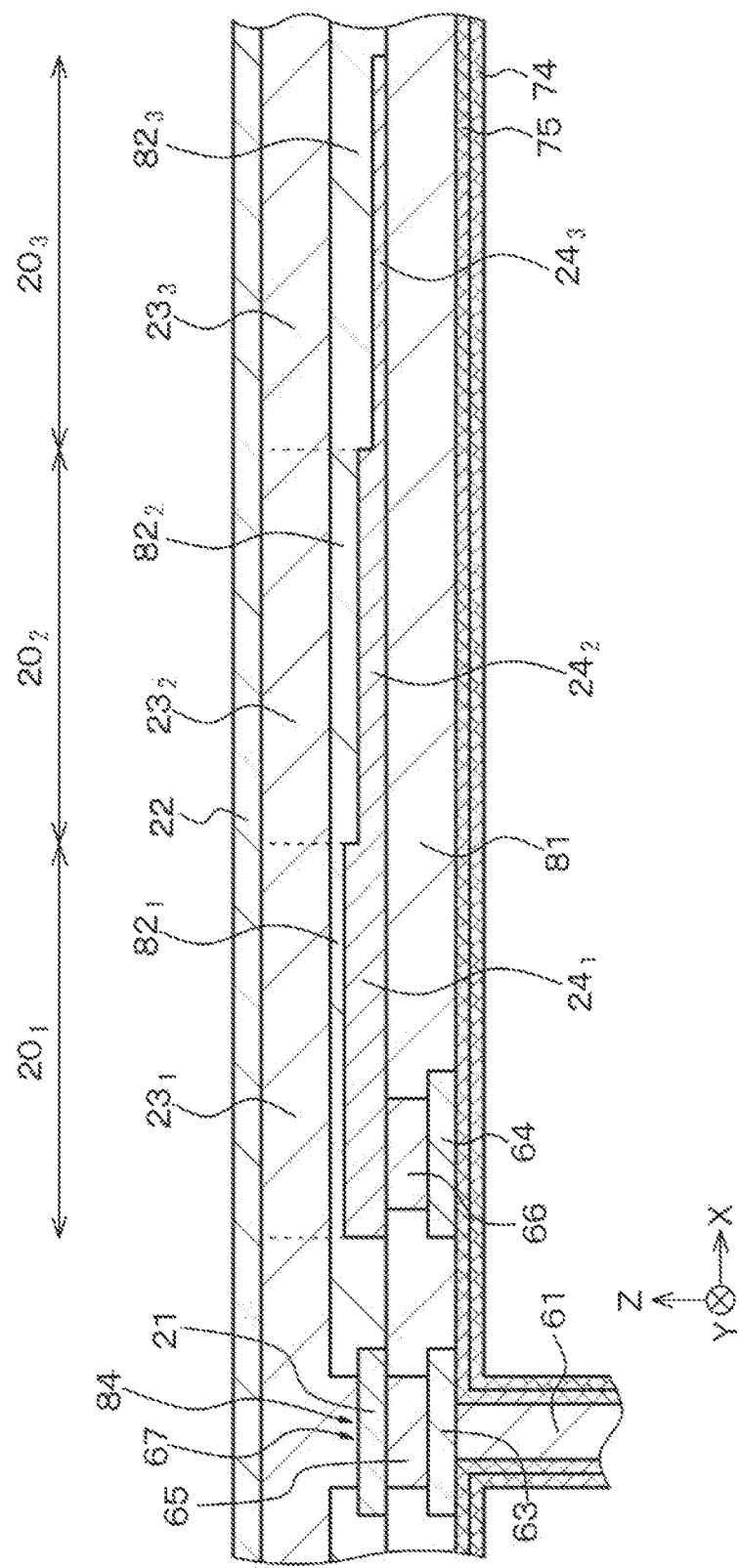
FIG. 31 is a schematic partial sectional view depicting a portion at which a charge accumulating electrode, a photoelectric conversion layer, and a second electrode in the imaging device of the working example 8 are stacked, in an enlarged scale.

A schematic partial sectional view of the imaging device and the stacked type imaging device of the working example 8 is depicted in FIG. 30, and a schematic partial sectional view in which a portion at which the charge accumulating electrode, the photoelectric conversion layer, and the second electrode are stacked is enlarged is depicted in FIG. 31.

Here, in the imaging device of the working example 8 or in imaging devices of the working examples 9 to 13 hereinafter described, the photoelectric conversion portion includes N (where $N \geq 2$) photoelectric conversion portion segments (in particular, three photoelectric conversion portion segments $20_1$, $20_2$, and $20_3$), the photoelectric conversion layer 23 includes N photoelectric conversion layer segments (in particular, three photoelectric conversion layer segments $23_1$, $23_2$, and $23_3$), the insulating layer 82 includes N insulating layer segments (in particular, three insulating layer segments $82_1$, $82_2$, and $82_3$), in the working examples 8 to 10, the charge accumulating electrode 24 includes N charge accumulating electrode segments (in particular, in the embodiments, three charge accumulating electrode segments $24_1$, $24_2$, and $24_3$), in the working examples 11 and 12, and in some cases, in the working example 10, the charge accumulating electrode 24 includes N charge accumulating electrode segments (in particular, three charge accumulating electrode segments $24_1$, $24_2$, and $24_3$) arranged with a space between each other, the nth (where n=1, 2, 3, ..., N) photoelectric conversion portion segment $20_n$ includes the nth charge accumulating electrode segment $24_n$, the nth insulating layer segment $82_n$, and the nth photoelectric conversion layer segment $23_n$, and a photoelectric conversion portion segment having a higher value of n is positioned farther away from the first electrode 21.

Otherwise, the imaging device of the working example 8 or the imaging device of each of the working examples 9 and 12 hereinafter described is configured such that it includes a photoelectric conversion portion including a first electrode 21, a photoelectric conversion layer 23, and a second electrode 22 stacked one on another, the photoelectric conversion portion further includes a charge accumulating electrode 24 that is arranged with a space from the first electrode 21 and is arranged opposed to the photoelectric conversion layer 23 with the insulating layer 82 interposed therebetween, and where the stacking direction of the charge accumulating electrode 24, the insulating layer 82, and the photoelectric conversion layer 23 is defined as a Z direction and a direction away from the first electrode 21 is defined as an X direction, the sectional area of the stacked portion when the stacked portion at which the charge accumulating electrode 24, the insulating layer 82, and the photoelectric conversion layer 23 are stacked is cut along a YZ virtual plane varies depending upon the distance from the first electrode 21.

Further, in the imaging device of the working example 8, the thickness of the insulating layer segment gradually changes over a range from the first photoelectric conversion portion segment $20_1$ to the Nth photoelectric conversion portion segment $20_N$. In particular, the thickness of the insulating layer segment gradually increases. Otherwise, in the imaging device of the working example 8, the width of the cross section of the stacked portion is fixed, and the thickness of the cross section of the stacked portion, particularly the thickness of the insulating layer segment, gradually increases depending upon the distance from the first electrode 21. It is to be noted that the thickness of the insulating layer segment increases stepwise. The thickness of the insulating layer segment $82_n$ in the nth photoelectric conversion portion segment $20_n$ is fixed. Where the thickness of the insulating layer segment $82_n$ in the nth photoelectric conversion portion segment $20_n$ is represented by "1," 2 to 10 can be exemplified as the thickness of the insulating layer segment $82_{(n+1)}$ in the (n+1)th photoelectric conversion portion segment $20_{(n+1)}$. However, the thickness of the insulating layer segment $82_n$ is not limited to such a value as just mentioned. In the working example 8, by gradually reducing the thickness of the charge accumulating electrode segments $24_1$, $24_2$, and $24_3$, the thickness of the insulating layer segments $82_1$, $82_2$, and $82_3$ is gradually increased. The thickness of the photoelectric conversion layer segments $23_1$, $23_2$, and $23_3$ is fixed.

In the following, operation of the imaging device of the working example 8 is described.

During a charge accumulation period, from the driving circuit, potential $V_{11}$ is applied to the first electrode 21, and potential $V_{31}$ is applied to the charge accumulating electrode 24. Photoelectric conversion is caused in the photoelectric conversion layer 23 by light incident to the photoelectric conversion layer 23. Positive holes generated by the photoelectric conversion are sent out from the second electrode 22 to the driving circuit through the wiring $V_{OU}$. Meanwhile, since the potential of the first electrode 21 is set higher than the potential of the second electrode 22, that is, since positive potential is applied to the first electrode 21 and negative potential is applied to the second electrode 22, $V_{31}>V_{11}$, preferably $V_{31}\gg V_{11}$, is satisfied. By this, electrons generated by the photoelectric conversion are attracted to the charge accumulating electrode 24 and stay in the region of the photoelectric conversion layer 23 opposed to the charge accumulating electrode 24. In other words, charge is accumulated into the photoelectric conversion layer 23. Since $V_{31}>V_{11}$ is satisfied, electrons generated in the inside of the photoelectric conversion layer 23 do not move toward the first electrode 21. As time of the photoelectric conversion passes, the potential of the region of the photoelectric conversion layer 23 opposed to the charge accumulating electrode 24 comes to have a value increasing to the negative side.

Since the imaging device of the working example 8 adopts the configuration that the thickness of the insulating layer segment gradually increases, if such a state as $V_{31} \geq V_{11}$ appears during a charge accumulation period, then the nth photoelectric conversion portion segment $20_n$ can accumulate a greater amount of charge than the (n+1)th photoelectric conversion portion segment $20_{(n+1)}$ and a stronger electric field is applied, so that a flow of charge from the first photoelectric conversion portion segment $20_1$ to the first electrode 21 can be prevented with certainty.

Reset operation is performed in a later stage of the charge accumulation period. By this, the potential of the first floating diffusion layer $FD_1$ is reset, and the potential of the first floating diffusion layer $FD_1$ becomes the potential $V_{DD}$ of the power supply.

After completion of the reset operation, reading out of charge is performed. In particular, during a charge transfer period, from the driving circuit, potential $V_{12}$ is applied to the first electrode 21, and potential $V_{32}$ is applied to the charge accumulating electrode 24. Here, it is assumed that $V_{12}>V_{32}$ holds. By this, electrons staying in the region of the photoelectric conversion layer 23 opposed to the charge accumulating electrode 24 are read out into the first electrode 21 and further into the first floating diffusion layer $FD_1$. In other words, charge accumulated in the photoelectric conversion layer 23 is read out into the control portion.

More particularly, if such a state as $V_{12}>V_{32}$ appears during a charge transfer period, a flow of charge from the first photoelectric conversion portion segment $20_1$ to the first electrode 21 and a flow of charge from the (n+1)th photoelectric conversion portion segment $20_{(n+1)}$ to the nth photoelectric conversion portion segment $20_n$ can be assured with certainty.

Such a series of operation as charge accumulation, reset operation, and charge transfer is completed therewith.

In the imaging device of the working example 8, since the thickness of the insulating layer segment gradually changes over a range from the first photoelectric conversion portion segment to the Nth photoelectric conversion portion segment, or since the sectional area of the stacked portion when the stacked portion at which the charge accumulating electrode, the insulating layer, and the photoelectric conversion layer are stacked is cut along a YZ virtual plane changes depending upon the distance from the first electrode, a kind of charge transfer gradient is formed, and charge generated by photoelectric conversion can be transferred more easily and with certainty.

Since the imaging device and the stacked type imaging device of the working example 8 can be produced by a substantially similar method to that of the imaging device of the working example 1, detailed description of the method is omitted.

It is to be noted that, in the imaging device of the working example 8, in forming the first electrode 21, the charge accumulating electrode 24, and the insulating layer 82, a conductive material layer for forming the charge accumulating electrode $24_3$ is formed on an interlayer insulating layer 81 first and is then patterned such that the conductive material layer is left in regions in which the photoelectric conversion portion segments $20_1$, $20_2$, and $20_3$ and the first electrode 21 are to be formed and that part of the first electrode 21 and the charge accumulating electrode $24_3$ can be obtained. Then, an insulating layer for forming the insulating layer segment $82_3$ is formed over an overall area and is patterned, and then, a flattening process is performed, so that the insulating layer segment $82_3$ can be obtained. Then, a conductive material layer for forming the charge accumulating electrode $24_2$ is formed over an overall area and is patterned such that the conductive material layer is left in regions in which the photoelectric conversion portion segments $20_1$ and $20_2$ and the first electrode 21 are to be formed, whereby part of the first electrode 21 and the charge accumulating electrode $24_2$ can be obtained. Then, an insulating layer for forming the insulating layer segment $82_2$ is formed over an overall area and is patterned, and then, a flattening process is performed, so that the insulating layer segment $82_2$ can be obtained. Then, a conductive material layer for forming the charge accumulating electrode $24_1$ is formed and patterned such that the conductive material layer is left in regions in which the photoelectric conversion portion segment $20_1$ and the first electrode 21 are to be formed, whereby the first electrode 21 and the charge accumulating electrode $24_1$ can be obtained. Then, an insulating layer is formed over an overall area and a flattening process is performed, so that the insulating layer segment $82_1$ (insulating layer 82) can be obtained. Then, the photoelectric conversion layer 23 is formed on the insulating layer 82. The photoelectric conversion portion segments $20_1$, $20_2$, and $20_3$ can be obtained in such a manner.

The other source/drain region 51B of the reset transistor $TR1_{rst}$ may be grounded instead of being connected to the power supply $V_{DD}$.

WORKING EXAMPLE 9

Figure 32:
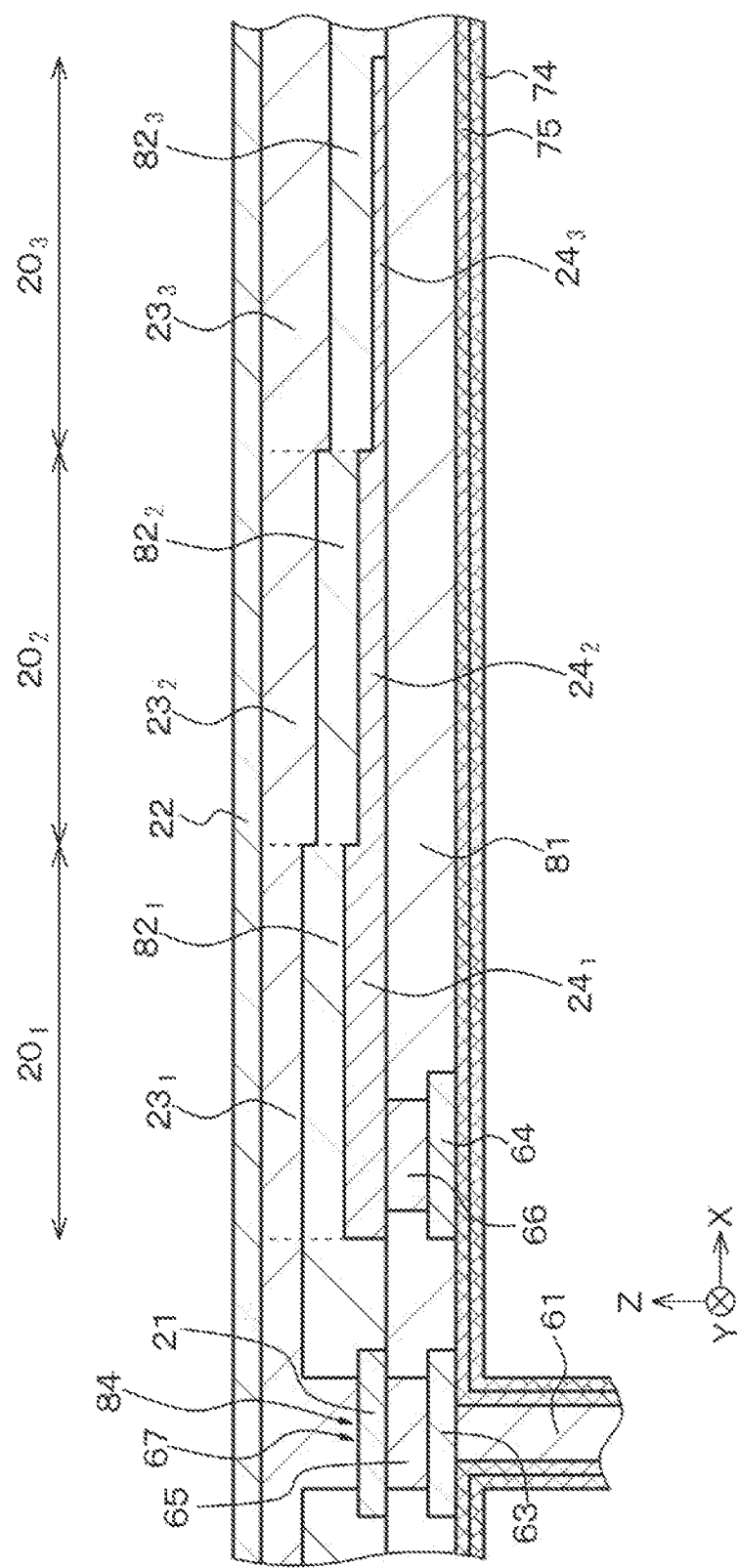
FIG. 32 is a schematic partial sectional view of a portion at which a charge accumulating electrode, a photoelectric conversion layer, and a second electrode in an imaging device of a working example 9 are stacked, in an enlarged scale.

The imaging device of the working example 9 relates to an imaging device of the second configuration and the sixth configuration of the present disclosure. As illustrated in FIG. 32 that depicts a schematic partial sectional view in which a portion at which the charge accumulating electrode, the photoelectric conversion layer, and the second electrode are stacked is depicted in an enlarged scale, in the imaging device of the working example 9, the thickness of the photoelectric conversion layer segment gradually changes over a range from the first photoelectric conversion portion segment $20_1$ to the Nth photoelectric conversion portion segment $20_N$. Otherwise, in the imaging device of the working example 9, the width of the cross section of the stacked portion is fixed while the thickness of the cross section of the stacked portion, particularly the thickness of the photoelectric conversion layer segment, is gradually increased depending upon the distance from the first electrode 21. More particularly, the thickness of the photoelectric conversion layer segment is gradually increased. It is to be noted that the thickness of the photoelectric conversion layer segment is increased stepwise. The thickness of the photoelectric conversion layer segment $23_n$ in the nth photoelectric conversion portion segment $20_n$ is fixed. Where the thickness of the photoelectric conversion layer segment $23_n$ in the nth photoelectric conversion portion segment $20_n$ is "1," 2 to 10 can be exemplified as the thickness of the photoelectric conversion layer segment $23_{(n+1)}$ in the (n+1)th photoelectric conversion portion segment $20_{(n+1)}$. However, the thickness is not limited to such values as just mentioned. In the working example 9, by gradually reducing the thickness of the charge accumulating electrode segments $24_1$, $24_2$, and $24_3$, the thickness of the photoelectric conversion layer segments $23_1$, $23_2$, and $23_3$ is gradually increased. The thickness of the insulating layer segments $82_1$, $82_2$, and $82_3$ is fixed.

In the imaging device of the working example 9, since the thickness of the photoelectric conversion layer segment gradually increases, if such a state as $V_{31} \geq V_{11}$ is entered during a charge accumulation period, then a stronger electric field is applied to the nth photoelectric conversion portion segment $20_n$ than to the (n+1)th photoelectric conversion portion segment $20_{(n+1)}$, and a flow of charge from the first photoelectric conversion portion segment $20_1$ to the first electrode 21 can be prevented with certainty. Then, if such a state as $V_{32} < V_{12}$ is entered during a charge transfer period, then a flow of charge from the first photoelectric conversion portion segment $20_1$ to the first electrode 21 and a flow of charge from the (n+1)th photoelectric conversion portion segment $20_{(n+1)}$ to the nth photoelectric conversion portion segment $20_n$ can be assured with certainty.

In such a manner, in the imaging device of the working example 9, since the thickness of the photoelectric conversion layer segment changes gradually over a range from the first photoelectric conversion portion segment to the Nth photoelectric conversion portion segment, or else, since the sectional area of the stacked portion when the stacked portion at which the charge accumulating electrode, the insulating layer, and the photoelectric conversion layer are stacked is cut along the YZ virtual plane changes depending upon the distance from the first electrode, a kind of charge transfer gradient is formed, and charge generated by the photoelectric conversion can be transferred more readily and with certainty.

In the imaging device of the working example 9, in forming the first electrode 21, the charge accumulating electrode 24, the insulating layer 82, and the photoelectric conversion layer 23, first, a conductive material layer for forming the charge accumulating electrode $24_3$ is formed on an interlayer insulating layer 81 and is patterned such that the conductive material layer is left in regions in which the photoelectric conversion portion segments $20_1$, $20_2$, and $20_3$ and the first electrode 21 are to be formed, whereby part of the first electrode 21 and the charge accumulating electrode $24_3$ can be obtained. Then, a conductive material layer for forming the charge accumulating electrode $24_2$ is formed on an overall area and is patterned such that the conductive material layer is left in regions in which the photoelectric conversion portion segments $20_1$ and $20_2$ and the first electrode 21 are to be formed, whereby part of the first electrode 21 and the charge accumulating electrode $24_2$ can be obtained. Then, a conductive material layer for forming the charge accumulating electrode $24_1$ is formed over an overall area and is patterned such that the conductive material layer is left in regions in which the photoelectric conversion portion segment $20_1$ and the first electrode 21 are to be formed, whereby the first electrode 21 and the charge accumulating electrode $24_1$ can be obtained. Then, the insulating layer 82 is formed conformally over an overall area. Then, the photoelectric conversion layer 23 is formed on the insulating layer 82, and a flattening process is applied to the photoelectric conversion layer 23. In such a manner, the photoelectric conversion portion segments $20_1$, $20_2$, and $20_3$ can be obtained.

WORKING EXAMPLE 10

Figure 33:
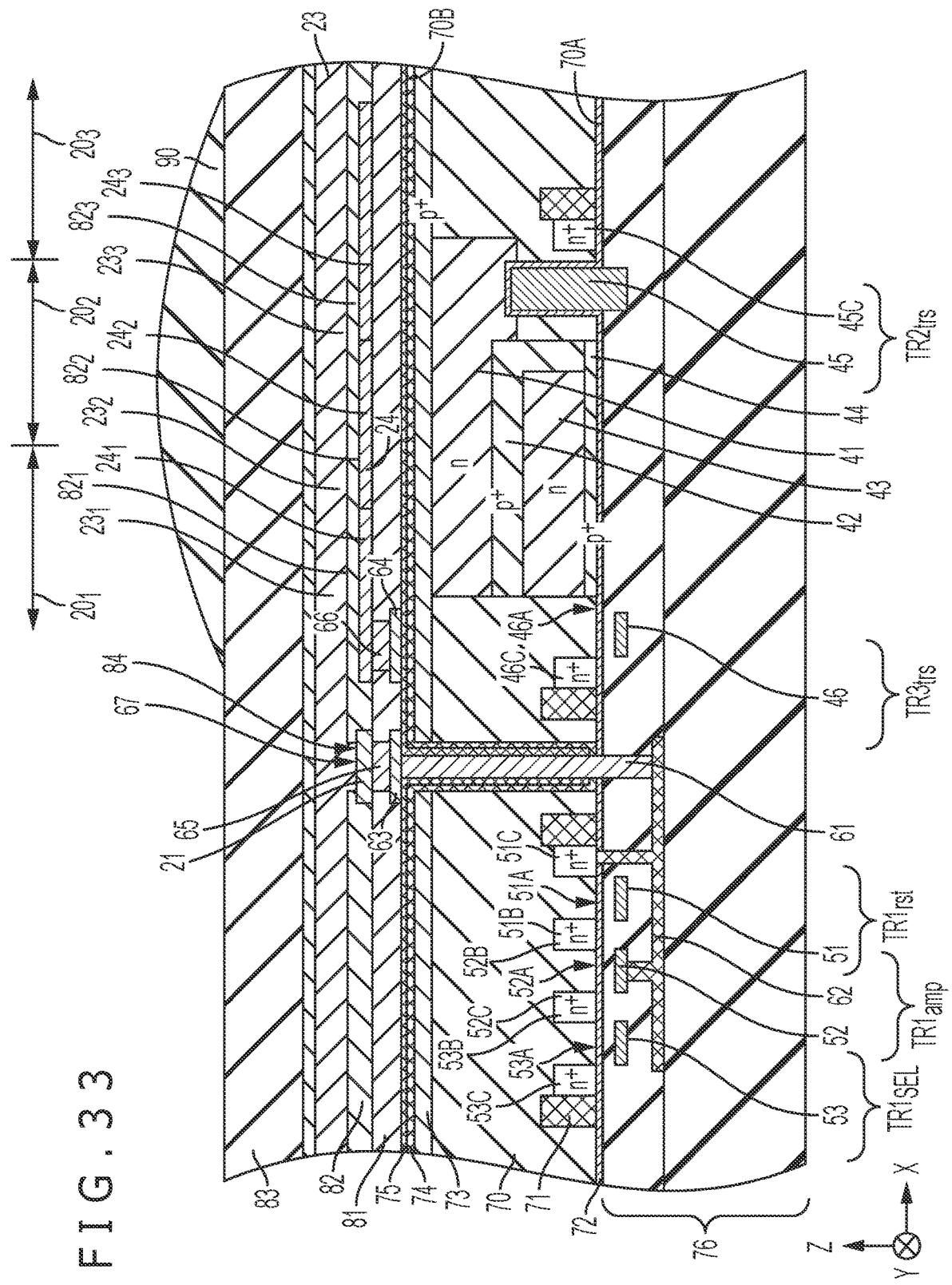
FIG. 33 is a schematic partial sectional view of an imaging device and a stacked type imaging device of a working example 10.

The working example 10 relates to an imaging device of the third configuration. A schematic partial sectional view of the imaging device and the stacked type imaging device of the working example 10 is depicted in FIG. 33. In the imaging device of the working example 10, the material configuring the insulating layer segment is different between adjacent photoelectric conversion portion segments. Here, the value of the relative permittivity of a material configuring the insulating layer segment gradually decreases over a range from the first photoelectric conversion portion segment $20_1$ to the Nth photoelectric conversion portion segment $20_N$. In the imaging device of the working example 10, the same potential may be applied to all of the N charge accumulating electrode segments or different potential may be applied to each of the N charge accumulating electrode segments. In the latter case, it is sufficient if the charge accumulating electrode segments $24_1$, $24_2$, and $24_3$ arranged with a space between each other are connected to the vertical driving circuit 112 configuring the driving circuit, through pad portions $64_1$, $64_2$, and $64_3$, respectively, similarly as in the description of the working example 11.

Then, by adopting such a configuration as described above, a kind of charge transfer gradient is formed, and if such a state as $V_{31} \geq V_{11}$ is entered during a charge accumulation period, then the nth photoelectric conversion portion segment can accumulate a greater amount of charge than the (n+1)th photoelectric conversion portion segment. Then, if such a state of $V_{32} < V_{12}$ is entered during a charge transfer period, then a flow of charge from the first photoelectric conversion portion segment to the first electrode and a flow of charge from the (n+1)th photoelectric conversion portion segment to the nth photoelectric conversion portion segment can be assured with certainty.

WORKING EXAMPLE 11

Figure 34:
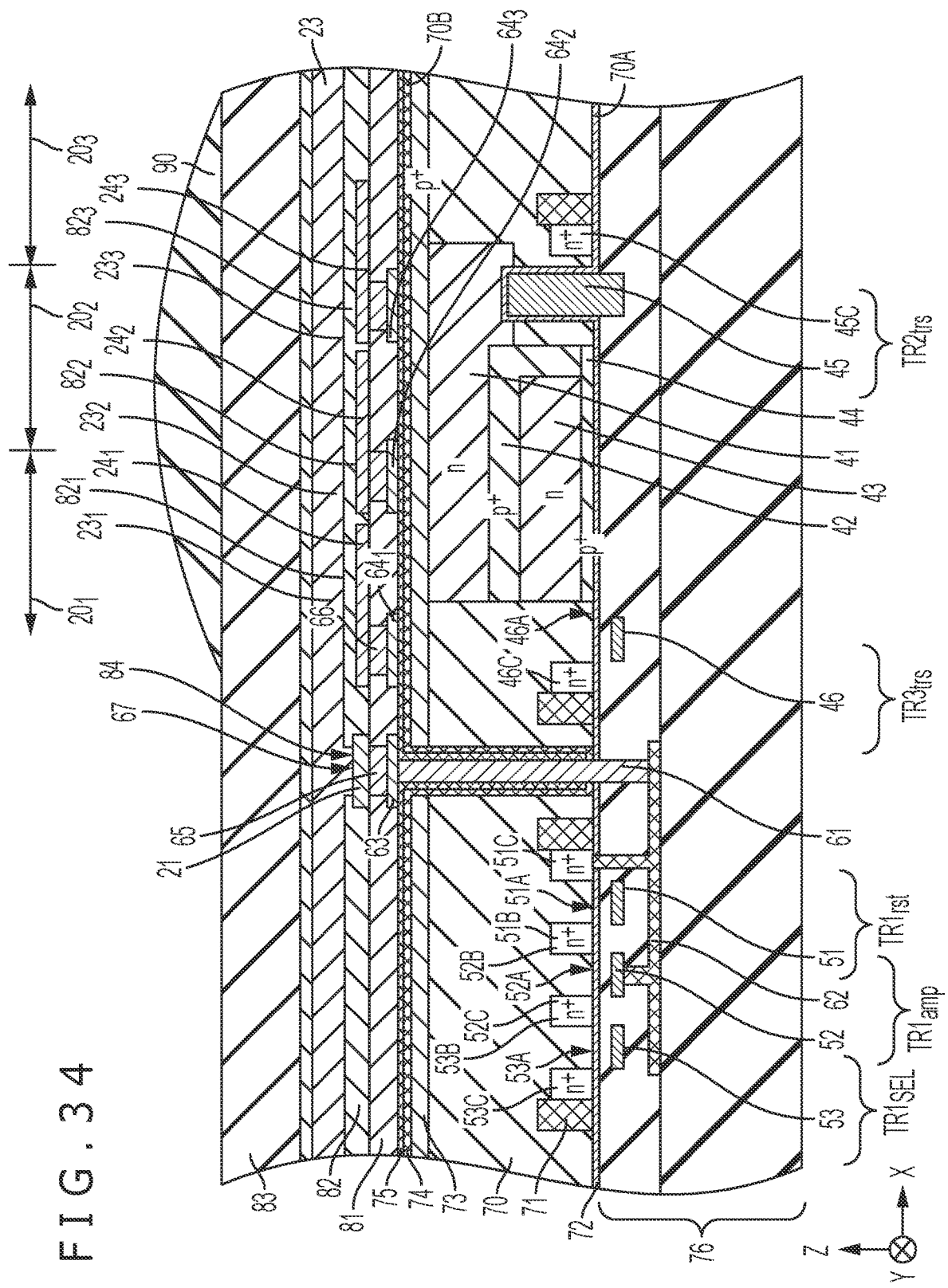
FIG. 34 is a schematic partial sectional view of an imaging device and a stacked type imaging device of a working example 11 and a working example 12.
Figure 35A:
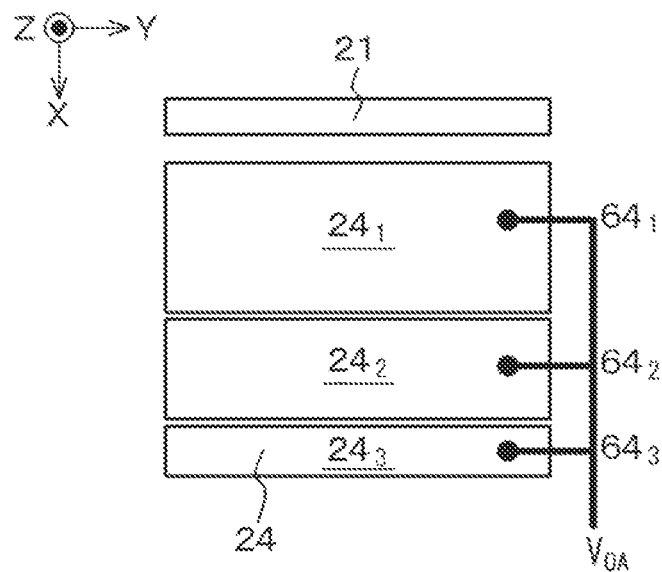
FIGS. 35A and 35B are schematic top plan views of a charge accumulating electrode segment in the working example 12.
Figure 35B:
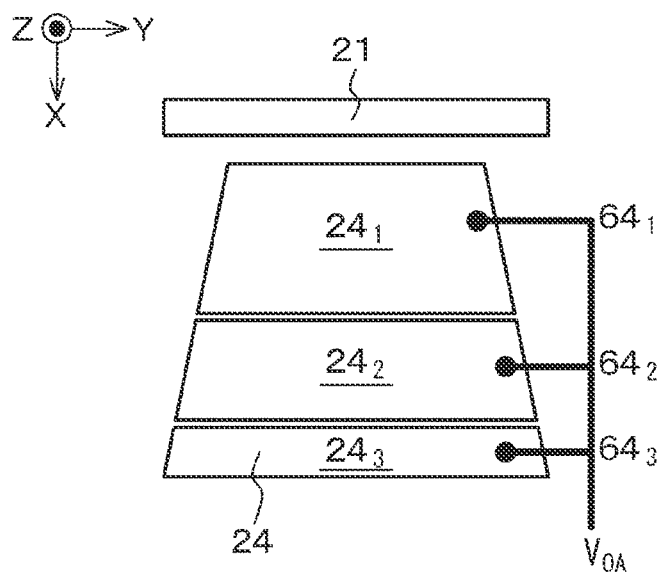
Figure 36A:
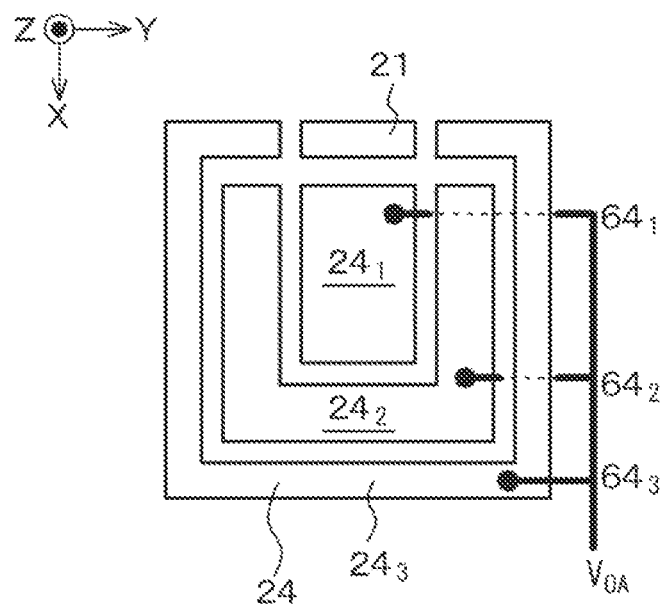
FIGS. 36A and 36B are schematic top plan views of the charge accumulating electrode segment in the working example 12.
Figure 36B:
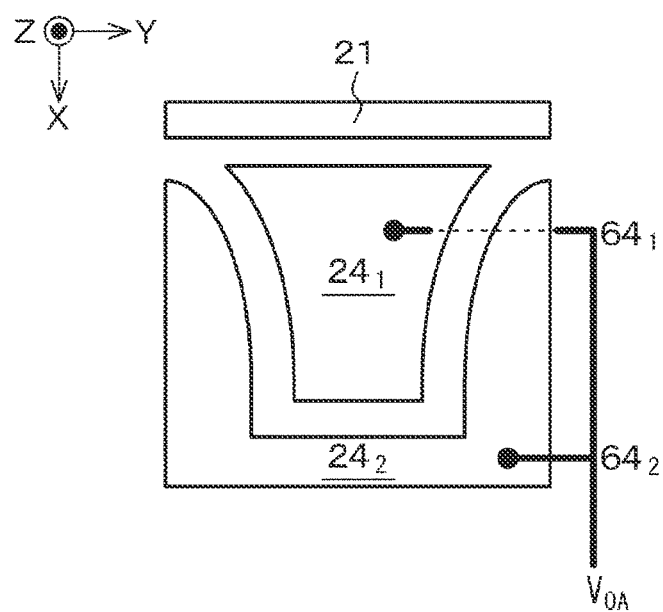

The working example 11 relates to an imaging device of the fourth configuration. A schematic partial sectional view of the imaging device and the stacked type imaging device of the working example 11 is depicted in FIG. 34. In the imaging device of the working example 11, the material configuring the charge accumulating electrode segment is different between adjacent photoelectric conversion portion segments. Here, the value of the work function of the material configuring the insulating layer segment is gradually made higher over a range from the first photoelectric conversion portion segment $20_1$ to the Nth photoelectric conversion portion segment $20_N$. In the imaging device of the working example 11, the same potential may be applied to all of the N charge accumulating electrode segments or different potential may be applied to each of the N charge accumulating electrode segments. In the latter case, the charge accumulating electrode segments $24_1$, $24_2$, and $24_3$ are connected to the vertical driving circuit 112 configuring the driving circuit, through pad portions $64_1$, $64_2$, and $64_3$, respectively.

WORKING EXAMPLE 12

The imaging device of the working example 12 relates to an imaging device of the fifth configuration. Schematic plan views of a charge accumulating electrode segment in the working example 12 are depicted in FIGS. 35A, 35B, 36A, and 36B. A schematic partial sectional view of the imaging device and the stacked type imaging device of the working example 12 is similar to that depicted in FIG. 34 or FIG. 37. In the imaging device of the working example 12, the area of the charge accumulating electrode segment gradually decreases over a range from the first photoelectric conversion portion segment $20_1$ to the Nth photoelectric conversion portion segment $20_N$. In the imaging device of the working example 12, the same potential may be applied to all of the N charge accumulating electrode segments or different potential may be applied to each of the N charge accumulating electrode segments. In particular, it is sufficient if the charge accumulating electrode segments $24_1$, $24_2$, and $24_3$ arranged with a space between each other are connected to the vertical driving circuit 112 configuring the driving circuit, through the pad portions $64_1$, $64_2$, and $64_3$, respectively, similarly as in the description of the working example 11.

In the working example 12, the charge accumulating electrode 24 includes a plurality of charge accumulating electrode segments $24_1$, $24_2$, and $24_3$. It is sufficient if the number of charge accumulating electrode segments is equal to or greater than two, and it is three, in the working example 12. Further, in the imaging device and the stacked type imaging device of the working example 12, since the potential of the first electrode 21 is higher than the potential of the second electrode 22, that is, since, for example, positive potential is applied to the first electrode 21 and negative potential is applied to the second electrode 22, during a charge transfer period, the potential applied to the charge accumulating electrode segment $24_1$ positioned nearest to the first electrode 21 is higher than the potential applied to the charge accumulating electrode segment $24_3$ positioned remotest from the first electrode 21. By providing a potential gradient to the charge accumulating electrode 24 in such a manner, electrons staying in the region of the photoelectric conversion layer 23 opposed to the charge accumulating electrode 24 are read out with a higher degree of certainty to the first electrode 21 and further to the first floating diffusion layer $FD_1$. In other words, charge accumulated in the photoelectric conversion layer 23 is read out to the control portion.

Then, during a charge transfer period, by setting such that the potential of the charge accumulating electrode segment $24_3$ < potential of the charge accumulating electrode segment $24_2$ < potential of the charge accumulating electrode segment $24_1$ holds, electrons staying in the region of the photoelectric conversion layer 23 can be read out all at once to the first floating diffusion layer $FD_1$. Else, during a charge transfer period, since the potential of the charge accumulating electrode segment $24_3$, the potential of the charge accumulating electrode segment $24_2$, and the potential of the charge accumulating electrode segment $24_1$ are gradually changed (that is, are changed stepwise or in a slope), electrons staying in the region of the photoelectric conversion layer 23 opposed to the charge accumulating electrode segment $24_3$ can be moved into the region of the photoelectric conversion layer 23 opposed to the charge accumulating electrode segment $24_2$, electrons staying in the region of the photoelectric conversion layer 23 opposed to the charge accumulating electrode segment $24_2$ can be moved into the region of the photoelectric conversion layer 23 opposed to the charge accumulating electrode segment $24_1$, and then, electrons staying in the region of the photoelectric conversion layer 23 opposed to the charge accumulating electrode segment $24_1$ can be read out into the first floating diffusion layer FD1 with certainty.

The other source/drain region 51B of the reset transistor $TR3_{rst}$ may be grounded instead of being connected to the power supply $V_{DD}$.

Also in the imaging device of the working example 12, by adopting such a configuration as described above, a kind of charge transfer gradient is formed. In particular, since the area of the charge accumulating electrode segment gradually decreases over a range from the first photoelectric conversion portion segment $20_1$ to the Nth photoelectric conversion portion segment $20_N$, if such a state as $V_{31} \geq V_{11}$ is entered during a charge accumulation period, then the nth photoelectric conversion portion segment can accumulate a greater amount of charge than the (n+1)th photoelectric conversion portion segment. Then, if such a state as $V_{32} < V_{12}$ is entered during a charge transfer period, then a flow of charge from the first photoelectric conversion portion segment to the first electrode and a flow of charge from the (n+1)th photoelectric conversion portion segment to the nth photoelectric conversion portion segment can be assured with certainty.

WORKING EXAMPLE 13

Figure 37:
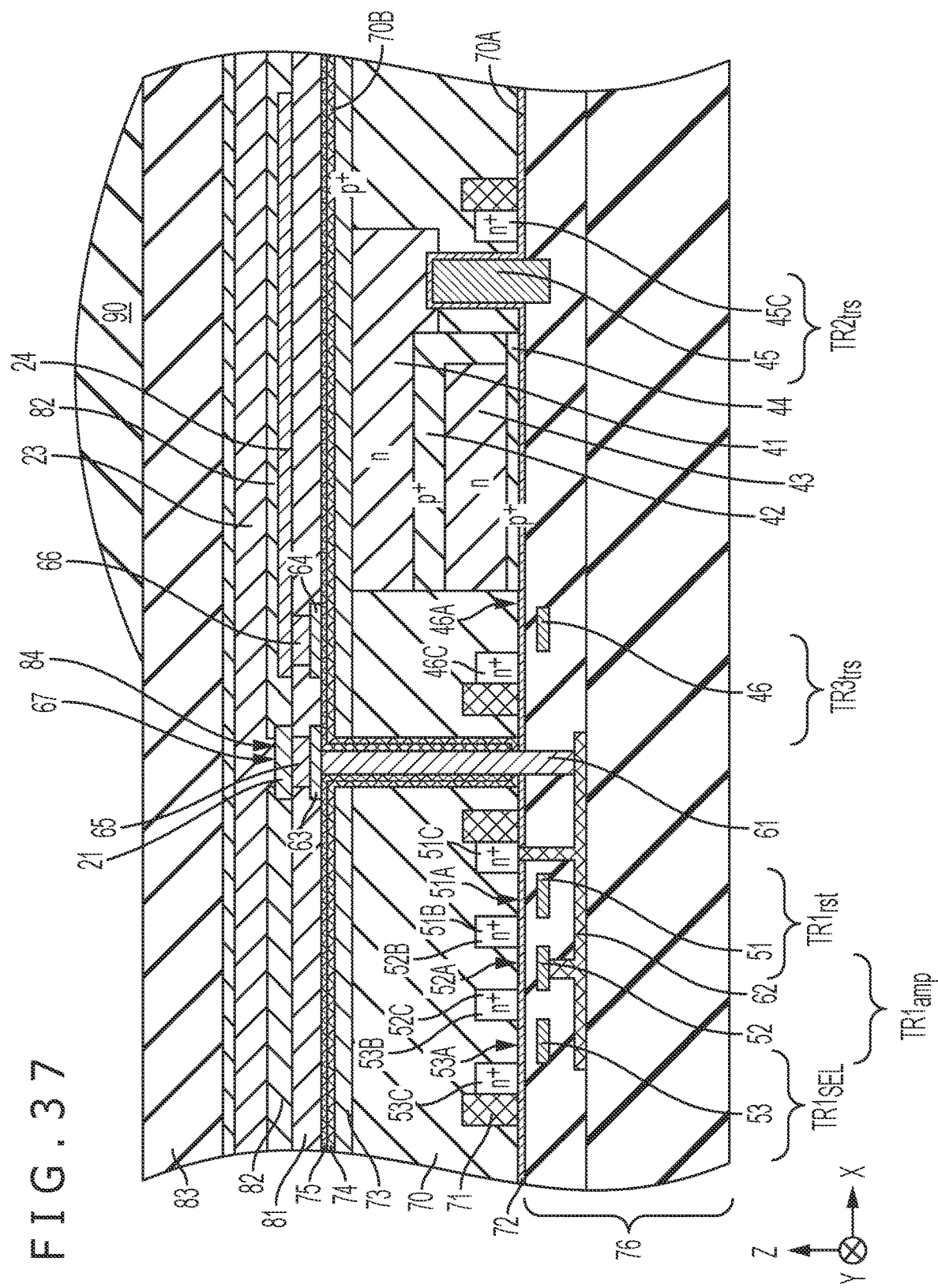
FIG. 37 is a schematic partial sectional view of an imaging device and a stacked type imaging device of a working example 13 and the working example 12.
Figure 38A:
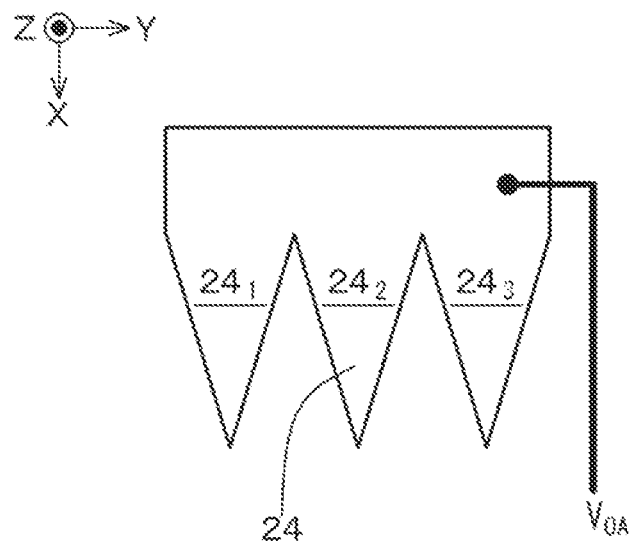
FIGS. 38A and 38B are schematic top plan views of a charge accumulating electrode segment of the working example 13.
Figure 38B:
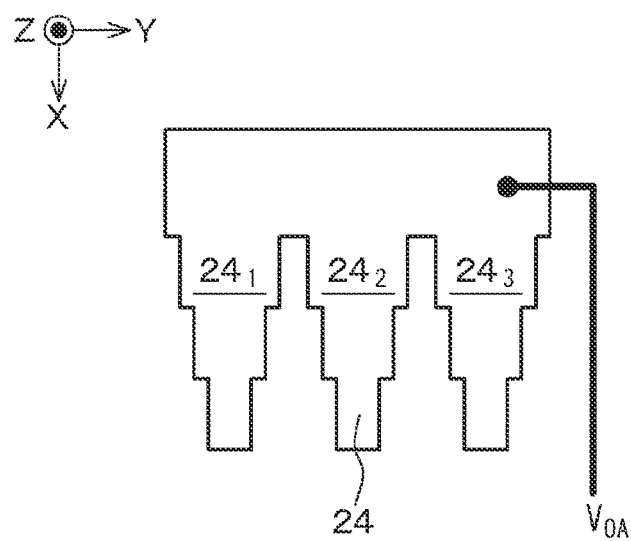

The working example 13 relates to an imaging device of the sixth configuration. A schematic partial sectional view of the imaging device and the stacked type imaging device of the working example 13 is depicted in FIG. 37. Further, schematic plan views of a charge accumulating electrode segment in the working example 13 are depicted in FIGS. 38A and 38B. The imaging device of the working example 13 includes a photoelectric conversion portion in which a first electrode 21, a photoelectric conversion layer 23, and a second electrode 22 are stacked, and the photoelectric conversion portion further includes a charge accumulating electrode 24 arranged with a space from the first electrode 21 and arranged opposed to the photoelectric conversion layer 23 with an insulating layer 82 interposed therebetween. Further, where the stacking direction of the charge accumulating electrode 24, the insulating layer 82, and the photoelectric conversion layer 23 is defined as a Z direction and a direction away from the first electrode 21 is defined as an X direction, the sectional area of the stacked portion when the stacked portion at which the charge accumulating electrode 24, the insulating layer 82, and the photoelectric conversion layer 23 are stacked is cut along a YZ virtual plane changes depending upon the distance from the first electrode 21.

In particular, in the imaging device of the working example 13, the thickness of the cross section of the stacked portion is fixed and the width of the cross section of the stacked portion decreases as the distance from the first electrode 21 increases. It is to be noted that the width may decrease continuously (refer to FIG. 38A) or may decrease stepwise (refer to FIG. 38B).

In such a manner, in the imaging device of the working example 12, since the sectional area of the stacked portion when the stacked portion at which the charge accumulating electrode 24, the insulating layer 82, and the photoelectric conversion layer 23 are stacked is cut along a YZ virtual plane changes depending upon the distance from the first electrode, a kind of charge transfer gradient is formed, and charge generated by photoelectric conversion can be transferred more easily and with certainty.

Although the present disclosure is described above on the basis of the preferred working examples, the present disclosure is not limited to the working examples described. The structures and configurations, production conditions, production methods, and used materials of the imaging devices, stacked type imaging device, and solid-state image sensors described in connection with the working examples are exemplary and can be changed suitably. The imaging devices of the working examples can be combined suitably. For example, the imaging device of the working example 8, the imaging device of the working example 9, the imaging device of the working example 10, the imaging device of the working example 11, and the imaging device of the working example 12 can be combined optionally, and the imaging device of the working example 8, the imaging device of the working example 9, the imaging device of the working example 10, the imaging device of the working example 11, and the imaging device of the working example 13 can be combined optionally.

Although, in the working examples, one imaging device block includes 2×2 imaging devices, the number of one imaging device block is not limited to this, and it is also possible to have one imaging device block include, for example, 2×1 imaging devices, 3×3 imaging devices, 4×4 imaging devices or the like. The first direction may be a row direction or a column direction in an imaging device array of the solid-state image sensor.

In some cases, it is also possible to cause the floating diffusion layers $FD_1$, $FD_2$, and $FD_3$, the one source/drain region 51C of the reset transistor $TR1_{rst}$, the region 45C of the semiconductor substrate 70 in the proximity of the gate portion 45 of the transfer transistor $TR2_{trs}$, and the region 46C of the semiconductor substrate 70 in the proximity of the gate portion 46 of the transfer transistor $TR3_{trs}$ to be shared by a plurality of imaging devices.

Figure 39:
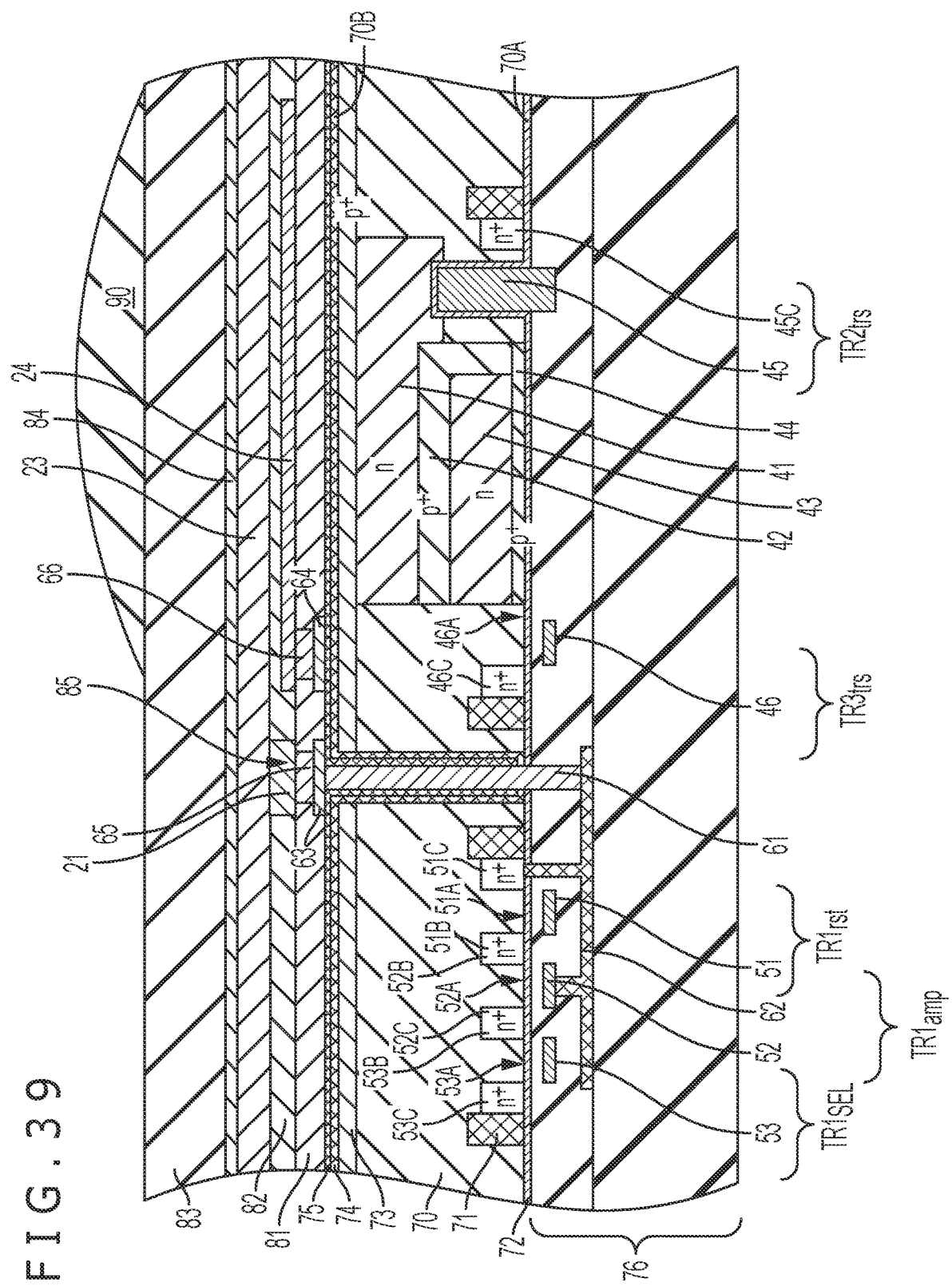
FIG. 39 is a schematic partial sectional view of another modification of the imaging device and the stacked type imaging device of the working example 1.

As depicted in FIG. 39 that illustrates, for example, a modification of the imaging device and the stacked type imaging device described in connection with the working example 1, the first electrode 21 can be configured such that it extends in an opening 84A provided in the insulating layer 82 and is connected to the photoelectric conversion layer 23.

Figure 40:
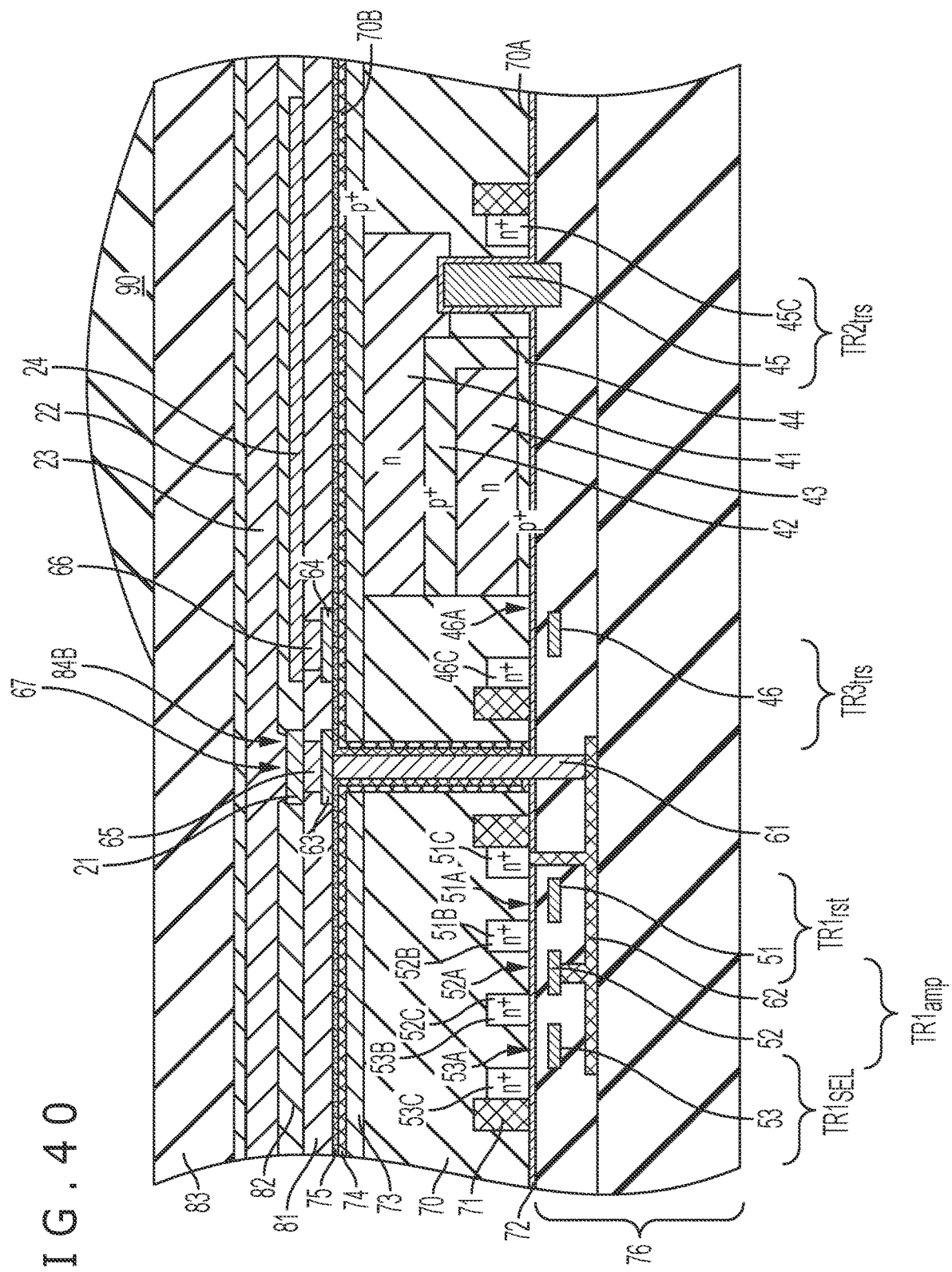
FIG. 40 is a schematic partial sectional view of a further modification of the imaging device and the stacked type imaging device of the working example 1.
Figure 41A:
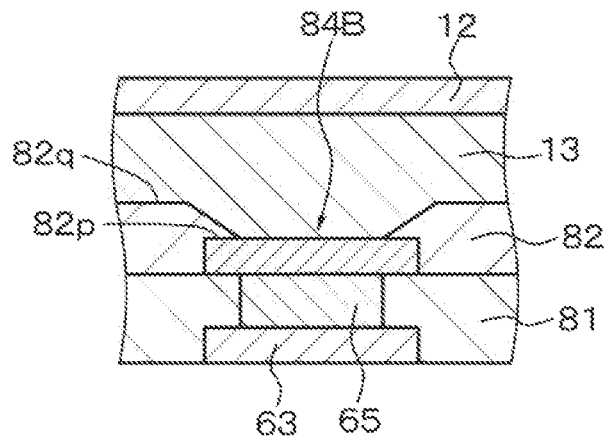
FIGS. 41A, 41B, and 41C are schematic partial sectional views of a portion of a first electrode and so forth of the further modification of the imaging device and the stacked type imaging device of the working example 1, in an enlarged scale.
Figure 41B:
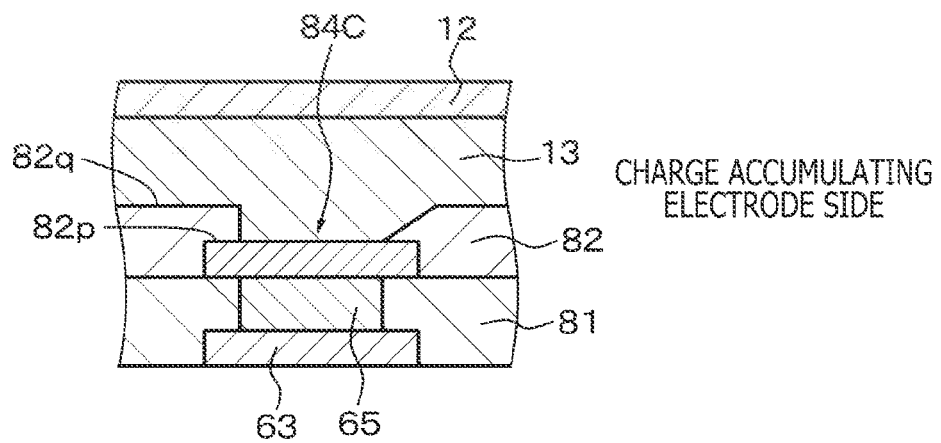
Figure 41C:
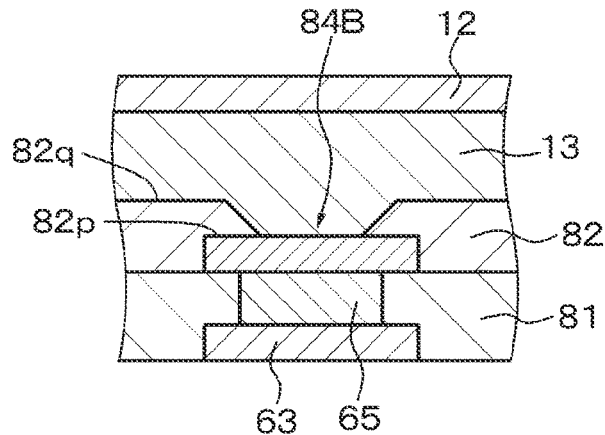

Alternatively, where, as depicted in FIG. 40 that illustrates a modification of, for example, the imaging device and the stacked type imaging device described hereinabove in connection with the working example 1 and FIG. 41A that is a schematic partial sectional view illustrating a portion of the first electrode and so forth in an enlarged scale, an edge portion of a top face of the first electrode 21 is covered with the insulating layer 82, and the first electrode 21 is exposed on a bottom face of an opening 84B. Where a face of the insulating layer 82 contacting with the top face of the first electrode 21 is a first face 82p while a face of the insulating layer 82 contacting with a portion of the photoelectric conversion layer 23 opposed to the charge accumulating electrode 24 is a second face 82q, a side face of the opening 84B has an inclination that expands from the first face 82p toward the second face 82q. By providing an inclination to the side face of the opening 84B in such a manner, movement of charge from the photoelectric conversion layer 23 to the first electrode 21 becomes further smoother. It is to be noted that, although, in the example depicted in FIG. 41A, the side face of the opening 84B is rotationally symmetric with respect to the axial line of the opening 84B as a center, an opening 84C may be provided such that the side face of the opening 84C having an inclination that expands from the first face 82p toward the second face 82q is positioned on the charge accumulating electrode 24 side, as depicted in FIG. 41B. By this, movement of charge from a portion of the photoelectric conversion layer 23 on the opposite side of the charge accumulating electrode 24 across the opening 84C becomes less likely to be performed. Further, although the side face of the opening 84B has an inclination that expands from the first face 82p toward the second face 82q, an edge portion of the side face of the opening 84B at the second face 82q may be positioned on the outer side than an edge portion of the first electrode 21 as depicted in FIG. 41A or may be positioned on the inner side than an edge portion of the first electrode 21 as depicted in FIG. 41C. Where the former configuration is adopted, transfer of charge becomes further easier, and where the latter configuration is adopted, the dispersion in shape upon formation of the openings can be reduced.

Such openings 84B and 84C as described above can each be formed by reflowing an etching mask made of a resist material that is formed when the opening is formed in an insulating layer by an etching method, to provide an inclination to an opening side face of the etching mask, and then etching the insulating layer 82 by using the etching mask.

Figure 42:
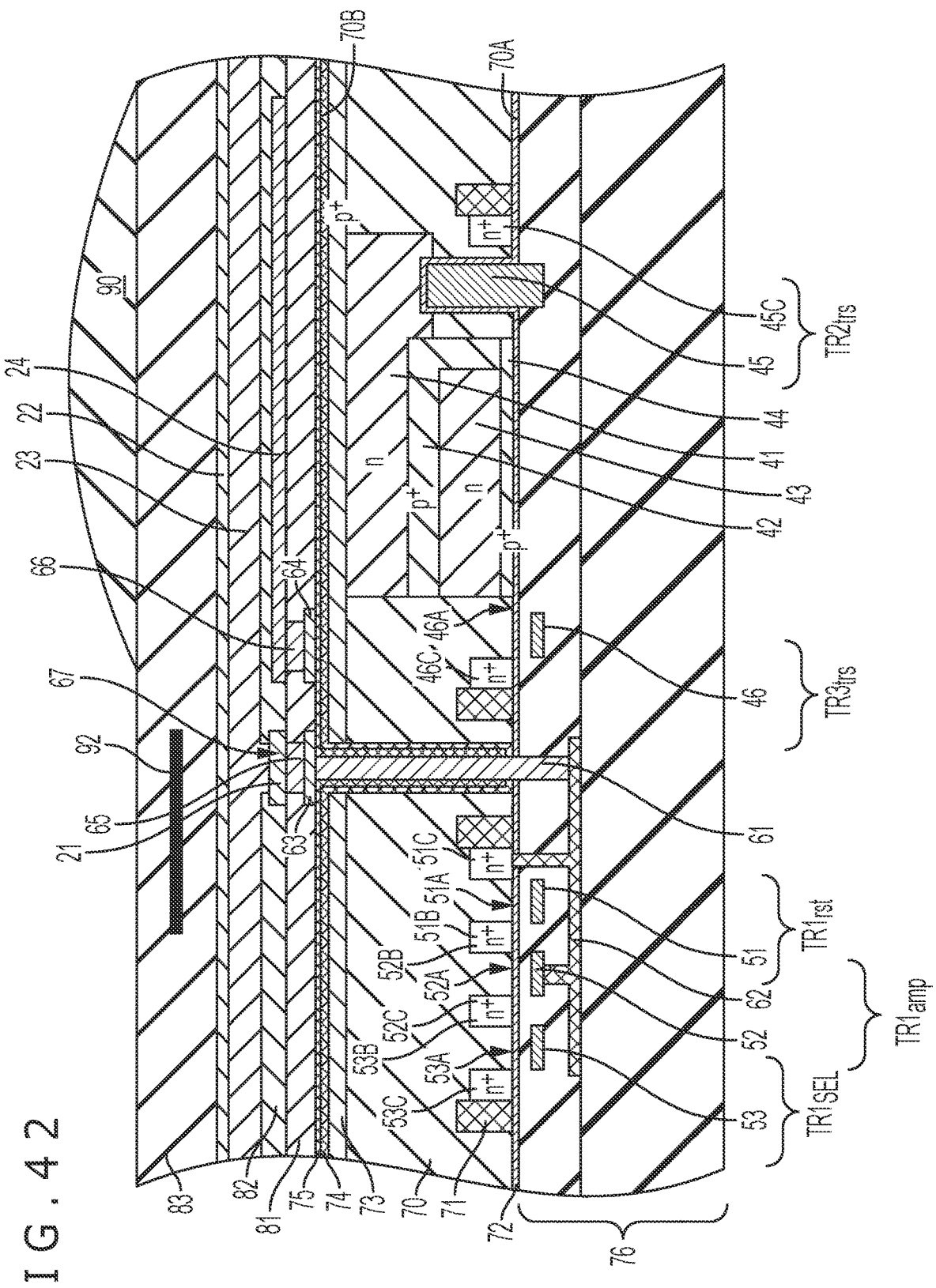
FIG. 42 is a schematic partial sectional view of a still further modification of the imaging device and the stacked type imaging device of the working example 1.

Further, as depicted in FIG. 42 that illustrates a modification of the imaging device and the stacked type imaging device described hereinabove, for example, in connection with the working example 1, the imaging device and the stacked type imaging device can be configured such that light is incident from the side of the second electrode 22 and a shading layer 92 is formed on the light incidence side from the second electrode 22. It is to be noted that it is also possible to cause various kinds of wiring provided on the light incidence side with respect to the light photoelectric conversion layer to function as a shading layer.

Figure 43:
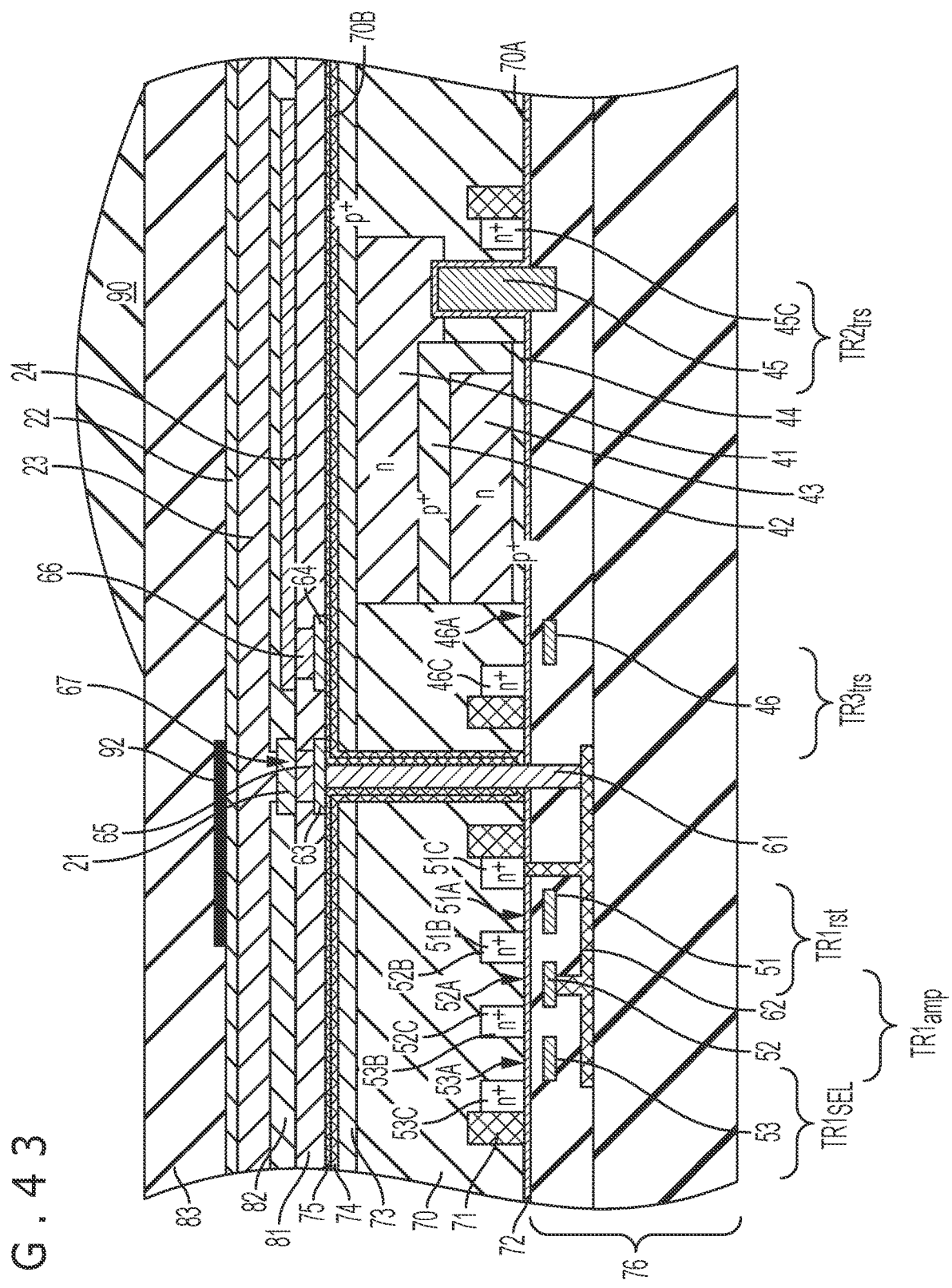
FIG. 43 is a schematic partial sectional view of a yet further modification of the imaging device and the stacked type imaging device of the working example 1.
Figure 44:
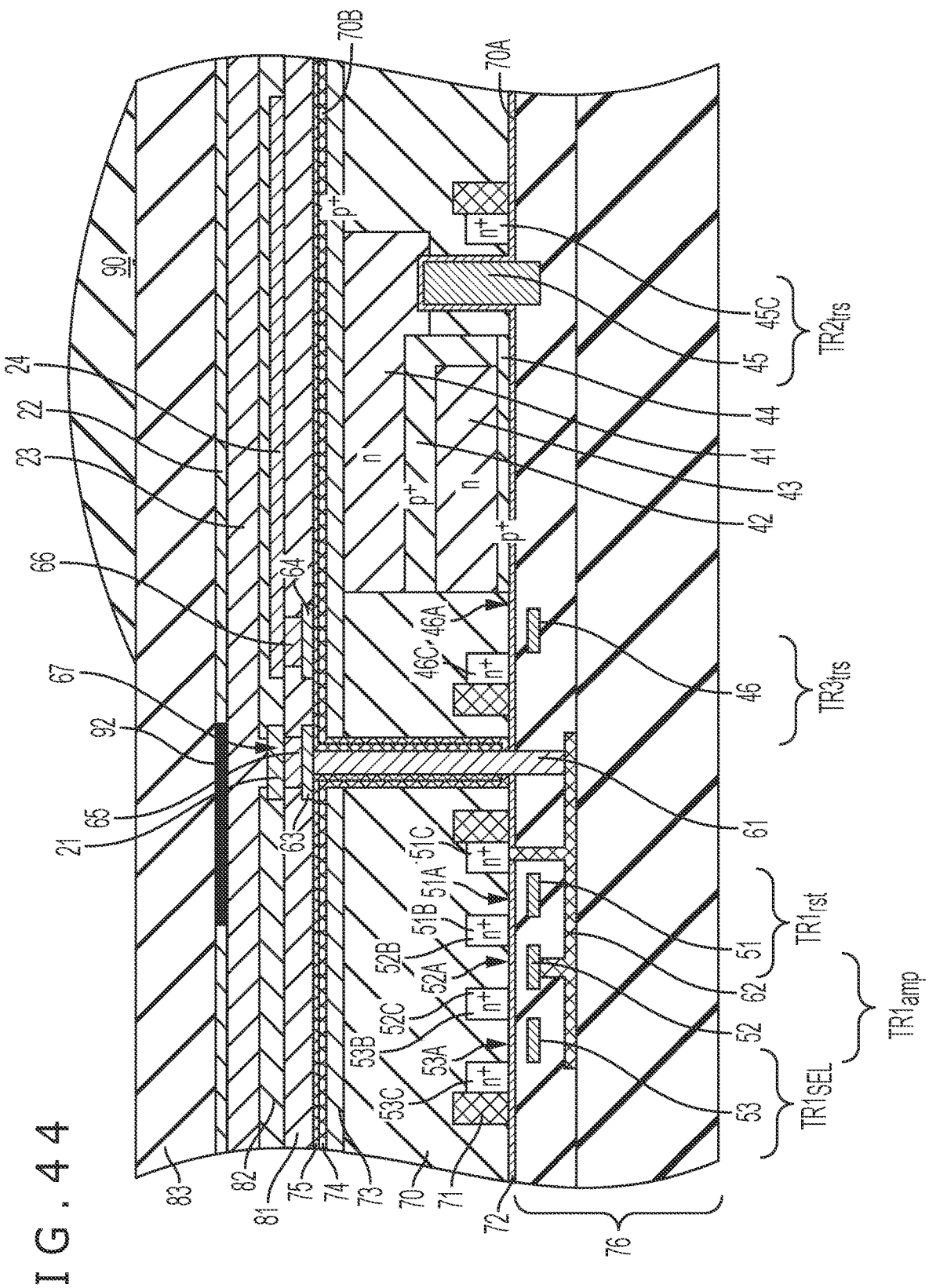
FIG. 44 is a schematic partial sectional view of a yet further modification of the imaging device and the stacked type imaging device of the working example 1.

It is to be noted that, although, in the example depicted in FIG. 42, the shading layer 92 is formed above the second electrode 22, that is, although the shading layer 92 is formed above the first electrode 21 on the light incidence side from the second electrode 22, it may otherwise be arranged on a face of the second electrode 22 on the light incidence side as depicted in FIG. 43. Further, in some cases, the shading layer 92 may be formed on the second electrode 22 as depicted in FIG. 44.

Figure 45:
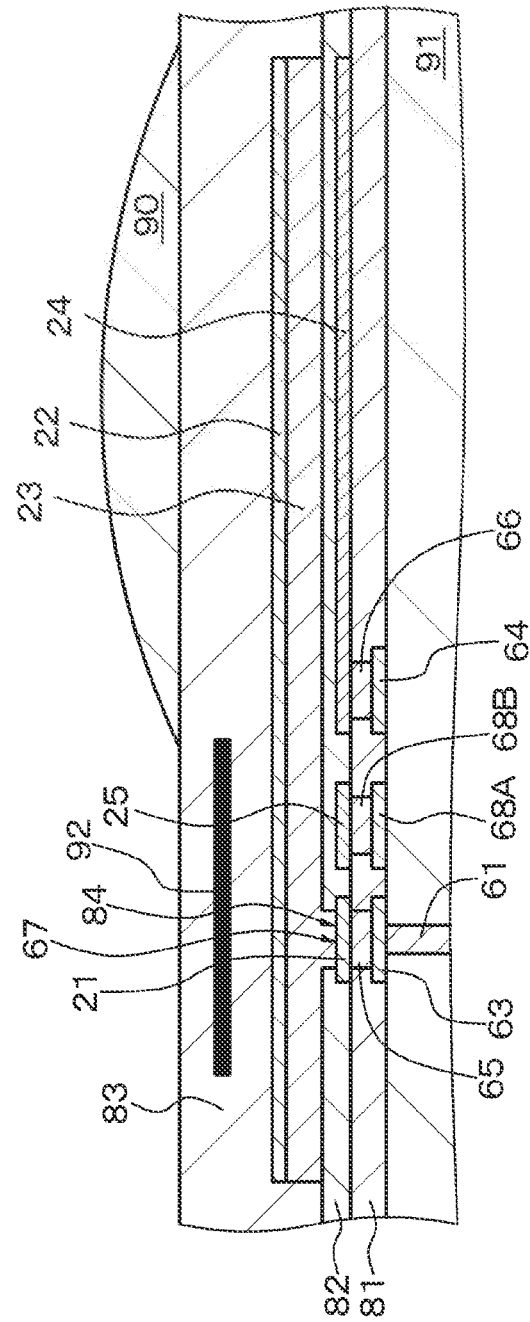
FIG. 45 is a schematic partial sectional view of another modification of the imaging device and the stacked type imaging device of the working example 6.
Figure 46:
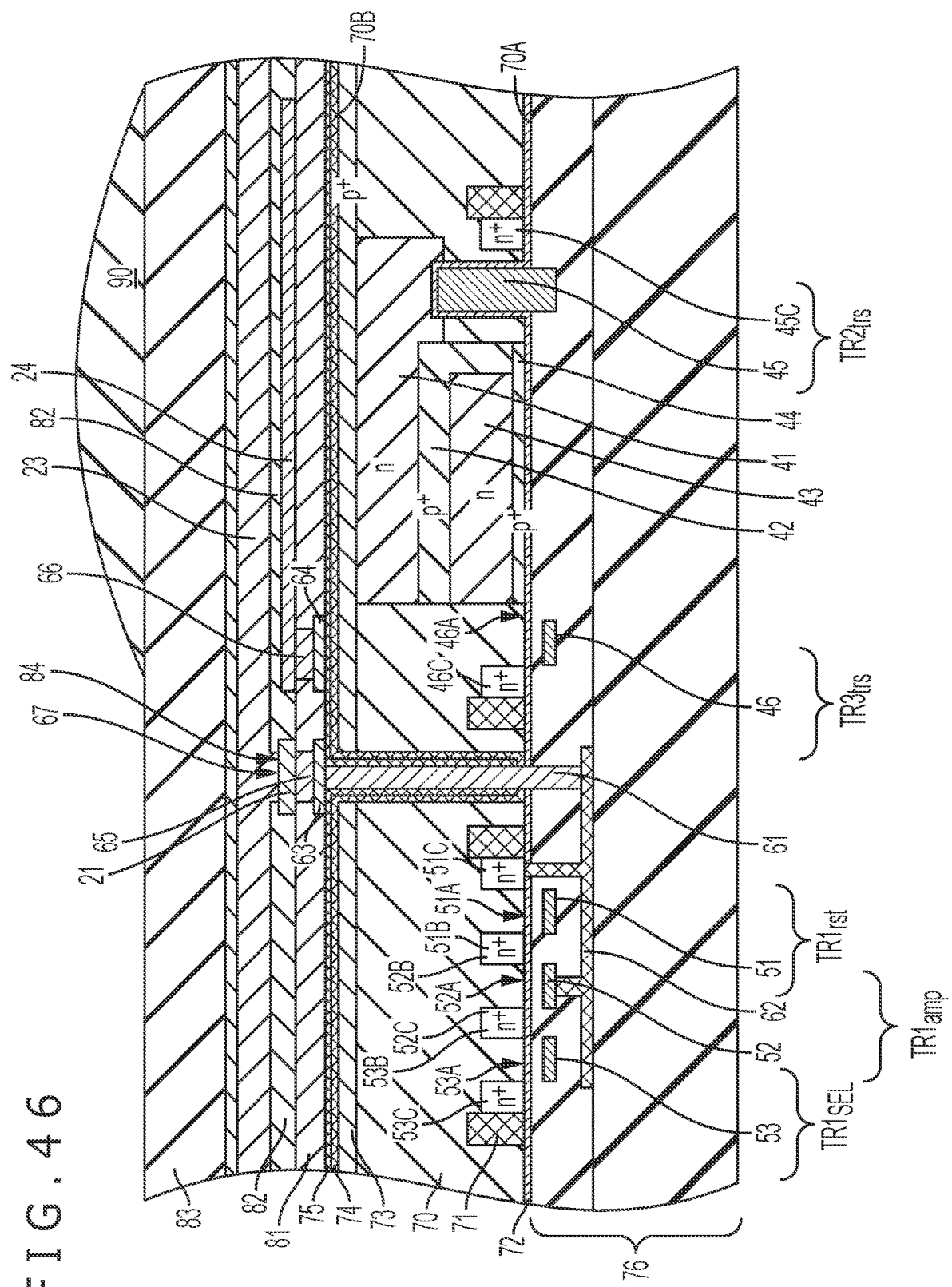
FIG. 46 is a schematic partial sectional view of a yet further modification of the imaging device and the stacked type imaging device of the working example 1.

Alternatively, it is also possible to adopt such a structure that light is incident from the second electrode 22 side while light is not incident to the first electrode 21. In particular, as depicted in FIG. 42, a shading layer 92 is formed above the first electrode 21 and on the light incidence side from the second electrode 22. Alternatively, as depicted in FIG. 46, such a structure in which an on-chip microlens 90 is provided above the charge accumulating electrode 24 and the second electrode 22 such that light incident to the on-chip microlens 90 is focused on the charge accumulating electrode 24 and does not reach the first electrode 21 may be used. It is to be noted that, in the case where the transfer controlling electrode 25 is provided as described hereinabove in connection with the working example 6, it is possible to adopt a form in which light is not incident to the first electrode 21 and the transfer controlling electrode 25, and particularly, it is also possible to adopt a structure in which the shading layer 92 is formed above the first electrode 21 and the transfer controlling electrode 25 as depicted in FIG. 45. Alternatively, it is also possible to adopt a structure in which light incident to the on-chip microlens 90 does not reach the first electrode 21 or the first electrode 21 and the transfer controlling electrode 25.

By adopting such configurations or structures as described above, or by providing the shading layer 92 or designing the on-chip microlens 90 such that light is incident only to a portion of the photoelectric conversion layer 23 positioned above the charge accumulating electrode 24, a portion of the photoelectric conversion layer 23 that is positioned above the first electrode 21 (or above the first electrode 21 and the transfer controlling electrode 25) does not contribute to photoelectric conversion. Therefore, all pixels can be reset all at once with a higher degree of accuracy, and a global shutter function can be implemented more easily. In particular, in a driving method for a solid-state image sensor that includes a plurality of imaging devices having such configurations or structures as described above, steps of discharging, in all imaging devices, while charge is accumulated into the photoelectric conversion layer 23, charge in the first electrode 21 to the outside of the system all at once, and then transferring, in all imaging devices, the charge accumulated in the photoelectric conversion layer 23 to the first electrode 21, all at once, and sequentially reading out, after completion of the transfer, the transferred charge to the first electrode 21 in each imaging device.

In such a driving method for a solid-state image sensor, each imaging device is structured such that light incident from the second electrode side is not incident to the first electrode, and in all imaging devices, while charge is accumulated into the photoelectric conversion layer, charge in the first electrode is discharged to the outside of the system all at once. Thus, in all imaging devices, resetting of the first electrode can be performed all at once with certainty. Thereafter, in all imaging devices, charge accumulated in the photoelectric conversion layer is transferred to the first electrode all at once, and after completion of the transfer, the charge accumulated in the first electrode in each imaging device is read out sequentially. Therefore, what is generally called a global shutter function can be implemented readily.

Figure 47:
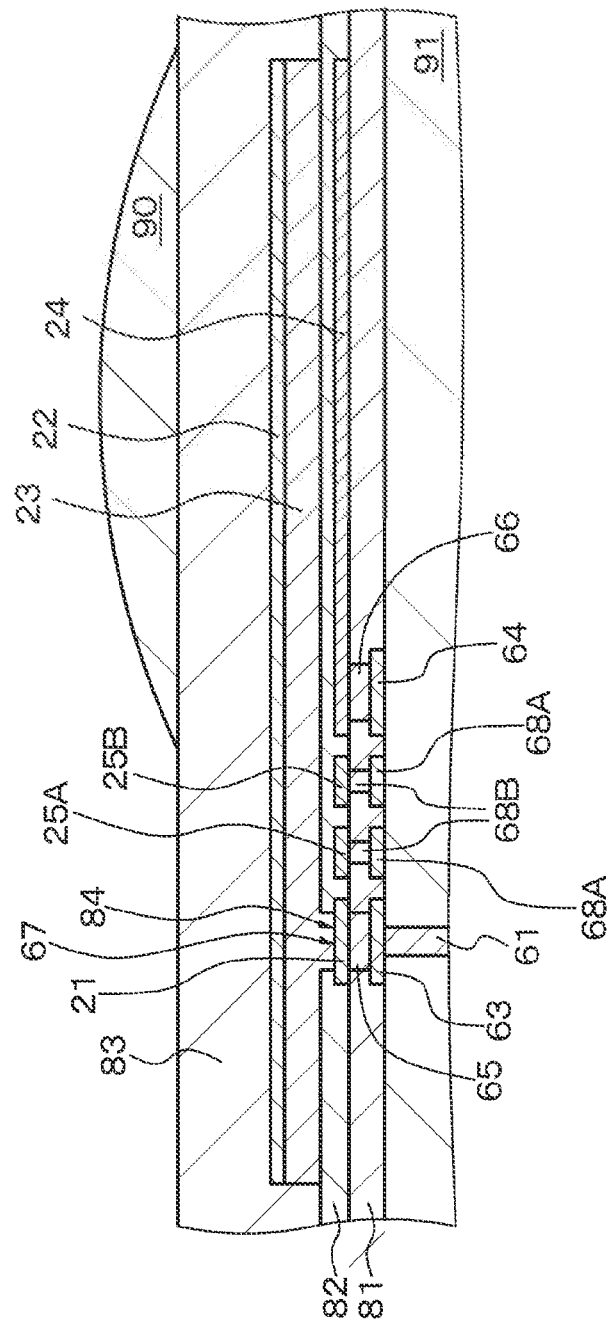
FIG. 47 is a schematic partial sectional view of a further modification of the imaging device and the stacked type imaging device of the working example 6.

Further, as a modification of the working example 6, a plurality of transfer controlling electrodes may be provided from a position nearest to the first electrode 21 toward the charge accumulating electrode 24 as depicted in FIG. 47. It is to be noted that FIG. 47 depicts an example in which two transfer controlling electrodes 25A and 25B are provided. Further, it is possible to adopt a structure in which, above the charge accumulating electrode 24 and the second electrode 22, an on-chip microlens 90 is provided such that light incident to the on-chip microlens 90 is focused on the charge accumulating electrode 24 and does not reach the first electrode 21 and the transfer controlling electrodes 25A and 25B.

Figure 48:
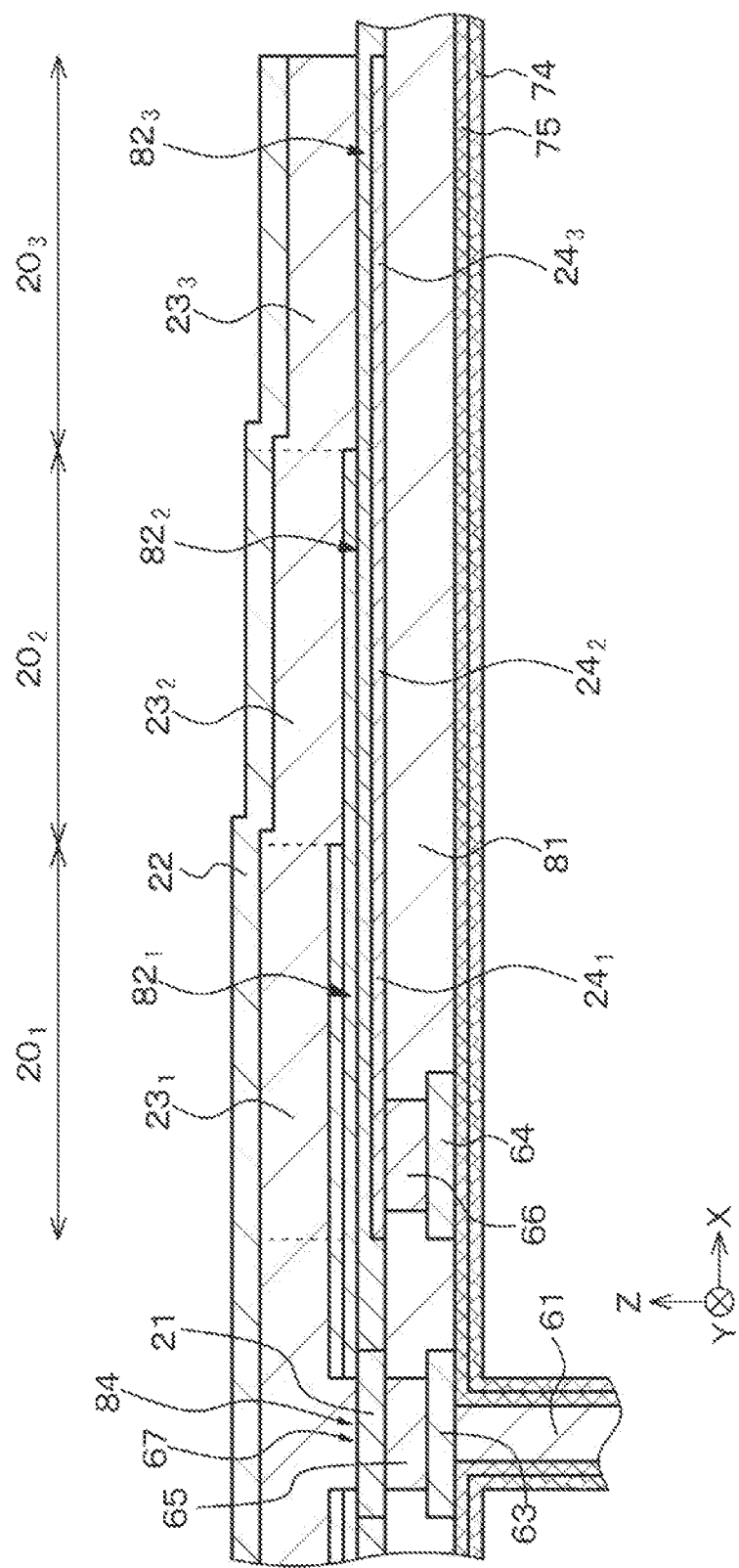
FIG. 48 is a schematic partial sectional view of a portion at which the charge accumulating electrode, the photoelectric conversion layer, and the second electrode in the modification of the imaging device of the working example 8 are stacked, in an enlarged scale.

In the working example 8 depicted in FIGS. 30 and 31, the thickness of the charge accumulating electrode segments $24_1$, $24_2$, and $24_3$ is gradually decreased to gradually increase the thickness of the insulating layer segments $82_1$, $82_2$, and $82_3$. On the other hand, as depicted in FIG. 48 that is a schematic partial sectional view illustrating a portion at which the charge accumulating electrode, the photoelectric conversion layer, and the second electrode are stacked in the modification of the working example 8 in an enlarged scale, the thickness of the charge accumulating electrode segments $24_1$, $24_2$, and $24_3$ may be fixed while the thickness of the insulating layer segments $82_1$, $82_2$, and $82_3$ is gradually increased. It is to be noted that the thickness of the photoelectric conversion layer segments $23_1$, $23_2$, and $23_3$ is fixed.

Figure 49:
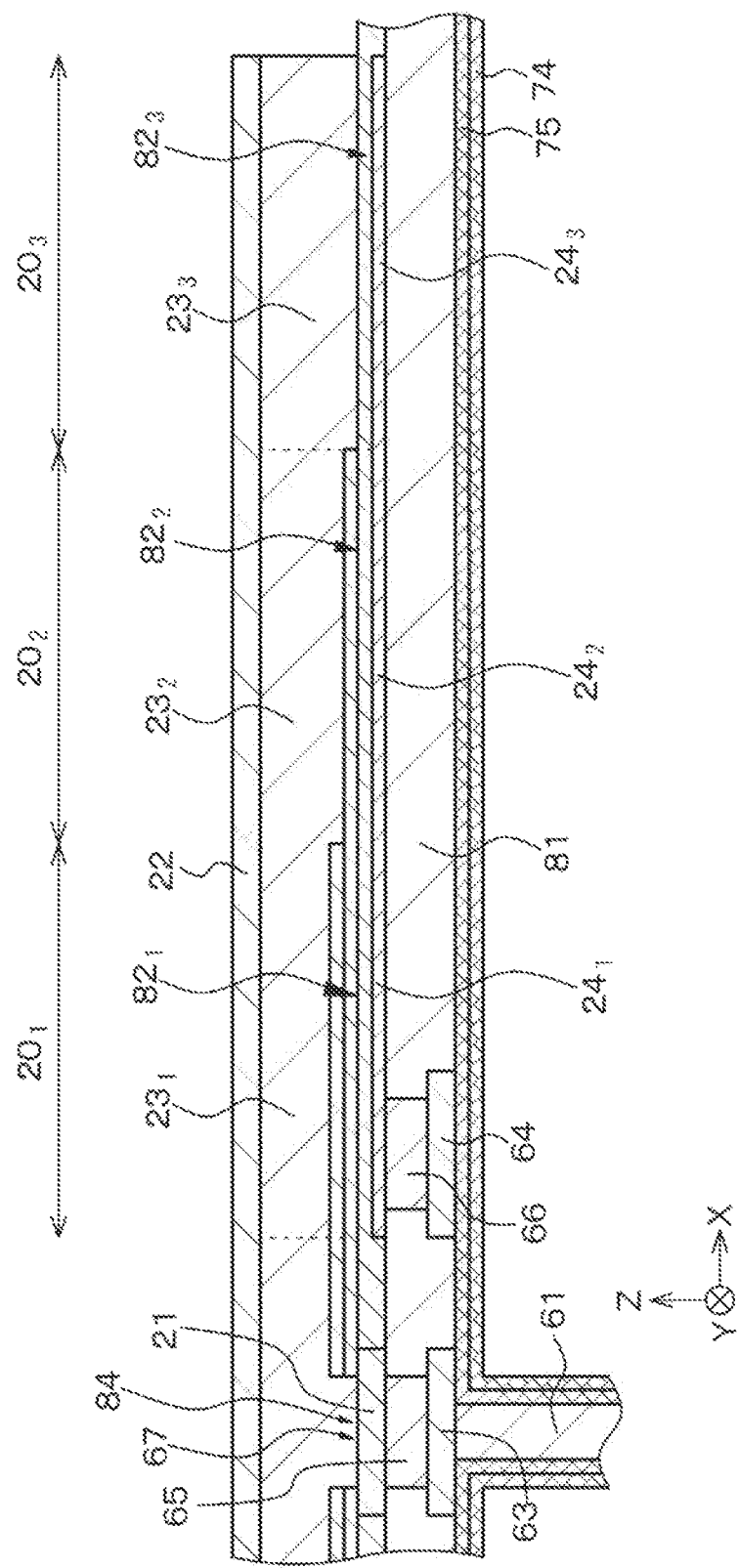
FIG. 49 is a schematic partial sectional view of a portion at which the charge accumulating electrode, the photoelectric conversion layer, and the second electrode in the modification of the imaging device of the working example 9 are stacked, in an enlarged scale.

Further, in the working example 9 depicted in FIG. 32, the thickness of the photoelectric conversion layer segments $23_1$, $23_2$, and $23_3$ is gradually increased by gradually decreasing the thickness of the charge accumulating electrode segments $24_1$, $24_2$, and $24_3$. On the other hand, as depicted in FIG. 49 that illustrates a schematic partial sectional view in which a portion at which the charge accumulating electrode, the photoelectric conversion layer, and the second electrode in the modification of the working example 9 are stacked is depicted in an enlarged scale, the thickness of the photoelectric conversion layer segments $23_1$, $23_2$, and $23_3$ may be gradually increased by making the thickness of the charge accumulating electrode segments $24_1$, $24_2$, and $24_3$ fixed and gradually decreasing the thickness of the insulating layer segments $82_1$, $82_2$, and $82_3$.

Figure 50:
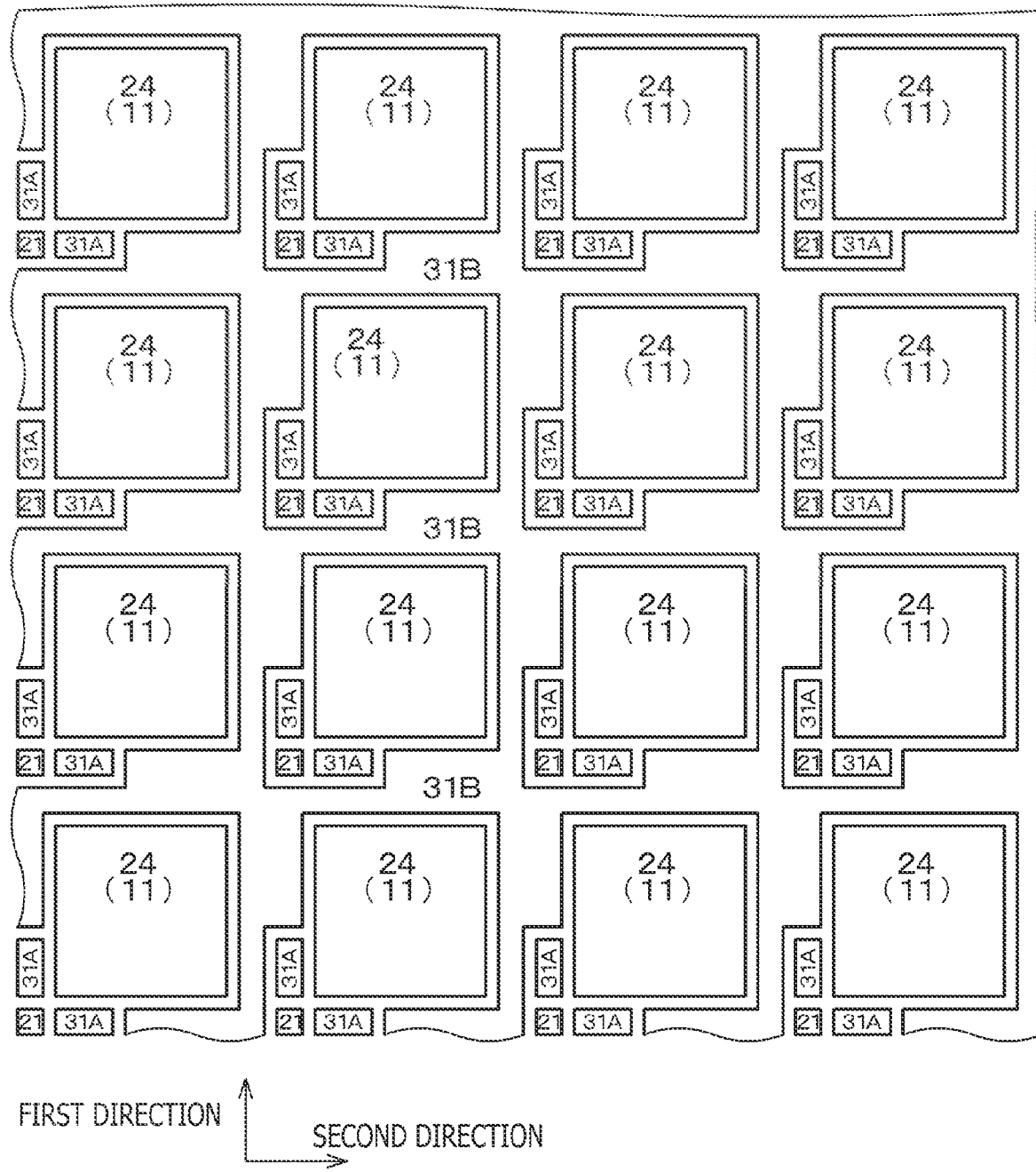
FIG. 50 is a view schematically depicting an arrangement state of the charge accumulating electrode, the first isolation electrode, the second isolation electrode, and the first electrode in the modification of the solid-state image sensor of the working example 1.

In the imaging device and the solid-state image sensor described hereinabove in connection with the working example 1, the second isolation electrode 31B is suitably made common to a plurality of imaging devices, and the second isolation electrode 31B may be controlled simultaneously in the plurality of imaging devices. FIG. 50 schematically depicts an arrangement state of the charge accumulating electrode, the first isolation electrode, the second isolation electrode, and the first electrode in such a modification of the solid-state image sensor of the working example 1 as just described.

Figure 51A:
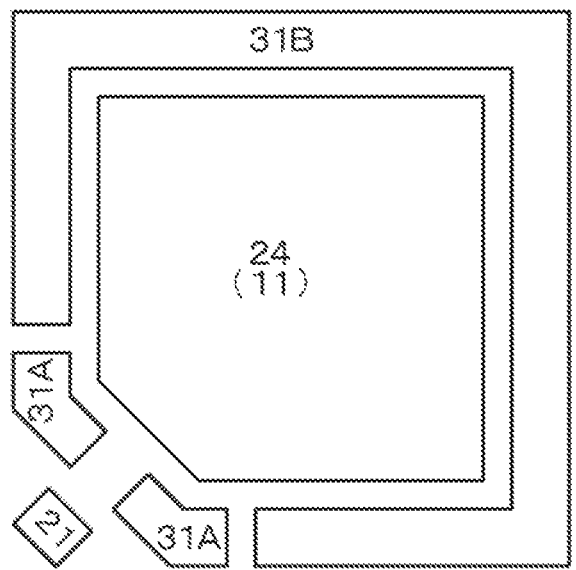
FIGS. 51A and 51B are views schematically depicting an arrangement state of the charge accumulating electrode, the first isolation electrode, the second isolation electrode, and the first electrode in the modification of the solid-state image sensor of the working example 1.
Figure 51B:
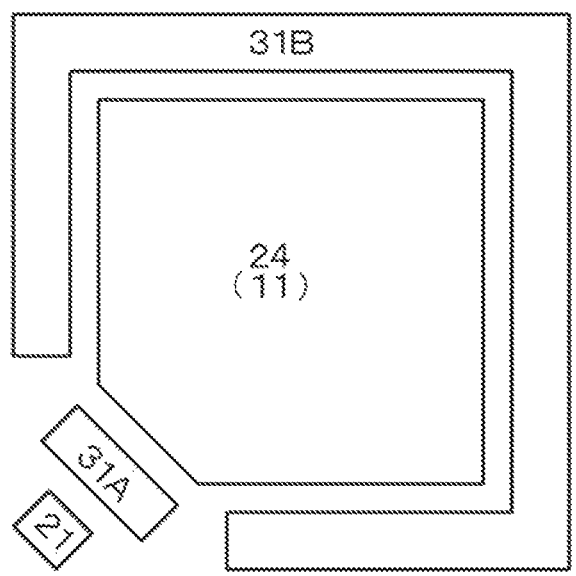

An arrangement state of the charge accumulating electrode, the first isolation electrode, the second isolation electrode, and the first electrode in further modifications of the imaging device described hereinabove in connection with the working example 1 is schematically depicted in FIGS. 51A and 51B. In those modifications, the planar shape of the charge accumulating electrode 24 is a rectangle having four corner portions, and a corner portion opposed to the first electrode 21 is cut away. Further, in the example depicted in FIG. 51A, a portion of the first isolation electrode 31A opposed to the first electrode 21 extends into the cutaway portion of the charge accumulating electrode 24. Further, in the example depicted in FIG. 51B, the first isolation electrode 31A is positioned between the first electrode 21 and the cutaway portion of the charge accumulating electrode 24. By adopting such a structure as just described, the potential between the charge accumulating electrode 24 and the first electrode 21 can be controlled with a higher degree of accuracy. It is to be noted that the modifications described can be applied to the working example 2 or other working examples.

Figure 52:
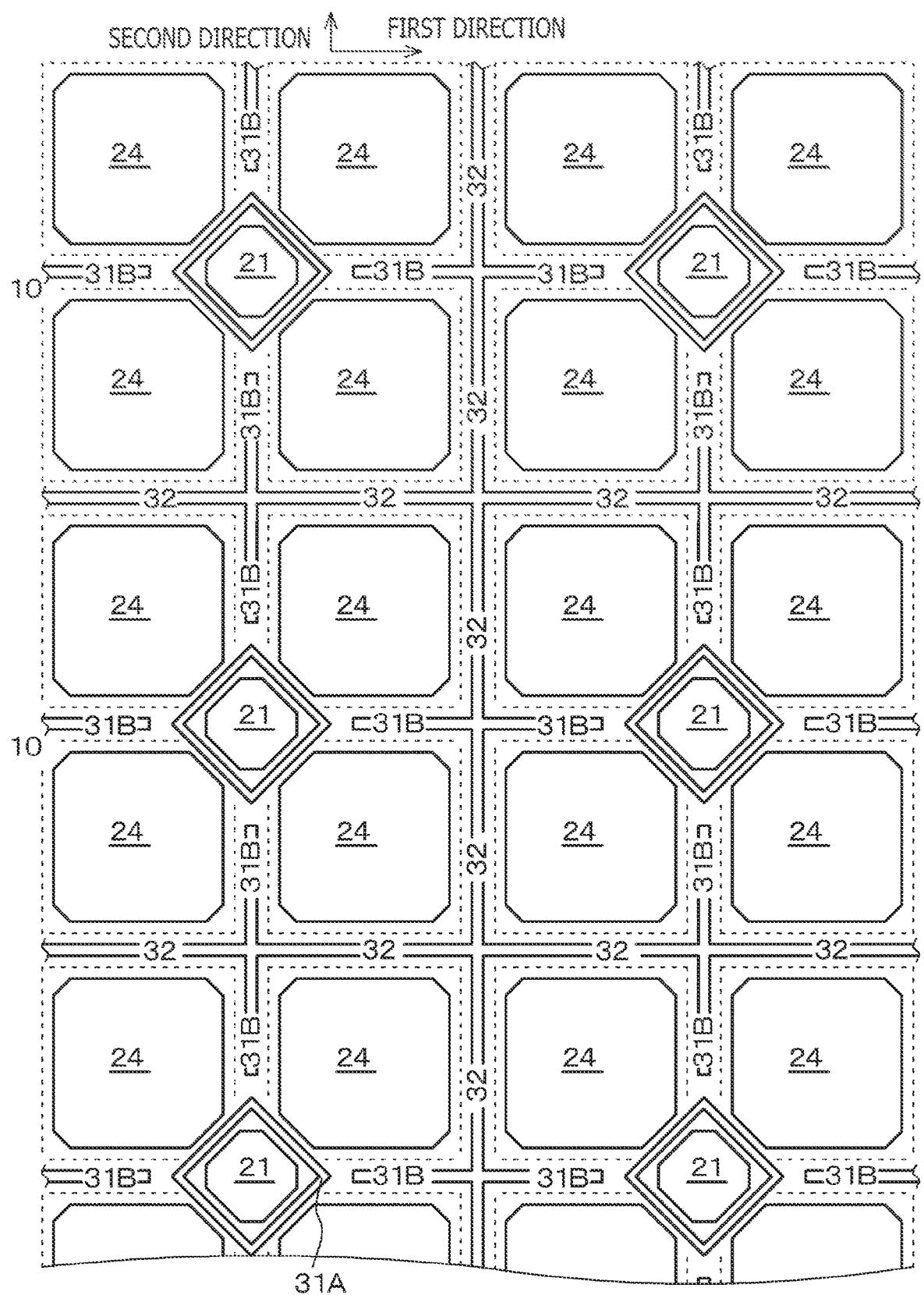
FIG. 52 is a view schematically depicting an arrangement state of a charge accumulating electrode, a first isolation electrode, a second isolation electrode, a third isolation electrode, and a first electrode in a modification of the solid-state image sensor of the working example 2.

An arrangement state of the charge accumulating electrode, the first isolation electrode, the second isolation electrode, the third isolation electrode, and the first electrode in the further modification of the imaging device described hereinabove in connection with the working example 2 is schematically depicted in FIG. 52. In those modifications, the planar shape of the charge accumulating electrode 24 is a rectangle having four corner portions, and a corner portion opposed to the first electrode 21 is cut away. Further, the first isolation electrode 31A is positioned between the first electrode 21 and the cutaway portion of the charge accumulating electrode 24. Further, the first isolation electrodes 31A configuring the imaging devices are connected to each other. By adopting such a structure as just described, the potential between the charge accumulating electrode 24 and the first electrode 21 can be controlled with a higher degree of accuracy. It is to be noted that the modifications described can be applied to other working examples.

Figure 53:
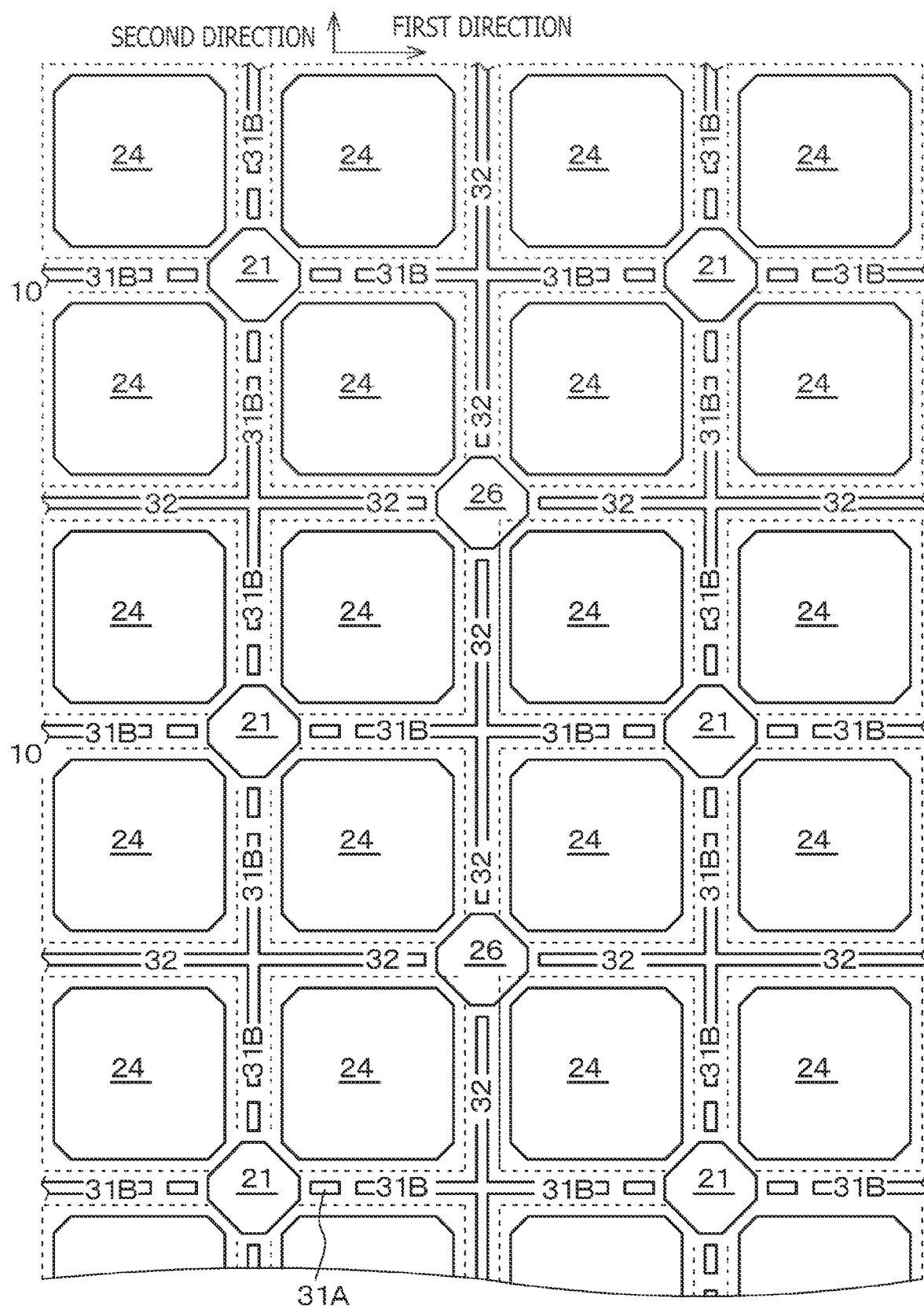
FIG. 53 is a view schematically depicting an arrangement state of a charge accumulating electrode, a first isolation electrode, a second isolation electrode, a third isolation electrode, a charge discharging electrode, and a first electrode in the solid-state image sensor of the working example 2 including a charge discharging electrode.

A further modification of the solid-state image sensor described hereinabove in connection with the working example 2 is depicted in FIG. 53. In particular, in four imaging devices, a single common first electrode 21 is provided for the four charge accumulating electrodes 24, and an isolation electrode 30 (first isolation electrode 31A, second isolation electrode 31B, and third isolation electrode 32) is formed under a portion of the insulating layer 82 in a region surrounded by the four charge accumulating electrodes 24. Further, a charge discharging electrode 26 is formed under a portion of the insulating layer 82 in the region surrounded by the four charge accumulating electrodes 24. The charge discharging electrode 26 and the photoelectric conversion layer 23 are connected to each other through an opening provided in the insulating layer 82. In particular, similarly to the relation between the photoelectric conversion layer 23 and the first electrode 21, the photoelectric conversion layer 23 extends in the opening provided in the insulating layer 82, and this extension of the photoelectric conversion layer 23 contacts with the charge discharging electrode 26. Such a charge discharging electrode 26 as just described can be applied also to other working examples.

Figure 54:
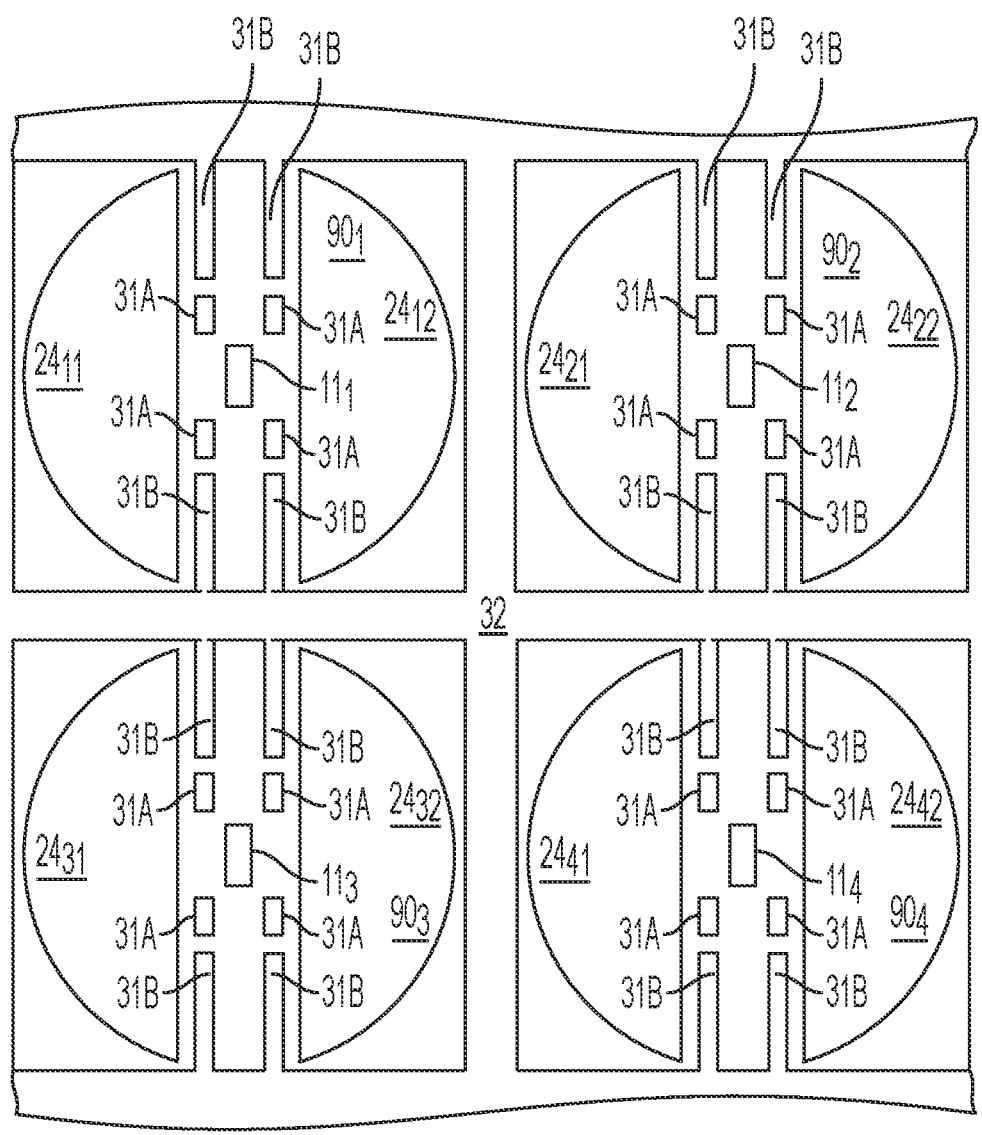
FIG. 54 is a schematic top plan view of a charge accumulating electrode, a first isolation electrode, a second isolation electrode, a third isolation electrode, and a first electrode in the modification of the solid-state image sensor of the working example 2.

Alternatively, a schematic plan view of the first electrode and the charge accumulating electrode in a further modification of the solid-state image sensor of the working example 2 is depicted in FIG. 54. In this solid-state image sensor, an imaging device block includes two imaging devices. Further, one on-chip microlens 90 is arranged above the imaging device block. The first isolation electrode 31A and the second isolation electrode 31B are arranged between the two imaging devices that configure the imaging device block, and the third isolation electrode 32 is arranged between imaging device blocks.

For example, a photoelectric conversion layer corresponding to charge accumulating electrodes $24_{11}$, $24_{21}$, $24_{31}$, and $24_{41}$ that configure an imaging device block has high sensitivity to incident light from the upper right in the figure. Further, a photoelectric conversion layer corresponding to charge accumulating electrodes $24_{12}$, $24_{22}$, $24_{32}$, and $24_{42}$ configuring an imaging device block has high sensitivity to incident light from the upper left in the figure. Accordingly, for example, by combining an imaging device having the charge accumulating electrode $24_{11}$ and an imaging device having the charge accumulating electrode $24_{21}$, it becomes possible to acquire an image plane phase difference signal. Further, if a signal from the imaging device having the charge accumulating electrode $24_{11}$ and a signal from the imaging device having the charge accumulating electrode $24_{12}$ are added, by a combination with those imaging devices, one imaging device can be configured.

Figure 55A:
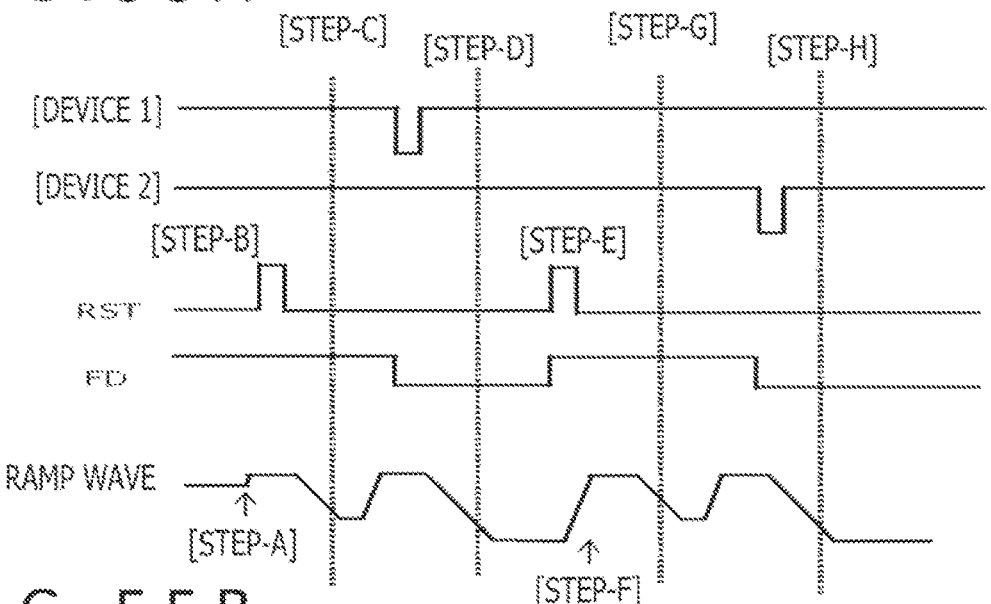
FIGS. 55A, 55B, and 55C are charts depicting an example of reading out driving in the modification of the solid-state image sensor of the working example 2 depicted in FIG. 54.

FIG. 55A depicts an example of reading out driving of the imaging device block of the working example 2 depicted in FIG. 54. Signals from the two imaging devices corresponding to the charge accumulating electrode $24_{21}$ and the charge accumulating electrode $24_{22}$ are read out by a flow of the following:

[Step A]

Auto zero signal inputting to a comparator

[Step B]

Reset operation of a shared single floating diffusion layer

[Step C]

P phase reading out in the imaging device corresponding to the charge accumulating electrode $24_{21}$ and movement of charge to a first electrode $21_2$

[Step D]
D phase reading out in the imaging device corresponding to the charge accumulating electrode $24_{21}$ and movement of charge to the first electrode $21_2$
[Step E]
Reset operation of the shared single floating diffusion layer
[Step F]
Auto zero signal inputting to the comparator
[Step G]
P phase reading out in the imaging device corresponding to the charge accumulating electrode $24_{22}$ and movement of charge to the first electrode $21_2$
[Step H]
D phase reading out in the imaging device corresponding to the charge accumulating electrode $24_{22}$ and movement of charge to the first electrode $21_2$. On the basis of a correlated double sampling (CDS), the difference between the P phase reading out in [Step C] and the D phase reading out in [Step D] is a signal from the imaging device corresponding to the charge accumulating electrode $24_{21}$, and the difference between the P phase reading out in [Step G] and the D phase reading out in [Step H] is a signal from the imaging device corresponding to the charge accumulating electrode $24_{22}$.

Figure 55B:
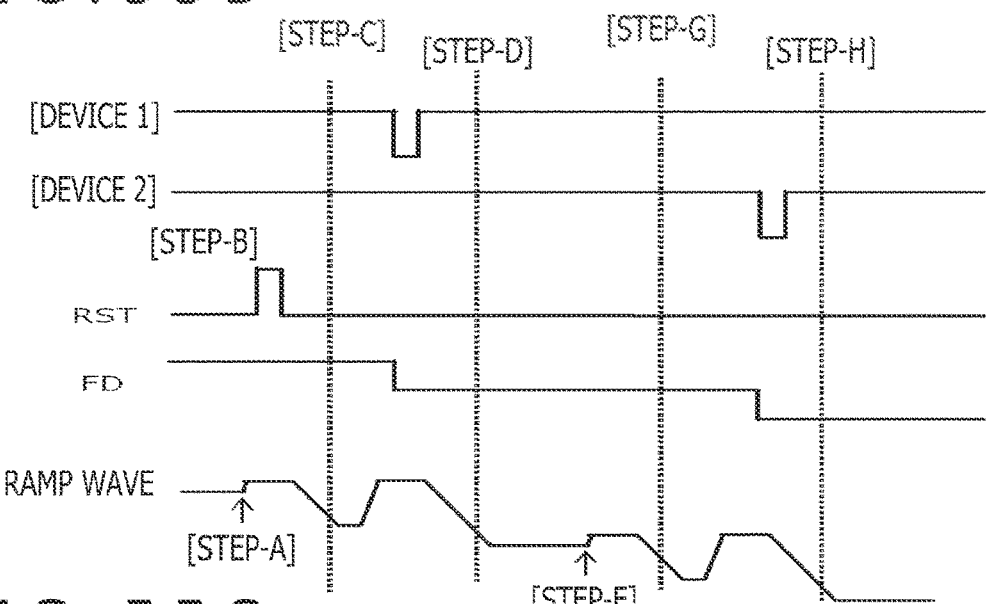
Figure 55C:
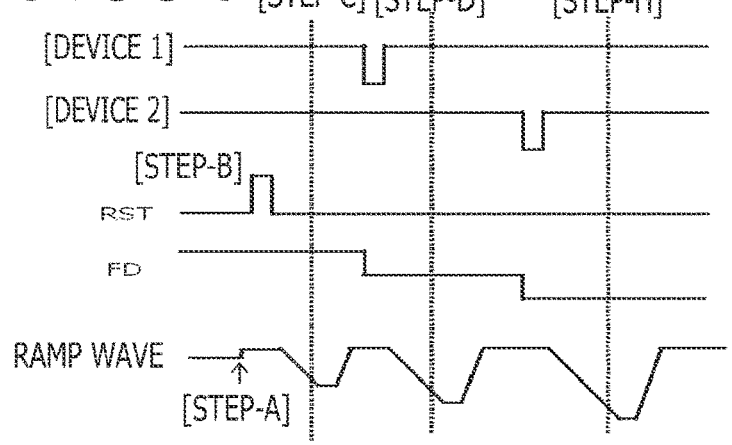

It is to be noted that the operation of [Step E] may be omitted (refer to FIG. 55B). Further, the operation of [Step F] may be omitted, and in this case, [Step G] can be omitted further (refer to FIG. 55C). The difference between the P phase reading out in [Step C] and the D phase reading out in [Step D] is a signal from the imaging device corresponding to the charge accumulating electrode $24_{21}$, and the difference between the D phase reading out in [Step D] and the D phase reading out in [Step H] is a signal from the imaging device corresponding to the charge accumulating electrode $24_{22}$.

It is to be noted that operation of the imaging device block including the two imaging devices depicted in FIG. 54 is not limited to the operation described above, and it is also possible for the operation of the imaging device block to be similar to the operation of the imaging device block including four imaging devices described hereinabove in connection with the working example 2.

It is a matter of course that the various modifications of the working examples described above can be applied suitably to other working examples.

Although, in the working examples, electrons are signal charge and the conductivity type of a photoelectric conversion layer formed on a semiconductor substrate is the n type, application to a solid-state image sensor in which positive holes are signal charge is also possible. In this case, it is sufficient if the semiconductor regions include semiconductor regions of the opposite conductivity types, and it is sufficient if the conductivity type of the photoelectric conversion layer formed on a semiconductor substrate is the p type.

Further, although the working examples are described taking, as an example, a case in which the present disclosure is applied to a CMOS type solid-state image sensor in which unit pixels that detect signal charge according to an incident light amount as a physical quantity are arranged in rows and columns, application of the present disclosure is not limited to a CMOS type solid-state image sensor, and it is also possible to apply the present disclosure to a CCD type solid-state image sensor. In the latter case, signal charge is transferred in a vertical direction by a vertical transfer register of the CCD type structure, transferred in a horizontal direction by a horizontal transfer register, and is amplified to output a pixel signal (image signal). Further, the application of the present disclosure is not limited to column type solid-state image sensors in general in which pixels are formed in a two-dimensional matrix and a column signal processing circuit is arranged for each pixel column. Further, in some cases, it is also possible to omit the selection transistor.

Further, the imaging device and the stacked type imaging device of the present disclosure can be applied not only to a solid-state image sensor that detects and captures distribution of the incident light amount of visible light as an image but also to a solid-state image sensor that captures distribution of the incident amount of infrared rays, X-rays, or particles as an image. Further, in a broad sense, the imaging device and the stacked type imaging device of the present disclosure can be applied to solid-state image sensors (physical quantity distribution detection devices) in general such as fingerprint detection sensors that detect and capture distribution of some other physical quantity such as pressure or capacitance as an image.

Further, application of the imaging device and the stacked type imaging device of the present disclosure is not limited to a solid-state image sensor that scans unit pixels in an imaging region in order in a unit of row to read out a pixel signal from each unit pixel. The imaging device and the stacked type imaging device of the present disclosure can be applied also to a solid-state image sensor of the X-Y address type that selects any pixel in a unit of pixel and reads out a pixel signal in a unit of pixel from the selected pixel. The solid-state image sensor may have a form that it is formed as one chip or may have a form of a module in which an imaging region and a driving circuit or an optical system are collectively packaged so as to have an imaging function.

Further, the application of the imaging device and the stacked type imaging device of the present disclosure is not limited to a solid-state image sensor and can be applied also to an imaging apparatus. Here, the imaging apparatus signifies electronic equipment having an imaging function such as a camera system of a digital still camera or a video camera or a portable telephone set. The imaging apparatus sometimes have a form of a module incorporated in electronic equipment, that is, an imaging apparatus sometimes includes a camera module.

Figure 56:
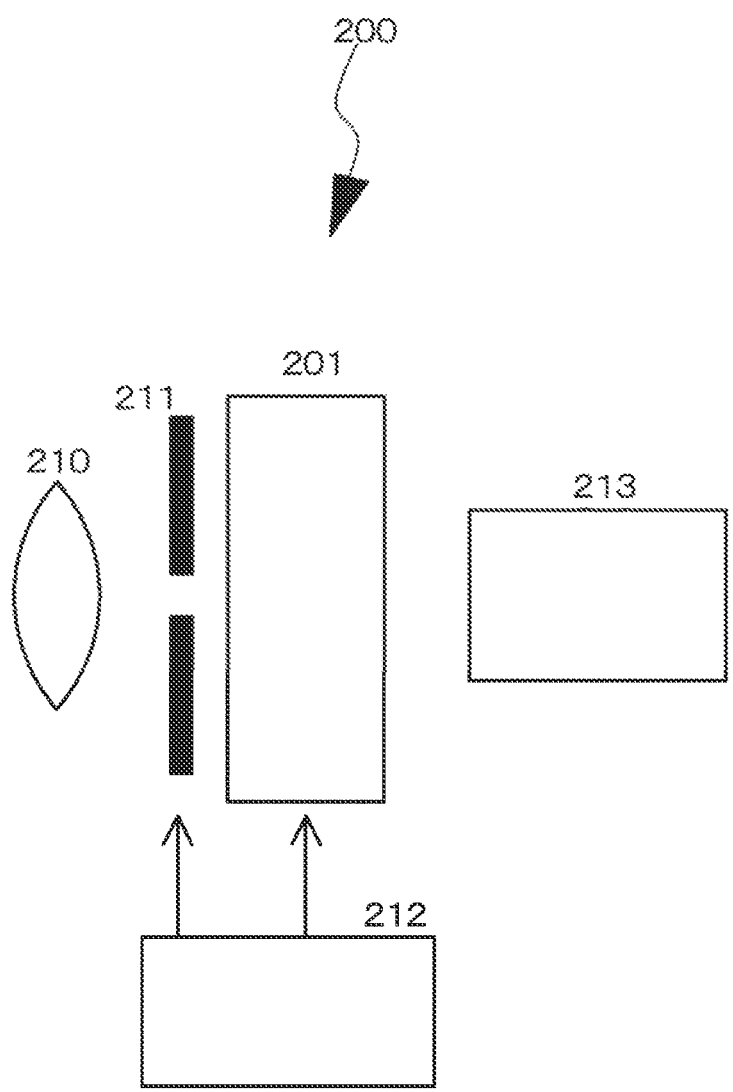
FIG. 56 is a conceptual view of an example in which a solid-state image sensor including the imaging device and the stacked type imaging device of the present disclosure is used for electronic equipment (camera).
Figure 57:
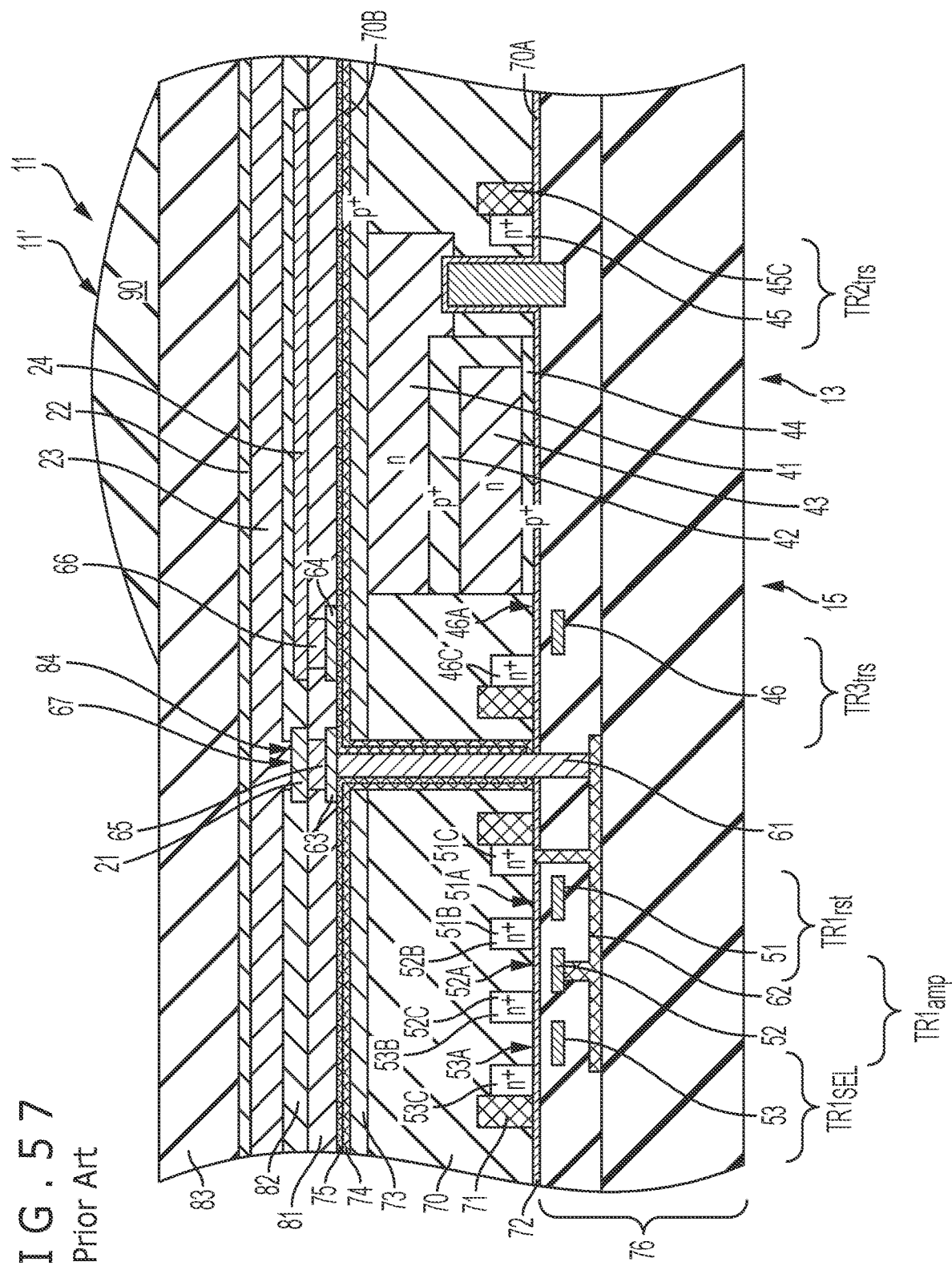
FIG. 57 is a conceptual view of a conventional stacked type imaging device (stacked type solid-state image sensor).

An example in which a solid-state image sensor 201 including the imaging device and the stacked type imaging device of the present disclosure is used in electronic equipment (camera) 200 is depicted as a conceptual diagram in FIG. 56. The electronic equipment 200 includes a solid-state image sensor 201, an optical lens 210, a shutter device 211, a driving circuit 212, and a signal processing circuit 213. The optical lens 210 forms an image of image light (incident light) from an imaging target on an imaging plane of the solid-state image sensor 201. As a result, signal charge is accumulated for a fixed period of time in the solid-state image sensor 201. The shutter device 211 controls the light application period and the light blocking period of the solid-state image sensor 201. The driving circuit 212 supplies a driving signal for controlling transfer operation and so forth of the solid-state image sensor 201 and shutter operation of the shutter device 211. In response to a driving signal (timing signal) supplied from the driving circuit 212, signal transfer of the solid-state image sensor 201 is performed. The signal processing circuit 213 performs various signal processes. A video signal for which signal processing has been performed is stored into a storage medium such as a memory or is outputted to a monitor. In the electronic equipment 200 as described above, since refinement of the pixel size and improvement of the transfer efficiency of the solid-state image sensor 201 can be achieved, the electronic equipment 200 whose improvement in pixel characteristic is achieved can be obtained. The electronic equipment 200 to which the solid-state image sensor 201 can be applied is not limited to a camera and can be applied to an imaging apparatus such as a camera module for mobile equipment such as a digital still camera or a portable telephone set.

The technology according to the present disclosure (present technology) can be applied to various products. For example, the technology according to the present disclosure may be implemented as an apparatus that is incorporated in a moving body of any kind such as an automobile, an electric car, a hybrid electric car, a motorcycle, a bicycle, a personal mobility, an airplane, a drone, a ship, or a robot.

Figure 58:
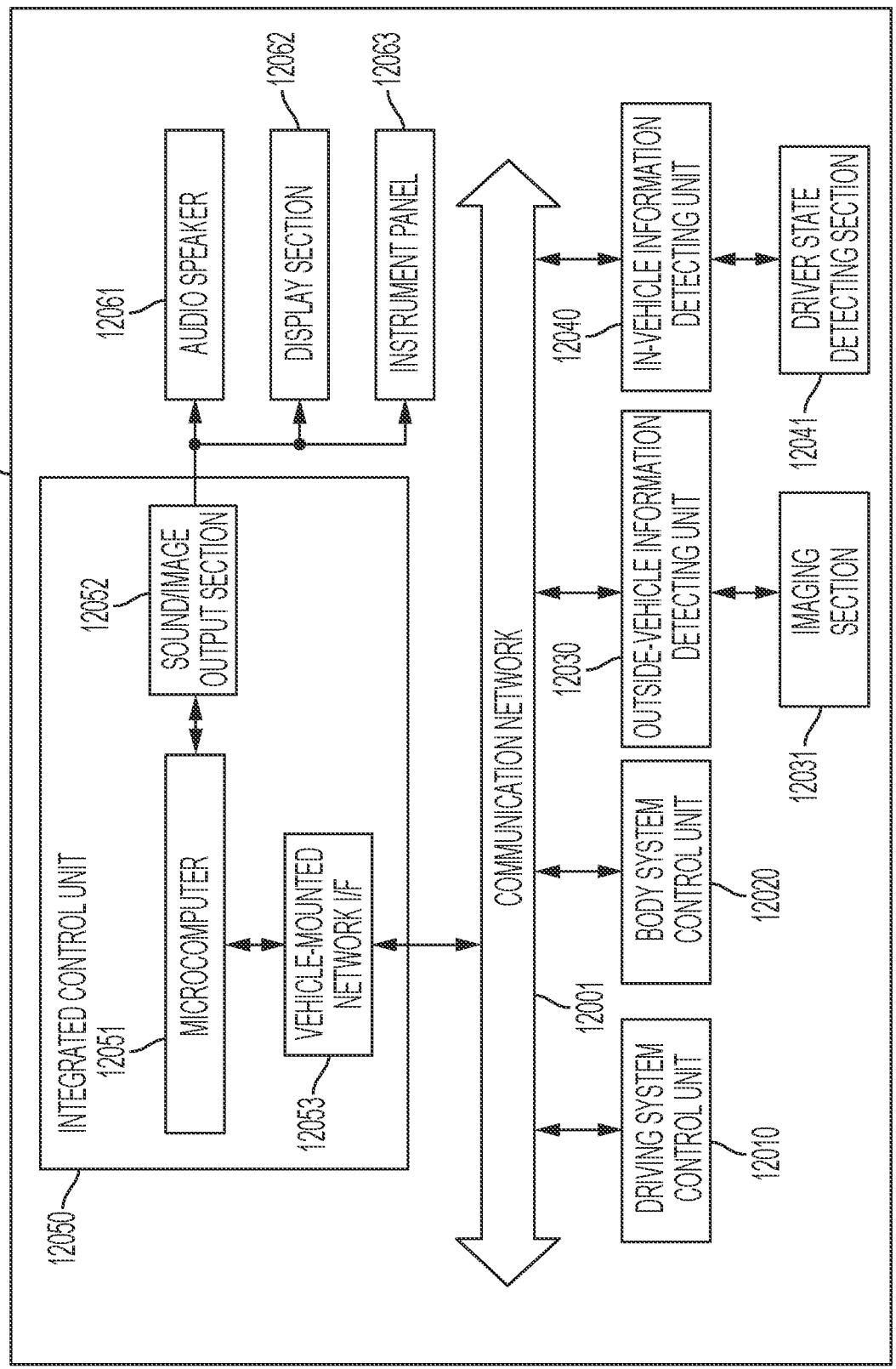
FIG. 58 is a block diagram depicting an example of schematic configuration of a vehicle control system.

FIG. 58 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 58, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 58, an audio speaker 12061, a display section 12062, and an instrument panel 12063 are illustrated as the output device. The display section 12062 may, for example, include at least one of an on-board display and a head-up display.

Figure 59:
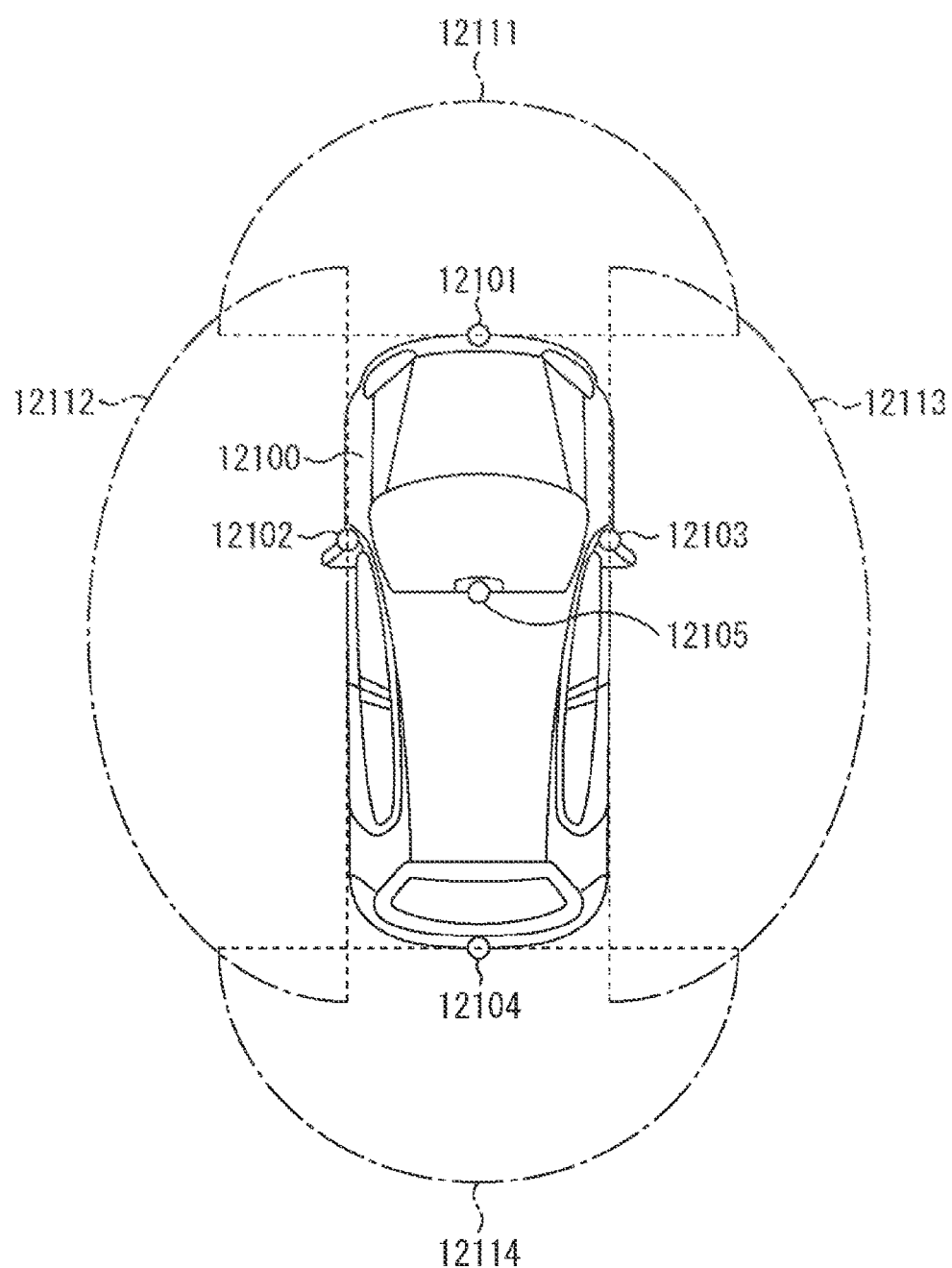
FIG. 59 is a diagram of assistance in explaining an example of installation positions of an outside-vehicle information detecting section and an imaging section.

FIG. 59 is a diagram depicting an example of the installation position of the imaging section 12031.

In FIG. 59, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 59 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Further, for example, the technology according to the present disclosure may be applied to an endoscopic surgery system.

Figure 60:
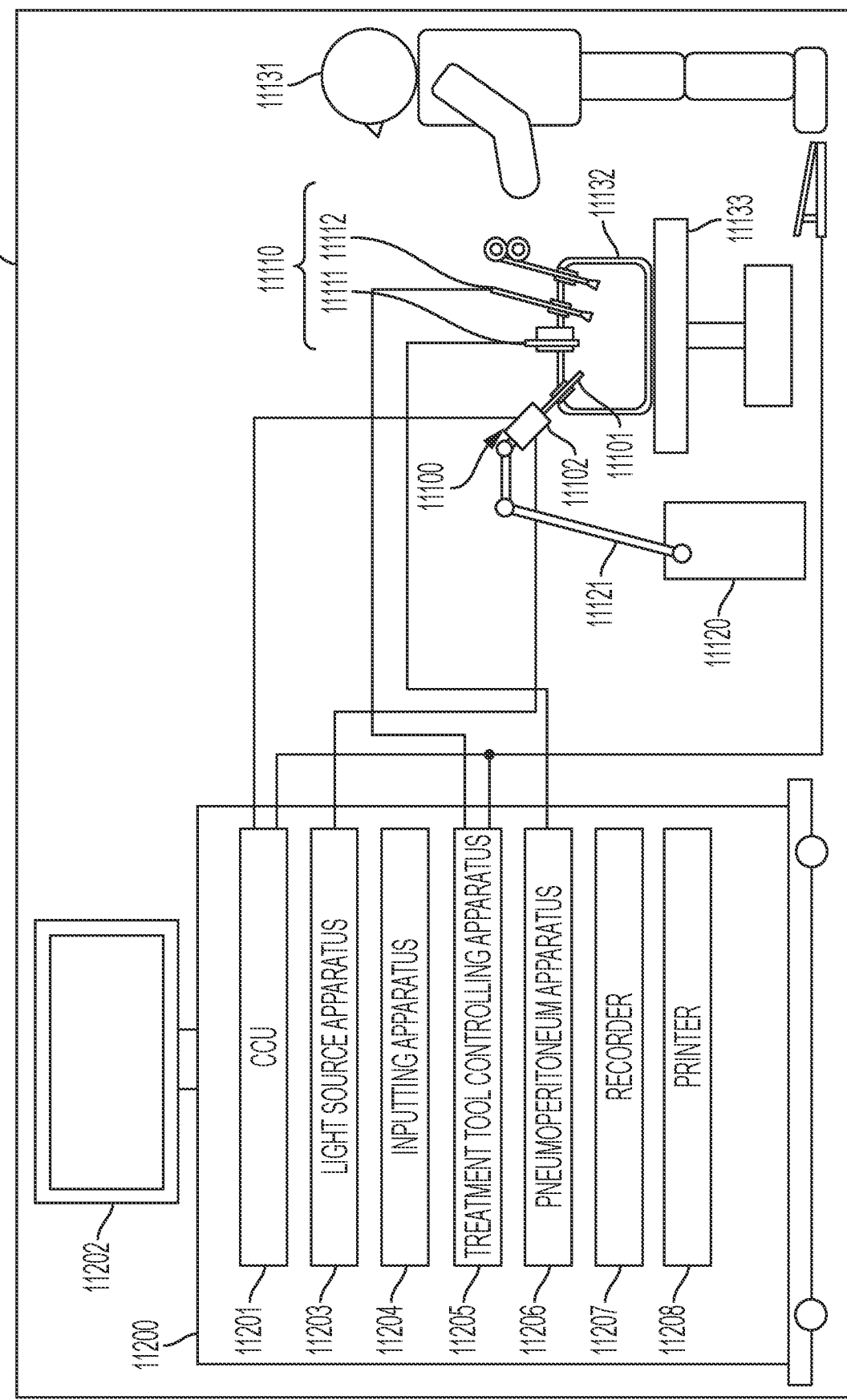
FIG. 60 is a view depicting an example of a schematic configuration of an endoscopic surgery system.

FIG. 60 is a view depicting an example of a schematic configuration of an endoscopic surgery system to which the technology according to an embodiment of the present disclosure (present technology) can be applied.

In FIG. 60, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203.

Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 61:
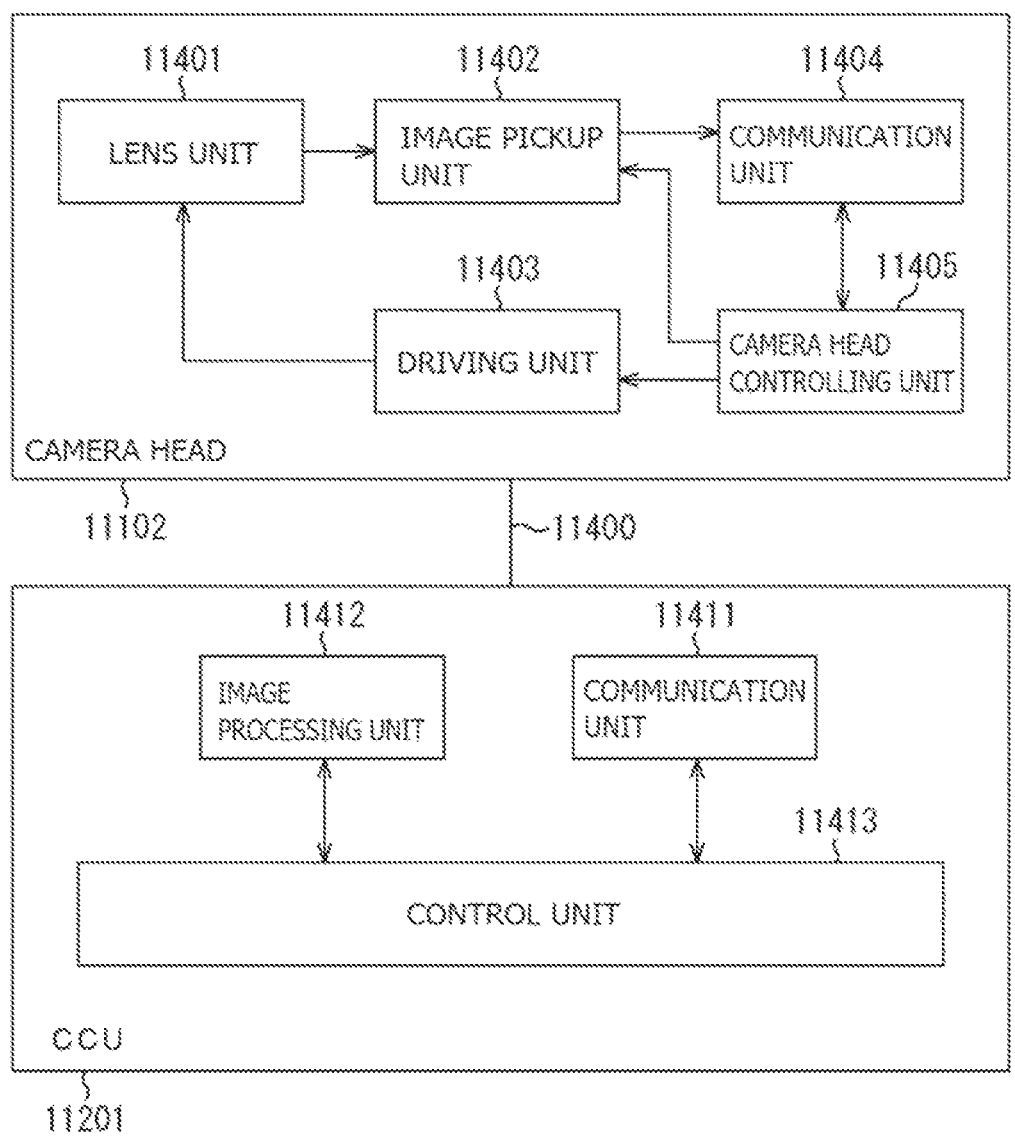
FIG. 61 is a block diagram depicting an example of a functional configuration of a camera head and a camera control unit (CCU).

FIG. 61 is a block diagram depicting an example of a functional configuration of the camera head 11102 and the CCU 11201 depicted in FIG. 60.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

It is to be noted here that, although an endoscopic surgery system is described as an example, the technology according to the present disclosure may be applied, for example, to a microscopic surgery system and so forth.

It is to be noted that it is also possible for the present disclosure to have such configurations as described below.

[A01]

<<Imaging Device>

An imaging device including:

a first electrode;

a charge accumulating electrode arranged with a space from the first electrode;

an isolation electrode arranged with a space from the first electrode and the charge accumulating electrode and surrounding the charge accumulating electrode;

a photoelectric conversion layer formed in contact with the first electrode and above the charge accumulating electrode with an insulating layer interposed therebetween; and a second electrode formed on the photoelectric conversion layer, in which the isolation electrode includes a first isolation electrode and a second isolation electrode arranged with a space from the first isolation electrode, and the first isolation electrode is positioned between the first electrode and the second isolation electrode.

[A02]

The imaging device according to [A01], in which the first isolation electrode has potential of a fixed value $V_{ES-1}$, and the second isolation electrode has potential of another fixed value $V_{ES-2}$.

[A03]

The imaging device according to [A01], in which the first isolation electrode has potential that changes from a fixed value $V_{ES-1}$, and the second isolation electrode has potential of a fixed value $V_{ES-2}$.

[A04]

The imaging device according to [A02] or [A03], in which, in a case where charge to be accumulated is electrons, $V_{ES-1} > V_{ES-2}$ is satisfied, but in a case where positive holes to be accumulated are electrons, $V_{ES-1} < V_{ES-2}$ is satisfied.

[A05]

The imaging device according to [A02] or [A03], in which $V_{ES-2} = V_{ES-1}$ is satisfied.

[A06]

<<Solid-State Image Sensor: First Form×x

A solid-state image sensor including:
- a plurality of imaging device blocks each including P×Q (where P 2 and Q 1) imaging devices such that P imaging devices are arranged in a first direction and Q imaging device is arranged in a second direction different from the first direction, in which
- each imaging device includes
  - a first electrode,
  - a charge accumulating electrode arranged with a space from the first electrode,
  - an isolation electrode arranged with a space from the first electrode and the charge accumulating electrode and surrounding the charge accumulating electrode,
  - a photoelectric conversion layer formed in contact with the first electrode and above the charge accumulating electrode with an insulating layer interposed therebetween, and
  - a second electrode formed on the photoelectric conversion layer,
- the isolation electrode includes a first isolation electrode, a second isolation electrode, and a third isolation electrode,
- the first isolation electrode is arranged adjacent to but with a space from the first electrode between imaging devices placed side by side at least along the second direction in the imaging device block,
- the second isolation electrode is arranged between imaging devices in the imaging device block, and
- the third isolation electrode is arranged between imaging device blocks.

[A07]

The solid-state image sensor according to [A06], in which the third isolation electrode is shared by imaging device blocks adjacent to each other.

[A08]

The solid-state image sensor according to [A06] or [A07], in which
- the first isolation electrode is arranged adjacent to but with a space from the first electrode between the imaging devices placed side by side along the second direction in the imaging device block, and
- the second isolation electrode is arranged between imaging devices placed side by side along the first direction and is arranged with a space from the first isolation electrode between the imaging devices placed side by side along the second direction.

[A09]

The solid-state image sensor according to [A08], in which the second isolation electrode and the third isolation electrode are connected to each other.

[A10]

The solid-state image sensor according to [A06] or [A07], in which
- the first isolation electrode is arranged adjacent to but with a space from the first electrode between the imaging devices placed side by side along the second direction in the imaging device block and is further arranged adjacent to but with a space from the first electrode between imaging devices placed side by side along the first direction, and
- the second isolation electrode is arranged with a space from the first isolation electrode between the imaging devices placed side by side along the second direction and is further arranged with a space from the first isolation electrode between the imaging devices placed side by side along the first direction.

[A11]

The solid-state image sensor according to [A10], in which the second isolation electrode and the third isolation electrode are connected to each other.

[A12]

The solid-state image sensor according to [A11], in which the first isolation electrode has potential of a fixed value $V_{ES-1}$, and the second isolation electrode and the third isolation electrode also have potential of a fixed value $V_{ES-2}$.

[A13]

The solid-state image sensor according to [A11], in which the first isolation electrode has potential that changes from a fixed value $V_{ES-1}$, and the second isolation electrode and the third isolation electrode have potential of a fixed value $V_{ES-2}$.

[A14]

The solid-state image sensor according to [A12] or [A13], in which, in a case where charge to be accumulated is electrons, $V_{ES-1} > V_{ES-2}$ is satisfied, but in a case where positive holes to be accumulated are electrons, $V_{ES-1} < V_{ES-2}$ is satisfied.

[A15]

The solid-state image sensor according to [A12] or [A13], in which $V_{ES-2} = V_{ES-1}$ is satisfied.

[A16]

The solid-state image sensor according to any one of [A06] to [A15], in which the first electrode is shared by P×Q imaging devices configuring the imaging device block.

[A17]

The solid-state image sensor according to any one of [A06] to [A16], in which P=2 and Q=2 are satisfied.

[A18]

The solid-state image sensor according to any one of [A01] to [A17], further including:
- a semiconductor substrate, in which
- a photoelectric conversion portion is arranged above the semiconductor substrate.

[A19]

The solid-state image sensor according to any one of [A01] to [A18], further including:
- a transfer controlling electrode arranged with a space from the first electrode and the charge accumulating electrode between the first electrode and the charge accumulating electrode and is arranged opposed to the photoelectric conversion layer with an insulating film interposed therebetween.

[A20]

The solid-state image sensor according to any one of [A01] to [A19], in which the charge accumulating electrode includes a plurality of charge accumulating electrode segments.

[A21]

The solid-state image sensor according to any one of [A01] to [A20], in which the charge accumulating electrode has a size greater than that of the first electrode.

[A22]

The solid-state image sensor according to any one of [A01] to [A21], in which the first electrode extends in an opening provided in the insulating layer and is connected to the photoelectric conversion layer.

[A23]

The solid-state image sensor according to any one of [A01] to [A21], in which the photoelectric conversion layer extends in an opening provided in the insulating layer and is connected to the first electrode.

[A24]

The solid-state image sensor according to [A23], in which
an edge portion of a top face of the first electrode is covered with the insulating layer,
the first electrode is exposed on a bottom face of the opening, and
where a face of the insulating layer contacting with the top face of the first electrode is a first face and a face of the insulating layer contacting with a portion of the photoelectric conversion layer opposed to the charge accumulating electrode is a second face, a side face of the opening has an inclination that expands from the first face to the second face.

[A25]

The solid-state image sensor according to [A24], in which the side face of the opening having the inclination that expands from the first face toward the second face is positioned on the charge accumulating electrode side.

[A26]

<<Control of Potential of First Electrode and Charge Accumulating Electrode>>

The solid-state image sensor according to any one of [A01] to [A25], further including:
a control portion provided on a semiconductor substrate and including a driving circuit, in which
the first electrode and the charge accumulating electrode are connected to the driving circuit,
during a charge accumulation period, from the driving circuit, potential $V_{11}$ is applied to the first electrode, potential $V_{12}$ is applied to the charge accumulating electrode, and charge is accumulated into the photoelectric conversion layer,
during a charge transfer period, from the driving circuit, potential $V_{21}$ is applied to the first electrode, potential $V_{22}$ is applied to the charge accumulating electrode, and the charge accumulated in the photoelectric conversion layer is read out to the control portion through the first electrode, and
in the case where the potential of the first electrode is higher than that of the second electrode, $V_{12} \geq V_{11}$ and $V_{22} < V_{21}$ are satisfied, but in the case where the potential of the first electrode is lower than that of the second electrode, $V_{12} \leq V_{11}$ and $V_{22} > V_{21}$ are satisfied.

[A27]

<<Charge Accumulating Electrode Segment>>

The solid-state image sensor according to any one of [A01] to [A19], in which the charge accumulating electrode includes a plurality of charge accumulating electrode segments.

[A28]

The solid-state image sensor according to [A27], in which,
in the case where the potential of the first electrode is higher than that of the second potential, during a charge transfer period, the potential applied to the charge accumulating electrode segment that is positioned nearest to the first electrode is higher than the potential applied to the charge accumulating electrode segment positioned remotest from the first electrode, and
in the case where the potential of the first electrode is lower than that of the second electrode, during a charge transfer period, the potential applied to the charge accumulating electrode segment positioned nearest to the first electrode is lower than the potential applied to the charge accumulating electrode segment positioned remotest from the first electrode.

[A29]

The solid-state image sensor according to any one of [A01] to [A28], in which,
at least a floating diffusion layer and an amplification transistor that configure a control portion are provided on a semiconductor substrate, and
the first electrode is connected to the floating diffusion layer and a gate portion of the amplification transistor.

[A30]

The solid-state image sensor according to [A29], in which
a rest transistor and a selection transistor that configure the control portion are further provided on the semiconductor substrate,
the floating diffusion layer is connected to one of source/drain regions of the reset transistor, and
one of source/drain regions of the amplification transistor is connected to one of source/drain regions of the selection transistor, and the other one of the source/drain regions of the selection transistor is connected to a signal line.

[A31]

The solid-state image sensor according to any one of [A01] to [A30], in which light is incident from the second electrode side, and a shading layer is formed on a light incidence side rather near to the second electrode.

[A32]

The solid-state image sensor according to any one of [A01] to [A30], in which light is incident from the second electrode side, and light is not incident to the first electrode.

[A33]

The solid-state image sensor according to [A32], in which a shading layer is formed above the first electrode and on a light incidence side rather near to the second electrode.

[A34]

The solid-state image sensor according to [A32], in which
an on-chip microlens is provided above the charge accumulating electrode and the second electrode, and
light incident to the on-chip microlens is focused on the charge accumulating electrode.

[B01]

<<Imaging Device: First Configuration>>

The solid-state image sensor according to any one of [A01] to [A34], in which
the photoelectric conversion portion includes N (where N≥2) photoelectric conversion portion segments,
the photoelectric conversion layer includes N photoelectric conversion layer segments,
the insulating layer includes N insulating layer segments,
the charge accumulating electrode includes N charge accumulating electrode segments,
an nth (where n=1, 2, 3, . . . , N) photoelectric conversion portion segment includes an nth charge accumulating electrode segment, an nth insulating layer segment, and an nth photoelectric conversion layer segment,
the photoelectric conversion portion segment having a higher value of n is positioned farther away from the first electrode, and the insulating layer segments have a thickness that gradually changes over a range from a first photoelectric conversion portion segment to an Nth photoelectric conversion portion segment.

[B02]

<<Imaging Device: Second Configuration>>

The solid-state image sensor according to any one of [A01] to [A34], in which the photoelectric conversion portion includes N (where N≥2) photoelectric conversion portion segments, the photoelectric conversion layer includes N photoelectric conversion layer segments, the insulating layer includes N insulating layer segments, the charge accumulating electrode includes N charge accumulating electrode segments, an nth (where n=1, 2, 3, ..., N) photoelectric conversion portion segment includes an nth charge accumulating electrode segment, an nth insulating layer segment, and an nth photoelectric conversion layer segment, the photoelectric conversion portion segment having a higher value of n is positioned farther away from the first electrode, and the photoelectric conversion layer segments have a thickness that gradually changes over a range from a first photoelectric conversion portion segment to an Nth photoelectric conversion portion segment.

[B03]

<<Imaging Device: Third Configuration>>

The solid-state image sensor according to any one of [A01] to [A34], in which the photoelectric conversion portion includes N (where N≥2) photoelectric conversion portion segments, the photoelectric conversion layer includes N photoelectric conversion layer segments, the insulating layer includes N insulating layer segments, the charge accumulating electrode includes N charge accumulating electrode segments;

an nth (where n=1, 2, 3, ..., N) photoelectric conversion portion segment includes an nth charge accumulating electrode segment, an nth insulating layer segment, and an nth photoelectric conversion layer segment, the photoelectric conversion portion segment having a higher value of n is positioned farther away from the first electrode, and a material configuring the insulating layer segment is different in adjacent ones of the photoelectric conversion portion segments.

[B04]

<<Imaging Device: Fourth Configuration>>

The solid-state image sensor according to any one of [A01] to [A34], in which the photoelectric conversion portion is configured from N (where N≥2) photoelectric conversion portion segments, the photoelectric conversion layer includes N photoelectric conversion layer segments, the insulating layer includes N insulating layer segments, the charge accumulating electrode includes N charge accumulating electrode segments arranged with a space between each other, an nth (where n=1, 2, 3, ..., N) photoelectric conversion portion segment includes an nth charge accumulating electrode segment, an nth insulating layer segment, and an nth photoelectric conversion layer segment, the photoelectric conversion portion segment having a higher value of n is positioned farther away from the first electrode, and a material configuring the charge accumulating electrode segment is different in adjacent ones of the photoelectric conversion portion segments.

[B05]

<<Imaging Device: Fifth Configuration>>

The solid-state image sensor according to any one of [A01] to [A34], in which the photoelectric conversion portion includes N (where N≥2) photoelectric conversion portion segments, the photoelectric conversion layer includes N photoelectric conversion layer segments, the insulating layer includes N insulating layer segments, the charge accumulating electrode includes N charge accumulating electrode segments arranged with a space between each other, an nth (where n=1, 2, 3, ..., N) photoelectric conversion portion segment includes an nth charge accumulating electrode segment, an nth insulating layer segment, and an nth photoelectric conversion layer segment, the photoelectric conversion portion segment having a higher value of n is positioned farther away from the first electrode, and an area of the charge accumulating electrode segment gradually decreases over a range from a first photoelectric conversion portion segment to an Nth photoelectric conversion portion segment.

[B06]

<<Imaging Device: Sixth Configuration>>

The solid-state image sensor according to any one of [A01] to [A34], in which, where a stacking direction of the charge accumulating electrode, the insulating layer, and the photoelectric conversion layer is a Z direction and a direction away from the first electrode is an X direction, a sectional area of a stacked portion when the stacked portion at which the charge accumulating electrode, the insulating layer, and the photoelectric conversion layer are stacked is cut along a YZ virtual plane changes depending upon a distance from the first electrode.

[C01]

<<Stacked Type Imaging Device>>

A stacked type solid-state image sensor including:

at least one imaging device according to any one of [A01] to [B06].

[D01]

<<Solid-State Image Sensor: Second Form>>

A solid-state image sensor including:

a stacked type imaging device that includes at least one imaging device according to any one of [A01] to [B06].

[D02]

The solid-state image sensor according to [D01], in which at least one lower imaging device is provided below the imaging device, and a wavelength of light to be received by the imaging device and a wavelength of light to be received by the lower imaging device are different from each other.

[D03]

The solid-state image sensor according to [D02], in which two lower imaging devices are stacked.

[D04]

The solid-state image sensor according to [D02] or [D03], in which lower imaging device blocks are provided in two layers.

[D05]

The solid-state image sensor according to any one of [D01] to [D04], in which a plurality of imaging devices configuring the lower imaging device block include a shared floating diffusion layer.

REFERENCE SIGNS LIST

10 . . . Imaging device block, 11 . . . Imaging device, 13, 15 . . . Imaging device, $20_1$, $20_2$, $20_3$ . . . Photoelectric conversion portion segment, 21 . . . First electrode, 22 . . . Second electrode, 23 . . . Photoelectric conversion layer, 23' . . . Region of photoelectric conversion layer positioned between adjacent imaging devices, $23_{DN}$ . . . Lower layer of photoelectric conversion layer, $23_{UP}$ . . . Upper layer of photoelectric conversion layer, 24 . . . Charge accumulating electrode, 24A, 24B, 24C . . . Charge accumulating electrode segment, 25, 25A, 25B . . . Transfer controlling electrode (charge transfer electrode), 26 . . . Charge discharging electrode, 30, 35 . . . Isolation electrode, 31A . . . First isolation electrode, 31B . . . Second isolation electrode, 32 . . . Third isolation electrode, 33 . . . Pad portion, 34 . . . Connection hole, 41 . . . n-type semiconductor region configuring second imaging device, 43 . . . n-type semiconductor region configuring third imaging device, 42, 44, 73 . . . $p^+$ layer, 45 . . . Gate portion of transfer transistor, 46 . . . Gate portion of transfer transistor, 51 . . . Gate portion of reset transistor $TR1_{rst}$, 51A . . . Channel formation region of reset transistor $TR1_{rst}$, 51B, 51C . . . Source/drain region of reset transistor $TR1_{rst}$, 52 . . . Gate portion of amplification transistor $TR1_{amp}$, 52A . . . Channel formation region of amplification transistor $TR1_{amp}$, 52B, 52C . . . Source/drain region of amplification transistor $TR1_{amp}$, 53 . . . Gate portion of selection transistor $TR1_{sel}$, 53A . . . Channel formation region of selection transistor $TR1_{sel}$, 53B, 53C . . . Source/drain region of selection transistor $TR1_{sel}$, $FD_1$, $FD_2$, $FD_3$, 45C, 46C . . . Floating diffusion layer, $TR1_{amp}$ . . . Amplification transistor, $TR1_{rst}$ . . . Reset transistor, $TR1_{sel}$ . . . Selection transistor, $TR2_{trs}$ . . . Transfer transistor, $TR2_{rst}$ . . . Reset transistor, $TR2_{amp}$ . . . Amplification transistor, $TR2_{sel}$ . . . Selection transistor, $TR3_{trs}$ . . . Transfer transistor, $TR3_{rst}$ . . . Reset transistor, $TR3_{amp}$ . . . Amplification transistor, $TR3_{sel}$ . . . Selection transistor, $V_{DD}$ . . . Power supply, $RST_1$, $RST_2$, $RST_3$ . . . Reset line, $SEL_1$, $SEL_2$, $SEL_3$ . . . Selection line, 117, $VSL_1$, $VSL_2$, $VSL_3$ . . . Signal line, $TG_2$, $TG_3$ . . . Transfer gate line, $V_{OA}$, $V_{OB}$, $V_{OT}$, $V_{OU}$ . . . Wiring, 61 . . . Contact hole portion, 62 . . . Wiring layer, 63, 64, $64_1$, $64_2$, $64_3$, 68A . . . Pad portion, 65, 68B . . . Connection hole, 66, 67 . . . connection portion, 70 . . . Semiconductor substrate, 70A . . . First face (front face) of semiconductor substrate, 70B . . . Second face (rear face) of semiconductor substrate, 71 . . . Device isolation region, 72 . . . Oxide film, 74 . . . $HfO_2$ film, 75 . . . Insulating film, 76 . . . Interlayer insulating layer, 77, 78, 81 . . . Interlayer insulating layer, 82 . . . Insulating layer, 82' . . . Region between adjacent imaging devices, 82p . . . First face of insulating layer, 82q . . . Second face of insulating layer, 83 . . . Protective layer, 84, 84A, 84B, 84C . . . Opening, 90 . . . On-chip microlens, 91 . . . Various imaging device components positioned below interlayer insulating layer, 92 . . . Shading layer, 100 . . . Solid-state image sensor, 101 . . . Stacked type imaging device, 111 . . . Imaging region, 112 . . . Vertical driving circuit, 113 . . . Column signal processing circuit, 114 . . . Horizontal driving circuit, 115 . . . Outputting circuit, 116 . . . Driving controlling circuit, 118 . . . Horizontal signal line, 200 . . . Electronic equipment (camera), 201 . . . Solid-state image sensor, 210 . . . Optical lens, 211 . . . Shutter device, 212 . . . Driving circuit, 213 . . . Signal processing circuit

What is claimed is:

1. A solid-state image sensor, comprising:
a plurality of imaging device blocks each including P×Q (where P≥2 and Q≥1) imaging devices such that P imaging devices are arranged in a first direction and Q imaging devices are arranged in a second direction different from the first direction,
wherein each imaging device includes:
a first electrode;
a charge accumulating electrode arranged with a space from the first electrode;
an isolation electrode arranged with a space from the first electrode and the charge accumulating electrode and surrounding the charge accumulating electrode;
a photoelectric conversion layer formed in contact with the first electrode and above the charge accumulating electrode with an insulating layer interposed therebetween; and
a second electrode formed on the photoelectric conversion layer,
wherein the isolation electrode includes a first isolation electrode, a second isolation electrode, and a third isolation electrode,
wherein the first isolation electrode for each imaging device included in at least a first imaging device block of the plurality of imaging device blocks is arranged adjacent to but with a space from the first electrode between imaging devices placed side by side at least along the second direction in the first imaging device block,
wherein the second isolation electrode is arranged between imaging devices in the first imaging device block,
wherein the third isolation electrode is arranged between at least the first imaging device block and a second imaging device block of the plurality of imaging device blocks, and
wherein the first isolation electrodes of the imaging devices are connected to each other.

2. The solid-state image sensor according to claim 1, wherein the charge accumulation electrode has first and second sides that are parallel to the first direction and third and fourth sides that are parallel to the second direction.

3. The solid-state image sensor according to claim 2, wherein at least a corner of the charge accumulation electrode opposed to the first electrode is cut away.

4. The solid-state image sensor according to claim 3, wherein at least a portion of the first isolation electrode is positioned between the first electrode and the cut away portion of the first isolation electrode.

5. The solid-state image sensor according to claim 1, wherein the first isolation electrode includes first, second, third, and fourth sides.

6. The solid-state image sensor according to claim 5, wherein the sides of the first isolation electrode are parallel to a cut away portion of a nearest charge accumulation electrode.

7. The solid-state image sensor according to claim 6, wherein the first electrode is disposed within a square interior area of the first isolation electrode.

8. The solid-state image sensor according to claim 7, wherein corners of the first electrode are cut away.

9. The solid-state image sensor according to claim 1, wherein the second isolation electrode and the third isolation electrode are connected to each other.

10. A solid-state image sensor, comprising:
a plurality of imaging device blocks each including P×Q (where P≥2 and Q≥1) imaging devices such that P imaging devices are arranged in a first direction and Q imaging devices are arranged in a second direction different from the first direction, wherein each imaging device includes:
a first electrode;
- a charge accumulating electrode arranged with a space from the first electrode;
- an isolation electrode arranged with a space from the first electrode and the charge accumulating electrode;
- a photoelectric conversion layer formed in contact with the first electrode and above the charge accumulating electrode with an insulating layer interposed therebetween; and
- a second electrode formed on the photoelectric conversion layer,
- wherein the isolation electrode for each imaging device includes a first isolation electrode, a second isolation electrode, and a third isolation electrode,
- wherein the first isolation electrode surrounds the charge accumulating electrode,
- wherein the first isolation electrode is arranged adjacent to but with a space from the first electrode between imaging devices placed side by side at least along the second direction in at least a first imaging device block of the plurality of imaging device blocks,
- wherein the second isolation electrode is arranged between imaging devices in the first imaging device block,
- wherein the third isolation electrode is arranged between at least the first imaging device block and a second imaging device block of the plurality of imaging device blocks, and
- wherein the first isolation electrodes of the imaging devices are connected to each other.

11. The solid-state image sensor according to claim 10, wherein the charge accumulation electrode has first and second sides that are parallel to the first direction and third and fourth sides that are parallel to the second direction.

12. The solid-state image sensor according to claim 11, wherein at least a corner of the charge accumulation electrode opposed to the first electrode is cut away.

13. The solid-state image sensor according to claim 12, wherein at least a portion of the first isolation electrode is positioned between the first electrode and the cut away portion of the first isolation electrode.

14. The solid-state image sensor according to claim 10, wherein the first isolation electrode includes first, second, third, and fourth sides.

15. The solid-state image sensor according to claim 14, wherein the sides of the first isolation electrode are parallel to a cut away portion of a nearest charge accumulation electrode.

16. The solid-state image sensor according to claim 15, wherein the first electrode is disposed within a square interior area of the first isolation electrode.

17. The solid-state image sensor according to claim 16, wherein corners of the first electrode are cut away.

18. The solid-state image sensor according to claim 10, wherein the second isolation electrode and the third isolation electrode are connected to each other.

* * * * *